(12) United States Patent
Inada

(10) Patent No.: US 7,544,975 B2
(45) Date of Patent: *Jun. 9, 2009

(54) PHOTODIODE

(75) Inventor: Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 334 days.

This patent is subject to a terminal disclaimer.

(21) Appl. No.: 11/480,008

(22) Filed: Jun. 30, 2006

(65) Prior Publication Data

US 2007/0001254 A1 Jan. 4, 2007

(30) Foreign Application Priority Data

Jul. 4, 2005 (JP) ............................. 2005-194462

(51) Int. Cl.
*H01L 31/0328* (2006.01)
(52) U.S. Cl. .................. 257/184; 257/201; 257/222; 257/434; 257/461; 257/E31.058
(58) Field of Classification Search ................. 257/184, 257/186, 201, 222, 434, 461
See application file for complete search history.

(56) References Cited

U.S. PATENT DOCUMENTS 7,282,428 B2 * 10/2007 Inada .......................... 438/559

FOREIGN PATENT DOCUMENTS

| JP | 04242701 | * | 8/1992 |
| JP | 05-342617 | | 12/1993 |
| JP | 08-116127 | | 5/1996 |
| JP | 2003332674 | * | 11/2003 |

* cited by examiner

*Primary Examiner*—Wai-Sing Louie
(74) *Attorney, Agent, or Firm*—Fish & Richardson P.C.

(57) ABSTRACT

A forward light monitoring photodiode having a high reflection film with low dark current for detecting forward light emitted from a laser diode and power of the laser diode in spite of the change of temperatures or yearly degradation. The high reflection film is made by depositing an SiON layer upon an InP window layer or an InP substrate by a plasma CVD method. $Al_2O_3/Si$ reciprocal layers or $Al_2O_3/TiO_2$ reciprocal layers are produced upon the SiON layer. The high reflection film reflects 80%-90% of a 45 degree inclination incidence beam and allows 20%-10% of the incidence beam to pass the film and arrive at the InP window or substrate.

8 Claims, 17 Drawing Sheets

FIG.1
| n - InP window layer | 5 |
| n⁻ - InGaAs light receiving layer | 4 |
| n - InP buffer layer | 3 |
| n⁺ - InP substrate | 2 |
FIG.2
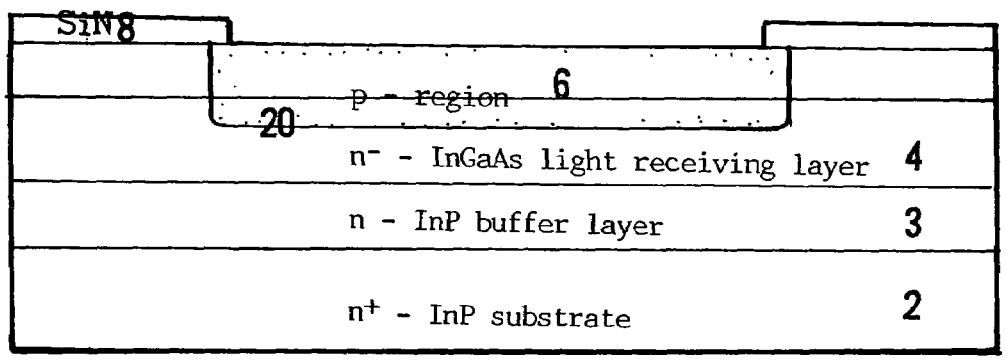
FIG.3
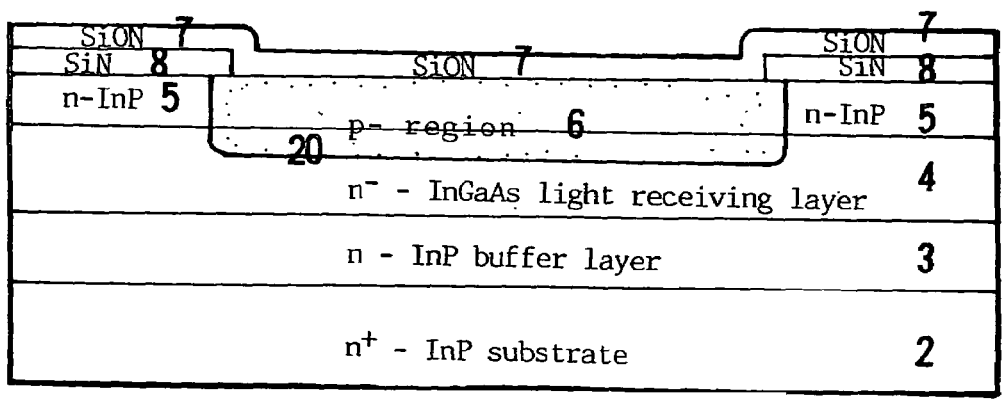

| S-wave | | 45° | | P-wave |
|---|---|---|---|---|
| K | | | | L |
| 0.634 | | a | | 0.675 |
| 0.613 | 24.9° | $Al_2O_3$ b | n=1.68 | 0.630 |
| 1.387 | 11.6° | Si  c | n=3.51 | 1.425 |
| 0.613 | 24.9° | $Al_2O_3$ b | n=1.68 | 0.630 |
| 1.387 | 11.6° | Si  c | n=3.51 | 1.425 |
| 0.958 | 24.9° | $Al_2O_3$ e | n=1.68 | 0.958 |
| 0.691 | 23.1° | SiON h | n=1.8 | 0.703 |
| | 12.7 | InP | n=3.2 | |
| 0.303 | | | | 0.366 |

JP-A 5-342617

JP-A- 5-342617

JP-A-8-116127

JP-A-8-116127

| $SiO_2$ | | $\lambda/4n$ |
| --- | --- | --- |
| | Si | $\lambda/4n$ |
| $SiO_2$ | | $\lambda/4n$ |
| | Si | $\lambda/4n$ |
| $SiO_3$ | | $\lambda/4n$ |

Example 5

Example 6

Example 9

Example 10

Example 11

Example 12

PHOTODIODE

RELATED APPLICATION

This application claims priority to Japanese Patent Application No. 2005-194462 filed Jul. 4, 2005.

FIELD OF THE INVENTION

This invention relates to a photodiode capable of absorbing a part of forward light emitted from a laser diode and monitoring the power of the light emitted from the laser diode. Semiconductor laser diodes have far-reaching applications to light sources of optical communications and light sources of optical measurements. Laser diodes degenerate with time elapsing. Even though driving current is the same, the power of light is getting lower and lower. A change of temperatures induces variations in emission/current rate. The change of emission output of laser diodes causes malfunction in the apparatuses of communications or measurements.

To protect laser diodes from the output power fluctuation, a monitoring photodiode accompanies a laser diode for monitoring the emission power of the laser diode. A laser diode produces light by current injection, reciprocating the light in a resonator and amplifying the reciprocating light by further current injection. Reflectances and transmittances of forward and backward mirrors of the resonator can arbitrarily be designed.

Here the forward mirror means a plane through which a main part of the laser light goes out. In optical communications, the light carrying signals—emanate via the forward mirror and enter an optical fiber. The light which goes out via the forward mirror is called a "forward beam F". The backward mirror sometimes allows a small rate of light to go out therethrough. The light which goes out via the backward mirror is called a "backward beam R". There are two cases in which backward light is fully forbidden and in which backward light is partially taken out. Backward light Power Pr taken out is utilized for monitoring forward emission power Pf of the laser diode.

Conventional optical communication systems are used to place monitoring photodiodes (PD) at the back of laser diodes. All conventional monitoring diodes have detected backward light R. A laser diode usually is accompanied by a backward-placed monitoring photodiode having a slanting front end. The slanting front end has a function of prohibiting front-end-reflected light from returning the laser diode.

A ratio Pf/Pr of forward light power Pf to backward light power Pr can be determined by giving pertinent reflectances to the front mirror and rear mirror of the resonator. If the ratio Pf/Pr is always constant, the forward light power Pf is known by measuring the backward light power Pr. At present, most of the monitoring photodiodes are usually installed at the back of laser diodes.

BACKGROUND OF THE INVENTION

Distributed feedback lasers, which are mostly used in optical communications, are annoyed by fluctuation of electric field distribution which induces a change of the power ratio Pf/Pr=$\chi$ of the forward/backward light. If the front/back power ratio $\chi$ varies, a product of a measured forward light power by a constant $\chi$ will not give a correct forward light power Pf.

It is considered that the accuracy of monitoring the laser power Pf will be raised by measuring the forward light power Pf directly instead of measuring backward light power Pr by taking account of the fluctuation of the front/back ratio $\chi$.

Somebody have proposed contrivances for knowing the forward light power by measuring directly forward light power Pf. The contrivances fully kill the backward light (Pr=0), enhance forward light power, place a slanting photodiode, which reflects most of the laser light slantingly, on a beam line and measure the forward light Pf by the slantingly-placed photodiode.

① Japanese Patent Laying Open No. 5-342617, "photodiode" proposes a readout apparatus utilizing a laser diode as a light source which places a photodiode in a midway of a light path of the laser diode for monitoring the forward light power Pf. The apparatus reads out data from a rotating photodisc by shooting a bottom of the photodisc with a converged laser beam and observing intensity or polarization of a beam reflected from the bottom of the photodisc. The proposed apparatus places a monitoring photodiode in front of the laser diode instead of the back. FIG. 9 denotes an apparatus proposed by ① Japanese Patent Laying Open No. 5-342617. A laser diode 52 emits light in a forward direction. A grating 53 divides the light into the 0th order beam 63 and a 1st order beam 65. Laser beams 63 and 65 shoot a slanting mirror 54 at 45 degrees. The 0th order beams 63 is reflected and the 1st beam is fully absorbed by the slanting mirror 54. The beam 63 turns the path at 90 degrees by the mirror and goes upward. A lens 59 converges the 0th beam into a parallel beam. Another lens 60 converges the parallel beam into a spot on a point at a bottom of a rotating photodisc 62. The converged beam is reflected by the bottom of the photodisc 62. A disc-reflected beam is reflected by another mirror (not shown) and is sensed by another signal-detection photodiode (not shown).

FIG. 10 is an enlarged oblique view of the mirror 54 proposed by ① Japanese Patent Laying Open No. 05-342617. The surface 57 of the mirror 54 is divided into two concircular regions of an inner full-reflection film 55 and an outer anti-reflection (zero-reflection) film 56. A triangle-sectioned base 58 keeps the surface at 45 degree inclination. The 0th order beam 63 is fully reflected by the inner full-reflection film 55 and is effectively employed as a read-out beam. The 1st order beam 65 is absorbed by the antireflection film 56. The power of the 1st order beam is measured by a photodiode beneath the antireflection film 56. The power of the forward light is measured by monitoring the 1st order beam 65. No loss accompanies the 0th order beam. The mirror 54 has no mediate reflection part. The grating 53 makes signal light and measuring light from the laser forward light. The signal light and measuring light are spatially divided by the grating 53. ① has no idea of partial-reflection and partial-absorption by utilizing a mediate reflection film. ① is described here since ① is a prior art document of measuring power of forward emitting light. The measurement of the forward emitting light requires such a complicated and sophisticated apparatus consisting of the grating and the concircular full-reflection film and the non-reflection film.

② Japanese Patent Laying Open No. 08-116127" semiconductor laser" seems to be a reference closest to the present invention. ② tells a problem that exact forward emitting light cannot always be known by monitoring backward light of an LD, because the forward/backward power ratio of an LD fluctuates with temperature changes and power variations. ② alleges that the forward light ratio increases with temperature. ② proposes a laser output controlling apparatus for eliminating the influence of temperature variations upon the output of an LD by monitoring forward emitting light by a photodiode. FIG. 11 demonstrates a structure of the laser diode monitoring apparatus suggested by ②. A stem 70 has a slanting projection 72 with a 45 degree oblique angle. A heatsink 73 is laid upon the stem 70. A laser diode (LD) chip 74 is die-bonded upon the heatsink 73. A photodiode 75 is bonded upon the slanting projection 72 for monitoring forward emitting light of the LD chip 74. Since the slanting projection 72 inclines at 45 degrees, the light sensing surface of the monitoring photodiode 75 also inclines at 45 degrees.

The laser diode (LD) 74 emits both a forward emanating beam Rf and a backward emanating beam Rr. The forward beam Rf shoots the light receiving surface of the photodiode 75 at an angle of 45 degrees. A part of the forward beam Rf is absorbed within the photodiode (PD) 75. The rest of the forward beam Rf is reflected upward by a reflective film on the photodiode and plays a role of working light. The upward reflected light is introduced into an optical fiber for carrying optical signals in optical communications. To minimize loss, the reflective coefficient of the light receiving surface should be small enough.

InP type photodiodes, which have InGaAs light receiving layers, have SiN antireflection films on light receiving surfaces (tops or bottoms). SiN prevents antireflection films from raising reflection rate more than 30%. ② proposes a Si/SiO$_2$ reciprocal layer film of five layers or three layers for enhancing reflective coefficients.

The reflective layer of ② has a five-layered (or three-layered) structure as shown in FIG. 12. ② alleges that 60% reflection rate (a) would be obtained by a three-layered structure of repeating Si and SiO$_2$ layers piled upon an InP window film (Paragraph 30). Here $\lambda$ is a wavelength of the light emitted by a laser diode and n is a refractive index of the layers composing the reflective layer. Attention should be paid that the refractive indices of SiO$_2$ and Si are different, although the same "n" will be used for denoting refractive indices of film materials in the followings.

(a) Case of 60% reflection; Layers
(from bottom to top; bottom in contact with InP)

| materials | layer thickness |
| --- | --- |
| SiO$_2$ | $\lambda/4n$ |
| Si | $\lambda/4n$ |
| SiO$_2$ | $\lambda/4n$ |

② asserted that a five layered structure should be fabricated upon InP window layer of a photodiode.

(b) Case of 90% reflection; Layers
(from bottom to top; bottom in contact InP)

| materials | layer thickness |
| --- | --- |
| SiO$_2$ | $\lambda/4n$ |
| Si | $\lambda/4n$ |
| SiO$_2$ | $\lambda/4n$ |
| Si | $\lambda/4n$ |
| SiO$_2$ | $\lambda/4n$ |

This is the multilayered film shown in FIG. 12. Since the reflection rate is 90%, 10% of the LD emitting light would go into the photodiode. ② alleges that 10% of the light enables the photodiode to measure the total power of the LD emitting light. ② assertes that thicknesses of SiO$_2$ and Si films should be all $\lambda/4n$, namely quarter-wavelength films. However ② does not describe concrete values of a light wavelength $\lambda$, thicknesses and refractive indices of the films. Although ② alleged that the reflection rate of the film would be 90%, an exact reflection rate of the proposed film is known to be more than 98% from our precise calculation. There has been no photodiode capable of reflecting LD forward light shooting at a 45 degree incidence angle with a 90% reflection rate prior to the present invention.

① Japanese Patent Laying Open No. 5-342617 divides laser light into the $0^{th}$ order beam and the $1^{st}$ order diffraction beam by a grating, absorbs all the $1^{st}$ order diffraction beam by the peripheral photodiode positioned at a periphery of the mirror and reflects all the $0^{th}$ order beam upward by a central mirror. The grating is indispensable, but is too expensive. The concircular mirror, which should have an inner full-reflection mirror and an outer photodiode, would be difficult to produce. The grating and half-division mirror/photodiode would enhance the production cost of ①. Costliness and complexity would be drawbacks of ①.

② Japanese Patent Laying Open No. 8-116127 proposes a photodiode having a high reflective film composed of quarter-wavelength thick SiO$_2$/Si reciprocal five-layers. ② alleges that the film would have a 90% reflection rate, but it is wrong. An exact reflection rate of the five-layered SiO$_2$/Si reciprocal film is 98%. Too high a reflection rate inhibits a photodiode with a high reflection film from monitoring the forward LD power. A purpose of the present invention is to provide a photodiode capable of absorbing a part of forward LD light and monitoring the forward LD light with a low dark current.

SUMMARY OF THE INVENTION

A first photodiode of the present invention consists of an InP type photodiode and a high reflection film having Al$_2$O$_3$/Si reciprocal layers and a SiON layer deposited upon an InP substrate or an InP window layer, which has an 80%-90% reflection rate and a 20%-10% to-InP-transmitting rate for 45 degree incidence light.

A second photodiode of the present invention consists of an InP type photodiode and a high reflection film having Al$_2$O$_3$/TiO$_2$ reciprocal layers and a SiON layer deposited upon an InP substrate or an InP window layer, which has an 80%-90% reflection rate and a 20%-10% to-InP-transmitting rate for 45 degree incidence light.

Both types of photodiodes are mounted at a 45 degree slanting angle in an LD forward beam line for absorbing a small part of the LD forward beam, reflecting most part of the forward beam and measuring directly the LD forward power.

The base portion of the present invention is an InP type photodiode. The substrate can be either an n-InP substrate or an SI-InP (semi-insulator) substrate. The light receiving layer (absorption layer) can be either an InGaAs layer or an InGaAsP layer. A buffer layer can be inserted between the substrate and upper layers. But the buffer layer can be omitted. An InP window (capping) layer can be built on the epitaxial layers. The InP window layer can be omitted. Both top incidence type or bottom incidence type are available for a base photodiode of the present invention.

In the case of a photodiode having an n-InP substrate and an InP window layer, components of the layered structure of a base photodiode from top to bottom are a p-electrode, a p-region, an InP window layer, an InGaAs or InGaAsP light receiving layer, an n-InP buffer layer, an n-InP substrate and an n-electrode. In another case of a photodiode having an n-InP substrate but lacking an InP window layer, components of the layered structure of another base photodiode from top to bottom are a p-electrode, a p-region, an InGaAs or InGaAsP light receiving layer, an n-InP buffer layer, an n-InP substrate and an n-electrode.

The present invention proposes a photodiode having a high reflective film with a 80%-90% reflectivity for a 45 degree inclination incidence beam on an aperture plane of an InP type photodiode. 80%-90% power of a laser diode (LD) should be used for main purposes of optical communications or optical measurements. Thus the absorption rate allowable for a photodiode is 20% to 10%. A high reflective film should be formed on the top (InP window layer or a light receiving layer) of a photodiode in the case of a top-incidence type. Otherwise, a high reflective film should be formed on the bottom (substrate) of a photodiode in the case of a bottom-incidence type. In the latter case, the underlying layer is either an n-InP substrate or an SI-InP substrate.

Layered structure of a reflective film is the gist of the present invention. FIG. 7 shows an example of the high reflective film. The example film of FIG. 7 is made by forming an SiON (n=1.8) layer of an InP window layer of n=3.2 (otherwise, InP substrate; n=3.2) by a plasma CVD method, and producing $Al_2O_3$/Si multi-reciprocal (otherwise; $Al_2O_3$/$TiO_2$) layers by an ion-assisting evaporation method.

The refractive index of $Al_2O_3$ for near-infrared light is n=1.68. Si has a refractive index n=3.51 for near-infrared light. $TiO_2$ has a refractive index n=2.32 for near-infrared light. FIG. 7 denotes a five-layered $Al_2O_3$/Si reciprocal multilayer film. FIG. 13 denotes an $Al_2O_3$/$TiO_2$ reciprocal five-layered film. FIG. 14 denotes an $Al_2O_3$/Si reciprocal three-layered film. FIG. 15 denotes an $Al_2O_3$/$TiO_2$ reciprocal three-layered film.

The number of the reciprocal multilayers can be five, three or others. Two to seven layers are pertinent for dielectric multilayers. Multilayers more than eight layers are also available for making high reflection films satisfying requirements. But excess numbers of layers invite high cost. Different sets with different thicknesses enable dielectric layers to produce a variety of imperfect-reflection films. "Imperfect" means not a 100% reflection rate but a 80%-90% reflection rate.

FIG. 6 exhibits a reciprocal $Al_2O_3$/Si and SiON five-layered film deposited upon a top layer of an InP-type photodiode.

One of the novel features of the present invention is a choice of Si, $Al_2O_3$ and $TiO_2$ as elementary dielectric materials for films. The three materials are transparent and inabsorptive for near infrared light of a wavelength between 1 μm and 1.7 μm. Oxidized films $Al_2O_3$ and $TiO_2$ are chemically and physically strong, refractory and suitable for coating materials. Si and $Al_2O_3$ films produced by an ion-assisting electron beam evaporation method excel other materials in cohesion. Cohesion is also excellent between $Al_2O_3$ and SiON films.

Another one of the novel features of the present invention is a choice of SiON film which is directly deposited upon the InP substrate or window of a photodiode in stead of depositing an $Al_2O_3$ film thereon. SiON has occasionally been utilized as an antireflection film. But this invention relates not to an antireflection film but a high-reflective film. Use of SiON for reflection films is beyond common sense. SiON has a role of prohibiting electrons and holes from recombinating and preventing dark current from occurring at the interface with InP.

Similarly, the cohesion between $TiO_2$ and $Al_2O_3$ that are produced by the ion-beam assisting evaporation method is also exellent. A set of $Al_2O_3$ and $TiO_2$ films can make a high-reflective film for a 45 degree inclination incidence beam. Cohesion between $Al_2O_3$ and SiON is also good.

Reciprocal layers consisting of two different materials are utilized for covering substrates or window layers of InP photodiodes. It is very important to know the relations between refractive indices of the reciprocal layers. A refractive of $Al_2O_3$ is 1.68 for near infrared light. Si has a refractive index of n=3.51 for near infrared.

A large refractive index difference enables $Al_2O_3$ and Si to be an excellent set in building high reflection reciprocal multilayer films of forward beam monitoring photodiodes. A variety of sets of lower refractive index $Al_2O_3$ and higher refractive index Si can make any desirable value of reflection rates of dielectric multilayers. Another set is $Al_2O_3$/$TiO_2$. $TiO_2$ has a refractive indices of n=2.32. $TiO_2$ can be used as a higher refraction component.

FIG. 16 and FIG. 17 demonstrate oblique incidence light in a first medium $n_1$, partial refraction light going via an interface (xy-plane) into a second medium $n_2$ and partial reflection light reflected at the interface to the first medium $n_1$. The beam line lies on a zx-plane. The interface is an xy-plane. Incidence point is an origin O. The z-axis denotes a direction of depth orthogonal to the interface. There are two independent cases for directions of electric and magnetic fields (E, H). FIG. 16 exhibits the electric fields E are vertical to the incidence plane (xz-plane). Since the electric fields are vertical (Senkrecht in German), the wave is called S-wave in FIG. 16. FIG. 17 shows that electric fields E are parallel to the incidence plane (xz-plane). Since the electric fields E are parallel (Parallel in German), the wave in FIG. 17 is called P-wave. S-wave and P-wave are different in relations between the incidence, refraction and reflection light. Different expressions are required for considering both S-wave and P-wave. An electric field and a magnetic field of the incidence light are denoted by $E_1$ and $H_1$, respectively. Another electric field and magnetic field of the refraction light are denoted by $E_2$ and $H_2$. Another electric field and magnetic field of the reflection light are denoted by $E_3$ and $H_3$. The incidence angle and the reflection angle, which are equal, are denoted by $\theta_1$. The refraction angle is designated by $\theta_2$.

An electric field E is vertical to a magnetic field H. A wavenumber vector k is vertical both to H and E. An outer product E×H is parallel to the direction of k. An outer product H×k is parallel to the direction of E. An outer product k×E is parallel to the direction of H. The absolute values satisfy a relation $H=(\in \mu)^{1/2}E$. In ordinary dielectric films, μ is 1 (in cgs unit). Since $\in^{1/2}=n$, H=nE in ordinary dielectric materials. Power density is $EH=nE^2$. In InP (n=3.2), power density is $3.2E^2$.

In S-wave shown in FIG. 16, the incidence, refraction and reflection beams have electric and magnetic fields $E_1$, $H_1$, $E_2$, $H_2$, $E_3$, and $H_3$ of the following components of.

(Incidence Beam)

$$E_1(0, E_1, 0) \tag{1}$$

$$H_1(-n_1E_1 \cos\theta_1, 0, n_1E_1 \sin\theta_1) \tag{2}$$

(Refraction Beam)

$$E_2(0, E_2, 0) \tag{3}$$

$$H_2(-n_2E_2 \cos\theta_2, 0, n_2E_2 \sin\theta_2) \tag{4}$$

(Reflection Beam)

$$E_3(0, E_3, 0) \tag{5}$$

$$H_3(+n_1E_3 \cos\theta_1, 0, n_1E_3 \sin\theta_1) \tag{6}$$

Tangential components of electric, magnetic fields should be continual at the interface (xy-plane).

$$E_1 + E_3 = E_2. \quad (7)$$

$$-n_1 E_1 \cos\theta_1 + n_1 E_3 \cos\theta_1 = -n_2 E_2 \cos\theta_2. \quad (8)$$

The z-direction continuity of magnetic fields with Eq.(7) is equivalent to Snell's Law. Then the z-component continuity equation is omitted. Solving the equations gives a ratio $E_2/E_1$ of refraction/incidence of electric fields.

$$E_2/E_1 = 2n_1 \cos\theta_1 / (n_1 \cos\theta_1 + n_2 \cos\theta_2). \quad (9)$$

Snell's law allows us to replace $n_1:n_2$ by $\sin\theta_2:\sin\theta_1$ ($n_1/n_2 = \sin\theta_2/\sin\theta_1$). Eq.(9) becomes $$E_2/E_1 = 2\sin\theta_2 \cos\theta_1 / \{\sin(\theta_1+\theta_2)\}. \quad (10)$$

Another ratio $E_3/E_1$ of reflection/incidence of electric fields is $$E_3/E_1 = (n_1\cos\theta_1 - n_2\cos\theta_2)/(n_1\cos\theta_1 + n_2\cos\theta_2). \quad (11)$$

Snell's law allows us to delete $n_1$ and $n_2$ in Eq.(11).

$$E_3/E_1 = \sin(\theta_2-\theta_1)/(\sin(\theta_1+\theta_2). \quad (11)'$$

Since $H = nE$, magnetic field ratios $H_2/H_1$ and $H_3/H_1$ for S-wave are obtained from Eqs.(10).

$$H_2/H_1 = 2\sin\theta_1 \cos\theta_1/\{\sin(\theta_1+\theta_2)\}. \quad (12)$$

$$H_3/H_1 = 2\sin(\theta_2-\theta_1)/\{\sin(\theta_1+\theta_2)\}. \quad (13)$$

For P-wave, as shown in FIG. 17, electric and magnetic fields for incident, refraction and reflection beams are, (Incident Beam)

$$H_1(0, H_1, 0) \quad (14)$$

$$E_1(n_1^{-1} H_1 \cos\theta_1, 0, -n_1^{-1} H_1 \sin\theta_1). \quad (15)$$

(Refraction Beam)

$$H_2(0, H_2, 0). \quad (16)$$

$$E_2(n_2^{-1} H_2 \cos\theta_2, 0, -n_2^{-1} H_2 \sin\theta_2). \quad (17)$$

(Reflection Beam)

$$H_3(0, H_3, 0) \quad (18)$$

$$E_3(-n_1^{-1} H_3 \cos\theta_1, 0, -n_1^{-1} H_3 \sin\theta_1). \quad (19)$$

Tangential components of electric and magnetic fields should be continual at boundaries (xy-plane).

$$H_1 + H_3 = H_2. \quad (20)$$

$$n_1^{-1} H_1 \cos\theta_1 - n_1^{-1} H_3 \cos\theta_1 = n_2^{-1} H_2 \cos\theta_2. \quad (21)$$

Ratios $E_2/E_1$, $E_3/E_1$, $H_2/H_1$ and $H_3/H_1$ are obtained by solving the equations.

$$E_2/E_1 = 2n_1\cos\theta_1/(n_2\cos\theta_1 + n_1\cos\theta_2) \quad (22)$$
$$= 2\sin\theta_2\cos\theta_1/\sin(\theta_1+\theta_2)\cos(\theta_1-\theta_2). \quad (23)$$
$$E_3/E_1 = (n_2\cos\theta_1 - n_1\cos\theta_2)/(n_2\cos\theta_1 + n_1\cos\theta_2) \quad (24)$$
$$= \tan(\theta_1-\theta_2)/\tan(\theta_1+\theta_2). \quad (25)$$
$$H_2/H_1 = 2n_2\cos\theta_1/(n_2\cos\theta_1 + n_1\cos\theta_2) \quad (26)$$
$$= \sin 2\theta_1/\sin(\theta_1+\theta_2)\cos(\theta_1-\theta_2). \quad (27)$$
$$H_3/H_1 = (n_2\cos\theta_1 - n_1 con\theta_2)/(n_2\cos\theta_1 + n_1\cos\theta_2) \quad (28)$$
$$= \tan(\theta_1-\theta_2)/\tan(\theta_1+\theta_2).$$

The incident angle $\theta_1$ is predetermined to be 45 degrees. This is an inclination angle in air of the incident beam in air. When the 45 degree incident beam goes into a medium of a refractive index n, the beam is refracted to a refraction angle of an arcsine ($\sin^{-1}$) function of $\sin 45°/n$ ($=\sin^{-1}(\sin 45°/n)$). The refraction angles of different media are calculated as follows,

| media | refractive index n | refraction angle |
|---|---|---|
| air | 1 | 45° |
| $Al_2O_3$ | 1.68 | 24.9° |
| Si | 3.51 | 11.6° |
| $TiO_2$ | 2.32 | 17.7° |
| SiON | 1.8 | 23.1° |
| InP | 3.2 | 12.7° |

Since the incident angle in air is predetermined to be 45 degrees, the materials on both sides of an interface determines the refraction angle at the interface. The electric field ratios ($E_2/E_1$) and ($E_3/E_1$) are also determined by the refraction angle and the refractive index.

(A) S-Wave Case

Expressions including fractions are an obstacle in the way of intuitive understanding. The refraction/incidence electric field ratio $E_2/E_1$ for S-waves is denoted by K. Namely $K = E_2/E_1$(S-wave). The reflection/incidence electric field ratio $E_3/E_1$ for S-waves is denoted by J. Thus $J = E_3/E_1$(S-wave).

(B) P-Wave Case

The refraction/incidence electric field ratio $E_2/E_1$ for P-waves is denoted by L. Namely $L = E_2/E_1$ (P-wave). The reflection/incidence electric field ratio $E_3/E_1$ for P-waves is denoted by M. Thus $M = E_3/E_1$ (P-wave).

Table 1 shows values of K, J (S-wave) and L, M and R (P-wave).

The purpose of the present invention is to provide a high reflection film having a low (10% to 20%) transmitting coefficient which is a ratio of an all component layer transmitting beam to a 45 degree inclination incident beam. The 10%-20% transmitting coefficient is equivalent to a high (90% to 80%) reflection rate which is a ratio of the sum of the reflected beams to a 45 degree incident beam. The object reflection film should have a 10-20% transmitting coefficient and a 90%-80% reflection coefficient. It is assumed that the dielectric films cause no absorption.

For example, the air/$Al_2O_3$/Si/$Al_2O_3$/SiON/InP four layered reflective film as shown in FIG. 14 has five interfaces a, b, c, e and h. The ratio of all transmittance/incidence is given by a product of individual ratios of transmission/incidence, since no absorption accompanies. In the case of S-waves for the example of FIG. 14, (S-wave) $K_a K_b K_c K_e K_h = 0.634 \times 0.613 \times 1.387 \times 0.958 \times 0.691 = 0.357$.

This is a ratio of electric fields. The flow of light power is represented by an outer product of an electric field and a magnetic field, which is called Poynting's vector. Since the magnetic permeability is 1 ($\mu=1$) for the dielectric materials, a magnetic field H is obtained by multiplying an electric field E by a refractive index n ($H = nE$). In an InP layer (InP window or substrate), Pointing's vector is $0.357 \times 0.357 \times 3.2 = 0.408$. The power ratio light which passes all the layers of the reflection film of FIG. 14 does not fall in a range between 10% and 20% required by the present invention. The S-wave for the reflection film of FIG. 14 is beyond the scope of the present invention.

The situation is similar to P-wave of the four layered structure of FIG. 14. The total ratio of the transmitting power to the incidence power is a product of element ratios.

In the case of P-waves for the example of FIG. 14, (P-wave) $L_a L_b L_c L_e L_h$=0.675×0.631×1.423×0.958×0.703=0.408.

The power ratio of the all-layer transmitting power to the incidence power is 0.408×0.408×3.2=0.53. This transmittance is out of the range required by the present invention.

Similar consideration gives a transmitting/incidence power ratio of an air/$Al_2O_3$/$TiO_2$/$Al_2O_3$/SiON/InP four layered structure depicted in FIG. 15.

(S-wave) $K_a K_f K_g K_e K_h$=0.634×0.815×1.185×0.958×0.691=0.405.

(P-wave) $L_a L_f L_g L_e L_h$=0.675×0.821×1.195×0.958×0.703=0.446.

Similar calculations are done for an air/$Al_2O_3$/Si/$Al_2O_3$/Si/$Al_2O_3$/SiON/InP six layered film depicted in FIG. 7 and for an air/$Al_2O_3$/$TiO_2$/$Al_2O_3$/$TiO_2$/$Al_2O_3$/SiON/InP six layered film depicted in FIG. 13.

In both examples of FIG. 7 and FIG. 13, the power ratio of reflectionless transmitted light power to incidence power is high. The power ratio of the light which passes through the layers and comes in the InP layer is 50% to 100%, which deviates from the desirable scope of 10% to 20% required by the present invention. Such excess high transmittances are common in the light passing multilayers without reflection.

A multilayer consisting of m layers having refraction angles $\theta_1, \theta_2, \theta_3, \ldots, \theta_m$ is considered. The product of S-wave transmittances at all interfaces is described by, (S-Wave)

$2\cos\theta_0 \sin 2\theta_1 \sin 2\theta_2 \sin 2\theta_3 \ldots \sin(2\theta_m)/\{\sin(\theta_1+\theta_2)\sin(\theta_2+\theta_3)\ldots\sin(\theta_m+\theta_{m+1})\}$.

$\theta_0$ is an incidence angle in air, which has been predetermined to be 45 degrees. $\theta_1, \theta_2, \theta_3, \ldots, \theta_m$ are refraction (or inclination) angles in the 1st, 2nd, 3rd, ..., m-th layers. $\theta_{m+1}$, which is the final slanting angle in InP, is 12.7°. $\theta_1, \theta_2, \theta_3, \ldots, \theta_m$ are dependent upon the materials of layers. The product of the transmitting/incidence ratios includes $\sin 2\theta_j$ in the numerator and $\sin(\theta_j+\theta_{j+1})$ in the denominator. Variables in $\sin(\ldots)$ in the denominator is $\theta_j+\theta_{j+1}$, which is an average of variables $2\theta_j$ and $2\theta_{j+1}$ in neighboring $\sin(\ldots)$ $\sin(\ldots)$ in the numerator. A change of materials of intermediate layers does not strongly change the value of the product of the transmitting/incidence ratios for both S-wave and P-wave. The transmittance/incidence ratio, which depends upon the initial air (n=1) and the final InP (n=3.2), is a positive value close to 1 but smaller than 1. An increase of the number of layers seems to decrease the power of transmitting light. But it is wrong. The power of transmitting light without reflection does not decrease with increasing the number of layers. The first order (without reflection) is mostly independent from the number of layers. It may contradict intuition.

The above is only the first order transmitting/incidence ratio, which takes no account of reflection. An exact calculation of the transmittance requires to take reflection into account. In the case of vertical incidence, there are some dielectric film devices which are endowed with a wavelength-dependent transmittance or reflectance. However, slanting-beam incidence will invite difficulties in calculation, designing and production. The slanting-incidence reflection has never been researched till now because of difficult problems to be solved and poor applications. The aforecited references were simple analogy of vertical incidence, which is useless to a lanting incidence reflection problem.

Above exact equations quantitatively explain the refraction and the reflection at interfaces of S-wave and P-wave. Problems of slanting beam multireflection in series shall be solved by the exact equations. A set of symbols are defined. FIG. 18 exhibits a slanting beam in the i-1-th layer being divided at Interface i into a refraction ($K_i$) beam in the i-th layer and a reflection ($J_i$) beam in the i-1-th layer. Another slanting beam of power 1 in the i-th layer is divided at Interface into a refraction ($Q_i$) beam in the i-1-th layer and a reflection ($-J_i$) beam in the i-th layer. FIG. 18 shows symbols K and J for S-wave. But a similar relation can be expressed by L and M for P-wave.

Light propagates slantingly in media. Propagation is expressed by a wavefunction, which inherently consists of time, position, amplitude and phase. Since stationary relations are considered, variables of time and position are omitted for considering a change of phase in each layer. A wavefunction change Wi for denoting a change of phase of light propagating in the i-th layer is, $W_i = \exp(jk_i d_i \sec\theta_i)$. (29)

Here j is an imaginary number unit. The absolute value of the wavefunction is always 1, which signifies no absorption. And $d_i$ is a thickness of the i-th layer. $\theta_i$ is an inherent slanting angle in the i-th layer, which satisfies $n_i \sin\theta_i = \sin 45°$. The light path inclines at angle $\theta_i$ to the thickness direction. The length of the slanting light path is $d_i \sec\theta_i = d_i/\cos\theta_i$. Then $k_i$ is a wavenumber ($k_i = 2\pi n_i/\lambda$). The wavenumber is not $2\pi/\lambda$ but $2\pi n_i/\lambda$, where $n_i$ is a refractive index of the i-th layer.

The slanting quarter wavelength thickness d is not $d=\lambda/4n$ but $d=\lambda \cos\theta/4n$. Attention should be paid to "$\cos\theta$". Insertion of $\cos\theta$ signifies a difference of the slanting incidence from the conventional vertical incidence. When $\lambda=1550$ nm, the slanting quarter wavelength thickness is $d=387.5\cos\theta/n$, which depends upon materials. The slanting quarter wavelength thickness ($d=\lambda\cos\theta/4n$) is briefly called a $\lambda/4$-thickness hereafter. When $\lambda=1550$ nm, the slanting half wavelength thickness is $d=775\cos\theta/n$. The slanting half wavelength thickness ($d=\lambda\cos\theta/2n$) is briefly called a $\lambda/2$-thickness hereafter. $\lambda/4$- and $\lambda/2$-thicknesses of materials for $\lambda=1550$ nm are,

|  | $\lambda/4$-thickness | $\lambda/2$-thickness |
| --- | --- | --- |
| air | 274 nm | 548 nm |
| $Al_2O_3$ | 209 nm | 418 nm |
| $TiO_2$ | 159 nm | 318 nm |
| Si | 108 nm | 216 nm |
| SiON | 198 nm | 396 nm |
| InP | 118 nm | 236 nm |

Table 2 lists inclination angles $\theta$, refractive index n, $\lambda/4$ thicknesses ($d=\lambda\cos\theta/4n$) and $\lambda/2$ thicknesses ($d=\lambda\cos\theta/2n$) of air, $Al_2O_3$, Si, $TiO_2$, SiON and InP. Since the light beam propagating in air at 45 degree inclination goes into an object medium, each layer has an inherent inclination angle determined by $n\sin\theta = \sin 45° = 2^{-1/2}$. As the inclination angle $\theta$ is smaller, the refractive index becomes higher, because $n\sin\theta = 2^{-1/2}$. The inclination angle $\theta$ is bigger for a lower refractive index layer. Si, which has a high refractive index n of 3.51, has a small inclination angle of 11.6°. InP having a high refractive index n=3.2 has a low inclination angle $\theta=12.7°$.

Use of inclination angles makes refraction/reflection calculations easier than refractive indices.

Slanting quarter wavelength thicknesses (d=λ cos θ/4n) and slanting half wavelength thicknesses (d=λ cos θ/2n) are denoted uppermost as multiples of λ in the cells of Table 2. Concrete λ/4 and λ/2 thicknesses for λ=1550 nm are written at second lines in the cells. Concrete λ/4- and λ/2-thicknesses for λ=1300 nm are written at third lines. For example, a λ/4 thickness is 0.070λ for Si. When λ=1550 nm, λ/4-thickness of Si is 108 nm. When λ=1300 nm, λ/4-thickness of Si is 91 nm.

In FIG. 18, a $\theta_{i-1}$ inclining incident beam of power 1 in the (i−1)-th layer of $n_{i-1}$ is divided at Interface i into a reflected beam $J_i$ and a refracted beam $K_i$ of $\theta_i$. The refracted beam $K_i$ penetrates with an angle $\theta_i$ into the i-th layer of $n_i$. The wavefunction of the refracted beam $K_i$ changes by $W_i$ in the i-th layer. In the reverse directions, another upward beam of power 1 of $\theta_i$ in i-th layer is also divided at Interface i into a reflection beam of power $(-J_i)$ and a refraction beam of power $Q_i$. Eq.(11) teaches us the power of the reflection beam is $-J_i$, because $\theta_1$ and $\theta_2$ are exchanged from the i-th to the (i−1)-th layer. A forward refraction electric field $K_i$ ratio and a backward refraction electric field ratio $Q_i$ for S-waves (FIG. 18) satisfy the following equation.

$$(S\text{-wave}) \quad Q_i + K_i = 2. \tag{30}$$

Eq.(30) is verified by exchanging $\theta_1$ and $\theta_2$ in Eq.(12) of S-waves. Eq.(30) means that the average of electric filed ratios of downward/upward transmitting beams is 1 for S-wave. This is the reason why the transmittance is surprisingly large. In spite of the occurrence of reflections, the average of upward/downward beam electric field ratios is still 1 for S-wave. If one of binary transmittances is low, the other is high. The average is still 1. Multireflection inhibits transmittance from decreasing. The ground of such large transmittances is simply represented by Eq.(30). Since people hardly know the truth, the matter has been now emphasized.

P-wave further exaggerates largeness of transmittances. The sum of binary transmittances of P-wave exceeds 2.

$$(P\text{-wave}) \quad R_i + L_i = 2\sec(\theta_1 - \theta_2). \tag{31}$$

The average of binary transmittances of P-wave is more than 1. The 1-exceeding average of transmittances does not contradict the energy conservation law. Transmitting/incidence ratio and reflection/incidence ratio at Interface i have been defined as shown in FIG. 18.

FIG. 19 teaches a variety of multireflection modes in (i−1), i and (i+1) layers induced by Interfaces i and i+1. An inclining initial beam of power 1 in the (i−1)-th layer is supposed. Shooting Interface i slantingly, the power 1 light is divided into reflection light $J_i$ in the (i−1)-th layer and refraction (transmitting) light $K_i$ in the i-th layer. The transmitting light propagates in the i-th layer and attains to Interface i+1 with a wavefunction $W_i$. A part $J_{i+1}$ is reflected at Interface i+1. The rest $K_{i+1}$ exceeds Interface i+1. The wavefunction of the simply passing light is denoted by $K_i W_i K_{i+1}$.

The partial light reflected at Interface i+1 propagates in the i-th layer with a wavefunction change $W_i$ and returns to Interface i. A part of $Q_i$ goes out into the (i−1)-th layer. The light has a wavefunction $K_i W_i J_{i+1} W_i Q_i$. The other part $-J_i$ is reflected at Interface i, propagates in the i-th layer with a wavefunction change $W_i$ and attains to Interface i+1. A part $K_{i+1}$ goes out into the (i+1)-th layer. The light has a wavefunction $K_i W_i J_{i+1} W_i (-J_i) W_i K_{i+1}$. The rest $J_{i+1}$ is thrice reflected at Interface i+1, propagates in the i-th layer and attains to Interface i. A part $Q_i$ goes out into the (i−1)-th layer.

The light has a wavefunction $K_i W_i J_{i+1} W_i (-J_i) W_i J_{i+1} W_i Q_i$. The rest $(-J_i)$ is reflected at Interface i. Cycles of multireflection are repeated between Interfaces i and i+1 in indefinite times. Total transmittance in the i-th layer between Interface i and i+1 is the sum of an infinite sequence.

*i-th* layer transmittance=$K_i W_i K_{i+1} + K_i W_i J_{i+1} W_i (-J_i)$
$W_i K_{i+1} + K_i W_i J_{i+1} W_i (-J_i) W_i J_{i+1} W_i (-J_i) W_i K_{i+1} +$
$K_i W_i J_{i+1} W_i (-J_i) W_i J_{i+1} W_i (-J_i) W_i J_{i+1} W_i (-J_i) W_i$
$K_{i+1} + \ldots$ This is an infinite geometric sequence with a term ratio of $J_{i+1} W_i (-J_i) W_i$. The sum can be easily obtained.

$$j\text{-th layer transmittance} = K_i W_i K_{i+1} / \{1 + J_{i+1} W_i J_i W_i\}. \tag{33}$$

In the expression of transmittance, the numerator $K_i W_i K_{i+1}$ corresponds to the leftest, simplest diagram in FIG. 20. The denominator is a problem. The second term of the numerator is a number of a ratio of a geometric sequence multiplied by $(-1)$. The denominator signifies the sum of all the multireflection reciprocating in the i-th layer to infinite series. The expression of Eq.(33) is simple because multireflection is restricted within the i-th layer. There are a variety of modes of multireflection since the film includes a plurality of layers. The expression including all the multireflection is not so simple as Eq.(33). Multireflection within a single layer is named "intralayer" multireflection. Multireflection within a plurality of layers is named "interlayer" multireflection. When the number of layers is two, it is called binary interlayer multireflection. When the number of layers is three, thrice interlayer multireflection. When the number of layers is four, it is called four-times interlayer multireflection.

Multireflection within two layers will be considered by referring to FIG. 20. It is named "binary interlayer multireflection". FIG. 20 shows four layers which relate to the binary interlayer multireflection. If individual layers were denoted by (i−1)-th, i-th, (i+1)-th and (i+2)-th, redundant suffixes would cause misunderstanding. Thus layers are briefly denoted by 0-th, 1-th, 2-th and 3-th layers from top to bottom in FIG. 20. Interfaces are denoted by Interfaces 1, 2 and 3. Incident light of power 1 in the 0-th layer (air) is assumed. The incident light slantingly goes via Interface 1 into the 1st layer. Interface 1 reflects the incident beam into a $J_1$ reflection beam and refracts into a $K_1$ refraction beam. The transmitting $K_1$ beam experiences a wavefunction change $W_1$ in the 1st layer and attains at Interface 2 with an inclination angle $\theta_1$. A part $J_2$ is reflected at Interface 2. Another part $K_2$ goes via Interface 2 into the 2nd layer. Refracting $K_2$ goes in the 2nd layer with a wavefunction change $W_2$ and reaches Interface 3. A part $J_3$ is reflected back into the 2nd layer. Another part $K_3$ goes out via Interface 3 into the 3rd layer. The shortest path beam has a wavefunction $K_1 W_1 K_2 W_2 K_3$. K-parameters $K_1$, $K_2$ and $K_3$ mean refraction coefficients of a beam passing Interfaces 1, 2, and 3. W-parameters $W_1$, $W_2$ and $W_3$ are wavefunction changes in the 1st, 2nd and 3rd layers. The shortest path lacks reflection. Thus the wavefunction lacks J parameters.

Reflected $J_2$ light experiences a wavefunction change $W_1$ and returns to Interface 1. A part $Q_1$ goes up into the 0th layer. Another part $(-J_1)$ is reflected at Interface 1. The $(-J_1)$ light goes in the 1st layer with a wavefunction change $W_1$ to Interface 2. A part $K_2$ refracts at Interface 2. Another part $J_2$ is reflected. Refracted $K_2$ light experiences $W_2$ a wavefunction change in the 2nd layer and arrives at Interface 3. A part $K_3$ passes and goes into the 3rd layer. Infinite repetitions of intralayer multireflection in the 1st layer give a denominator $\{1 + J_2 W_1 J_1 W_1\}$ as clarified by Eq.(33) (i→1, i+1→2).

Besides the above 1-layer intralayer multireflection term, $J_3$, which originates from reflection at interface 2, repeats multireflection within the 2nd layer and goes out of the 2nd layer to the 3rd layer. It is within-2nd layer multireflection. The effect of the multireflection shall be obtained by adding a denominator term $\{1+J_3W_2J_2W_2\}$.

In addition, binary interlayer multireflection within the 1st and 2nd layers occurs as shown by FIG. 20.

The lowest order is denoted by $K_1W_1K_2W_2J_3W_2Q_2W_1(-J_1)W_1K_2W_2K_3$.

The second lowest order is denoted by $K_1W_1K_2W_2J_3W_2Q_2W_1(-J_1)W_1K_2W_2J_3W_2Q_2W_1(-J_1)W_1K_2W_2K_3$.

The 1-2-interlayer multireflection is a sum of $$K_1W_1K_2W_2K_3+K_1W_1K_2W_2J_3W_2Q_2W_1(-J_1)$$
$$W_1K_2W_2K_3+K_1W_1K_2W_2J_3W_2Q_2W_1(-J_1)$$
$$W_1K_2W_2J_3W_2Q_2W_1(-J_1)W_1K_2W_2K_3+\ldots \quad (34)$$

The 1-2-binary interlayer multireflection composes an infinite geometric sequence of a term ratio of $J_3W_2Q_2W_1(-J_1)W_1K_2W_2$. The sum of (34) becomes $$K_1W_1K_2W_2K_3/(1+J_3W_2Q_2W_1J_1W_1K_2W_2). \quad (35)$$

Actually, the multireflection does occur not only in each of the 1-intralayer, 2-intralayer and 1-2-interlayer but also in the whole of the 1-intralayer, 2-intralayer and 1-2-interlayer. The multireflection should be considered as a complex including all of the 1-intralayer, 2-intralayer and 1-2 interlayer. It is the sum of complex sets of terms. But the sum is simply obtained by adopting three denominators for the 1-intralayer, 2-intralayer and 1-2-interlayer multireflection.

$$\text{Whole 1-2 binary transmittance}=K_1W_1K_2W_2K_3/\{(1+J_2W_1J_1W_1)(1+J_3W_2J_2W_2)$$
$$(1+J_3W_2Q_2W_1J_1W_1K_2W_2)\}. \quad (36)$$

Eq.(36) includes all the contributions of multireflections of a two-layered film case. The example relates to a structure of two layers interposed between air and an InP layer (substrate or window). Two layer case is the simplest. 3, 4, 5, 6, . . . layer films should be considered. 6-layered films shown in FIG. 7 and FIG. 13 have accompanied by eight interface multireflection. FIG. 14 and FIG. 15 have four layers upon InP, which causes 6 interface multireflection. The multireflection, which is only a simple extension of Eq.(36), can be precisely represented. For avoiding confusion and misunderstanding, expressions of sums of multilayer reflection in S-wave will be described step by step in an order of increasing numbers from a three layer case. In any case, 0th order is air (n=1). The final order is InP(n=3.2). The film is named by the number of intermediate layers except air and InP.

The followings are expressions of full transmittance of three, four layers for S-wave.

[Three Layered Film: 0th, 1st, 2nd, 3rd, 4th(=InP Undercoat): S-Wave]

$$\text{3-layer transmittance}=K_1W_1K_2W_2K_3W_3K_4/\{(1+J_2W_1J_1W_1)(1+J_3W_2J_2W_2)(1+J_4W_3J_3W_3)$$
$$(1+J_3W_2Q_2W_1J_1W_1K_2W_2)(1+J_4W_3Q_3W_2J_2W_2K_3W_3)$$
$$(1+J_4W_3Q_3W_2Q_2W_1J_1W_1K_2W_2K_3W_3)\}. \quad (37)$$

The four layered film, which corresponds to FIG. 14 and FIG. 15, has an expression of full transmittance (S-wave).

[Four Layered Film: 0th, 1st, 2nd, 3rd, 4th, 5th(=InP Undercoat); S-Wave]

$$\text{4-layer transmittance}=K_1W_1K_2W_2K_3W_3K_4W_4K_5/\{(1+J_2W_1J_1W_1)(1+J_3W_2J_2W_2)(1+J_4W_3J_3W_3)(1+J_5W_4J_4W_4)(1+J_3W_2Q_2W_1J_1W_1K_2W_2)(1+$$
$$J_4W_3Q_3W_2J_2W_2K_3W_3)(1+J_5W_4Q_4W_3J_3W_3K_4W_4)$$
$$(1+J_4W_3Q_3W_2Q_2W_1J_1W_1K_2W_2K_3W_3)(1+$$
$$J_5W_4Q_4W_3Q_3W_2J_2W_2K_3W_3K_4W_4)(1+$$
$$J_5W_4Q_4W_3Q_3W_2Q_2W_1J_1W_1K_2W_2K_3W_3K_4W_4)\}. \quad (38)$$

Concrete expressions have been obtained for three-layered and four layered films. Similar expressions can be formulated for five, six and higher order films. A six-layered film corresponds to the films shown in FIG. 7 and FIG. 13.

The above expressions are concrete, full, exact, comprehensive transmittances of two, three and four layered structure films for S-wave. Expressions for P-wave are obtained by replacing K by L and J by M respectively in the above.

An electric field ratio of the transmitting light to the incidence light is equal to an absolute value of the above transmittance in any case. Absolute values $|W_i|$ of wavefunction changes $W_i$ is 1. All the wavefunction changes $W_i$ in the numerators vanish, since $|W_i|=1$. The numerators are reduced to products of $K_i$ (e.g., $K_1K_2 \ldots$). The numerators, which are products of $K_i$, are too large. As mentioned before, the absolute value of power flow ratio (Poyinting vector E×H ratio) is a square of electric field ratio multiplied by 3.2 (=n of InP). The present invention requires 0.1-0.2 absorption. Squares of numerators (e.g., $K_1K_2 \ldots$) are always too large. The $K_i$ products of the numerators are too large, since squares of the numerators multiplied by 3.2 exceed a desired range of 0.1 to 0.2. Taking only the numerators into account for transmittances, $3.2\times(\text{numerators})^2$ are always larger than 0.2, which is an upper limit allowed by the present invention. However, the present invention requires that $3.2\times(\text{transmittance})^2$ should fall into a range between 0.1 and 0.2. The absolute values of denominator should be larger than 1 for reducing (transmittance)$^2$. All components of denominators have a form (1+Z), where Z is complex numbers, whose absolute values are less than 1. If all Z in denominators are positive real numbers, the transmittance takes a minimum value, which is smaller than the numerator. Changing Z into a positive real number is equivalent to minimizing transmittances. If the minimum values fall into a range of 0.1-0.2, the multilayered films are allowable for the present invention.

This is an important matter. The above consideration establishes a clear guideline of designing high reflective multilayered films required for the present invention. The equations of multireflection themselves are novel and new. This fact will be described later with reference to ②Japanese Patent Laying Open No. 08-116127.

The part Z in (1+Z) in the denominators includes two same wavefunctions $W_iW_i$ in the same layer without exception. The square $W_i^2$ of a wavefunction $W_i$ is a complex number whose absolute value is 1.

Intralayer multireflection expressed by Eq.(33) gives transmittance=$K_iW_iK_{i+1}/\{1+J_{i+1}W_iJ_iW_i\}$. The denominator of the intralayer multireflection is $\{1+J_{i+1}W_iJ_iW_i\}$. $J_{i+1}W_iJ_iW_i$ is a product of reflection coefficients $J_i$ and $J_{i+1}$ at Interfaces i and (i+1) and a square $W_i^2$ of wavefunctions $W_i$.

Maximizing the denominator $\{1+J_{i+1}W_iJ_iW_i\}$ requires $W_i^2=-1$ in the case of a negative $J_iJ_{i+1}$. Maximizing the denominator $\{1+J_{i+1}W_iJ_iW_i\}$ requires $W_i^2=+1$ in the case of a positive $J_iJ_{i+1}$. In both cases, the denominator takes the maximum value $\{1+|J_{i+1}J_i|\}$.

[(a) case of negative $J_iJ_{i+1}$ ($J_iJ_{i+1}<0$) in intralayer multireflection ($W_i^2=-1$)]

When $J_iJ_{i+1}$ is negative, either $J_i$ is negative and $J_{i+1}$ is positive or $J_i$ is positive and $J_{i+1}$ is negative.

A negative $J_i$ means that the i-th layer has a refractive index higher than the (i−1)-th layer ($n_i>n_{i-1}$). A positive $J_{i+1}$ means that the i-th layer has a refractive index higher than the (i+1)- th layer ($n_i > n_{i+1}$). That $J_i$ is negative and $J_{i+1}$ is positive means that a higher refractive index i-th layer is sandwiched between lower refractive index (i−1)-th and (i+1)-th layers ($n_i > n_{i+1}$, $n_{i-1}$). In the case, $W_i^2 = -1$ maximizes the denominator.

On the contrary, a positive $J_i$ means that the i-th layer has a refractive index lower than the (i−1)-th layer ($n_i < n_{i-1}$). A negative $J_{i+1}$ means that the i-th layer has a refractive index lower than the (i+1)-th layer ($n_i < n_{i+1}$). That $J_i$ is positive and $J_{i+1}$ is negative means that a lower refractive index i-th layer is sandwiched between higher refractive index (i−1)-th and (i+1)-th layers ($n_i < n_{i+1}$, $n_{i-1}$). In the case, $W_i^2 = -1$ maximizes the denominator.

Namely $W_i^2 = -1$ is required to maximize denominators in both the first case of a higher refractive index i-th layer sandwiched between lower refractive index (i−1)-th and (i+1)-th layers ($n_{i-1} < n_i > n_{i+1}$) and the second case of a lower refractive index i-th layer sandwiched between higher refractive index (i−1)-th and (i+1)-th layers ($n_{i-1} > n_i < n_{i+1}$).

$W_i^2 = -1$ means $\cos 2\phi_i + j \sin 2\phi_i = -1$ ($\phi_i = 2\pi n_i d_i \sec \theta_i / \lambda$). Thus $2\phi_i = \pi$. Then $\phi_i = \pi/2$.

$$2\pi n_i d_i \sec \theta_i / \lambda = \pi/2. \tag{39}$$

$$d_i = \lambda \cos \theta_i / 4n_i. \tag{40}$$

The i-th layer should be an oblique quarter wavelength (slanting $\lambda/4$) thickness. $W_i^2 = -1$ means a slanting $\lambda/4$ thickness of the i-th layer.

The thickness is not simple $\lambda/4n_i$ but $\lambda \cos \theta_i / 4n_i$. Attention should be paid to inclusion of $\cos \theta_i$.

[(b) case of positive $J_i J_{i+1}$ ($J_i J_{i+1} > 0$) in intralayer multireflection ($W_i^2 = +1$)]

When $J_i J_{i+1}$ is positive, either $J_i$ is negative and $J_{i+1}$ is negative or $J_i$ is positive and $J_{i+1}$ is positive.

A negative $J_i$ means that the i-th layer has a refractive index higher than the (i−1)-th layer ($n_i > n_{i-1}$). A negative $J_{i+1}$ means that the i-th layer has a refractive index lower than the (i+1)-th layer ($n_i < n_{i+1}$). That $J_i$ is negative and $J_{i+1}$ is negative means that a mediate refractive index i-th layer is sandwiched between a lower refractive index (i−1)-th layer and a higher refractive index (i+1)-th layer ($n_{i-1} < n_i < n_{i+1}$). In the case, $W_i^2 = +1$ maximizes the denominator.

On the contrary, a positive $J_i$ means that the i-th layer has a refractive index lower than the (i−1)-th layer ($n_i < n_{i-1}$). A positive $J_{i+1}$ means that the i-th layer has a refractive index higher than the (i+1)-th layer ($n_i > n_{i+1}$). That $J_i$ is positive and $J_{i+1}$ is negative means that a mediate refractive index i-th layer is sandwiched between a higher refractive index (i−1)-th layer and a lower refractive index (i+1)-th layer ($n_{i-1} > n_i > n_{i+1}$). In the case, $W_i^2 = +1$ maximizes the denominator.

Namely when a mediate refractive index dielectric layer is sandwiched by a lower refractive index layer and a higher refractive index layer ($n_{i-1} < n_i < n_{i+1}$ or $n_{i-1} > n_i > n_{i+1}$), maximizing denominators requires $W_i^2 = +1$ irrespective of an increasing or decreasing order. Increasing refractive indices or decreasing refractive indices in three layers demand $W_i^2 = +1$ in denominators for minimizing transmittance (=for maximizing denominators).

$W_i^2 = +1$ is equivalent to $\cos 2\phi_i + j \sin 2\phi_i = +1$ ($\phi_i = 2\pi n_i d_i \sec \theta_i / \lambda$). $2\phi = \in$ ($\in$ is a positive number close to 0) or $\phi = \pi$.

This means that the layer should have a slanting $0\lambda$ or $\lambda/2$ thickness. $\in$ is a number between 0 and 0.1. In the case of $\phi = \pi$, $$2\pi n_i d_i \sec \theta_i / \lambda = \pi. \tag{41}$$

Thus $$d_i = \lambda \cos \theta_i / 2n_i. \tag{42}$$

Namely when three neighboring layers align in an increasing refractive index order or in a decreasing refractive index order, a pertinent thickness of the mediate layer should be $0\lambda$ or $0.5\lambda \cos \theta_i$ for maximizing denominators. Not a simple half wavelength ($\lambda/2$), but $\lambda \cos \theta_i / 2$ is an appropriate thickness. Attention should be paid to the multiplier $\cos \theta_i$.

The next problem is a contribution of two-layer interlayer multireflection denoted by Eq.(35) to transmittance. Eq.(35) reads, $$1,2\text{-layer transmission} = K_1 W_1 K_2 W_2 K_3 / (1 + J_3 W_2 Q_2 W_1 J_1 W_1 K_2 W_2) \tag{43}$$

Reflection coefficients $Q_2$ and $K_2$ in the denominator are positive numbers which are close to 1 ($Q_2 + K_2 = 2$). $Q_2$ and $K_2$ have no influence on determining a positivity or negativity of the denominator. The denominator includes a product of squares $W_1^2$ and $W_2^2$ of two wavefunctions $W_1$ and $W_2$. The denominator contains reflection coefficients $J_3 J_1$. The decrease of transmittance requires an increase of the denominator in (43). Maximizing the denominator is equal to minimizing the transmittance.

When $J_3 J_1$ is negative ($J_3 J_1 < 0$), $W_1^2 W_2^2 = -1$ maximizes the denominator. When $J_3 J_1$ is positive ($J_3 J_1 > 0$), $W_1^2 W_2^2 = +1$ maximizes the denominator. Both cases give the minimum 2-layer transmission = $K_1 K_2 K_3 / (1 + |J_3 Q_2 J_1 K_2|)$

[(c) Case of negative $J_3 J_1$ ($J_3 J_1 < 0$) in binary interlayer multireflection ($W_1^2 W_2^2 = -1$)]

When $J_3 J_1$ is negative, either $J_1$ is negative and $J_3$ is positive ($J_1 < 0 < J_3$) or $J_1$ is positive and $J_3$ is negative ($J_1 > 0 > J_3$).

In the former case, in which $J_1$ is negative and $J_3$ is positive ($J_1 < 0 < J_3$), the 1st layer has a refractive index $n_1$ lower than the 2nd layer ($n_1 < n_2$). The 3rd layer has a refraction index $n_3$ higher than the 4th layer ($n_3 > n_4$). An outstanding problem is the relation between the 2nd layer $n_2$ and the 3rd layer $n_3$.

When the 2nd layer has a refractive index $n_2$ which is lower than the 3rd layer, three layers have an increasing order of $n_1$, $n_2$ and $n_3$ ($n_1 < n_2 < n_3$). The consideration of case (b) teaches us to choose $W_2^2 = +1$. Since $W_1^2 W_2^2 = -1$, $W_1^2 = -1$ is required. $W_1^2 = -1$ requires that the refractive index $n_0$ of the 0-th layer should be larger than the refractive index $n_1$ of the 1st layer ($n_0 > n_1 < n_2 < n_3 > n_4$).

On the contrary when the 2nd layer refractive index $n_2$ is higher than the 3rd layer refractive index $n_3$, the 2nd layer has the highest refractive index $n_2$ ($n_1 < n_2 > n_3$). The aforementioned case (a) recommends us to choose $W_2^2 = -1$. Since $W_1^2 W_2^2 = -1$, $W_1^2 = +1$ is required. $W_1^2 = +1$ requires that the refractive index $n_0$ of the 0-th layer should be smaller than the refractive index $n_1$ of the 1st layer ($n_0 < n_1 < n_2 > n_3 > n_4$). The minimum 2-layer transmission = $K_1 K_2 K_3 / (1 + |J_3 Q_2 J_1 K_2|)$ in both cases, as mentioned before.

In the later case of $J_1 > 0 > J_3$, the 1st layer has a refractive index $n_1$ higher than the 2nd layer ($n_1 > n_2$). The 3rd layer has a refractive index $n_3$ lower than the 4th layer ($n_3 < n_4$). An outstanding problem is the relation between the 2nd layer $n_2$ and the 3rd layer $n_3$.

When the 2nd layer has a refractive index $n_2$ which is lower than the 3rd layer ($n_2 < n_3$), three layers have an increasing order of $n_2$, $n_3$ and $n_4$ ($n_1 > n_2 < n_3 < n_4$). The 2nd layer has the lowest refractive index $n_2$. The consideration of case (a) teaches us to choose $W_2^2 = -1$. Since $W_1^2 W_2^2 = -1$, $W_1^2 = +1$ is required. $W_1^2 = +1$ requires that the refractive index $n_0$ of the 0-th layer should be larger than the refractive index $n_1$ of the 1st layer ($n_0 > n_1 > n_2 < n_3 < n_4$).

On the contrary when the 2nd layer refractive index $n_2$ is higher than the 3rd layer refractive index $n_3$, the 2nd layer has a medium refractive index $n_2$ ($n_1>n_2>n_3$). The aforementioned case (a) recommends us to choose $W_2^2=+1$. Since $W_1^2W_2^2=-1$, $W_1^2=-1$ is required. $W_1^2=-1$ requires that the refractive index $n_0$ of the 0-th layer should be smaller than the refractive index $n_1$ of the 1st layer ($n_0<n_1>n_2>n_3<n_4$). The minimum 2-layer transmission=$K_1K_2K_3/(1+|J_3Q_2J_1K_2|)$ in both cases, as mentioned before.

[(d) Case of positive $J_3J_1$ ($J_3J_1>0$) in 2-layer interlayer multireflection ($W_1^2W_2^2=+1$)]

When $J_3J_1$ is positive, either both $J_1$ and $J_3$ are negative ($J_1$, $J_3<0$) or both $J_1$ and $J_3$ are positive ($J_1, J_3>0$).

In the former case ($J_1, J_3<0$), the 1st layer has a refractive index $n_1$ lower than the 2nd layer ($n_1<n_2$). The 3rd layer has a refractive index $n_3$ lower than the 4th layer ($n_3<n_4$). An outstanding problem is the relation between the 2nd layer $n_2$ and the 3rd layer $n_3$.

When the 2nd layer has a refractive index $n_2$ which is lower than the 3rd layer ($n_2<n_3$), three layers have an increasing order of $n_1$, $n_2$ and $n_3$ ($n_1<n_2<n_3$). The consideration of case (b) teaches us to choose $W_2^2=+1$. Since $W_1^2W_2^2=+1$, $W_1^2=+1$ is required. $W_1^2=+1$ requires that the refractive index $n_0$ of the 0-th layer should be smaller than the refractive index $n_1$ of the 1st layer ($n_0<n_1<n_2<n_3<n_4$).

On the contrary when the 2nd layer refractive index $n_2$ is higher than the 3rd layer refractive index $n_3$ ($n_2>n_3$), the 2nd layer has the highest refractive index $n_2$ (n, $<n_2>n_3$). The aforementioned case (b) recommends us to choose $W_2^2=-1$. Since $W_1^2W_2^2=+1$, $W_1^2=-1$ is required. $W_1^2=-1$ requires that the refractive index $n_0$ of the 0-th layer should be larger than the refractive index $n_1$ of the 1st layer ($n_0>n_1<n_2>n_3<n_4$). The minimum 2-layer transmission=$K_1K_2K_3/(1+|J_3Q_2J_1K_2|)$ in both cases, as mentioned before.

In the latter case ($J_1, J_3>0$), the 1st layer has a refractive index $n_1$ higher than the 2nd layer ($n_1>n_2$). The 3rd layer has a refractive index $n_3$ higher than the 4th layer ($n_3>n_4$). An outstanding problem is the relation between the 2nd layer $n_2$ and the 3rd layer $n_3$.

When the 2nd layer has a refractive index $n_2$ which is higher than the 3rd layer ($n_2>n_3$), three 1st, 2nd, 3rd layers have a decreasing order of refractive indices ($n_1>n_2>n_3>n_4$). The consideration of case (b) teaches us to choose $W_2^2=+1$. Since $W_1^2W_2^2=+1$, $W_1^2=+1$ is required. $W_1^2=+1$ requires that the refractive index $n_0$ of the 0-th layer should be larger than the refractive index $n_1$ of the 1st layer ($n_0>n_1>n_2>n_3>n_4$).

On the contrary when the 2nd layer refractive index $n_2$ is lower than the 3rd layer refractive index $n_3$ ($n_2<n_3$), the 2nd layer has the minimum refractive index $n_2$ ($n_1>n_2<n_3$). The aforementioned case (a) recommends us to choose $W_2^2=-1$. Since $W_1^2W_2^2=+1$, $W_1^2=-1$ is required. $W_1^2=-1$ requires that the refractive index $n_0$ of the 0-th layer should be smaller than the refractive index $n_1$ of the 1st layer ($n_0<n>n_2<n_3>n_4$). The minimum 2-layer transmission=$K_1K_2K_3/(1+|J_3Q_2J_1K_2|)$ in both cases, as mentioned before.

Three layer interlayer multireflection includes an additional, extra new term which corresponds to three final term of Eq.(37).

$$\text{extra 3-layer transmittance} = K_1W_1K_2W_2K_3W_3K_4/(1+J_4W_3Q_3W_2Q_2W_1J_1W_1K_2W_2K_3W_3) \quad (44)$$

This expression seems to be more complex than the preceding 2-layer multireflection transmittance. Similar consideration is applicable. Refraction coefficients $Q_3$, $Q_2$, $K_2$ and $K_3$ are positive numbers close to 1 ($Q_3+K_3=2$, $Q_2+K_2=2$). Refraction coefficients ($K, Q$ parametere) cause no problem. The denominator of (44) includes reflective coefficients $J_4$ and $J_1$. Reflective coefficients take negative or positive values. The denominator further contains a product $W_1^2W_2^2W_3^2$ of squares of wavefunctions $W_1$, $W_2$ and $W_3$. Maximizing the denominator $(1+J_4W_3Q_3W_2Q_2W_1J_1W_1K_2W_2K_3W_3)$ of (44) requires $W_1^2W_2^2W_3^2=-1$ for negative $J_1J_4$ ($J_1J_4<0$). Maximizing the denominator $(1+J_4W_3Q_3W_2Q_2W_1J_1W_1K_2W_2K_3W_3)$ of (44) requires $W_1^2W_2^2W_3^2=+1$ for positive $J_1J_4$ ($J_1J_4>0$).

[(e) Case of negative $J_1J_4$ ($J_1J_4<0$) in thrice interlayer multireflection ($W_1^2W_2^2W_3^2=-1$)]

When $J_4J_1$ is negative, either $J_1$ is negative and $J_4$ are positive ($J_1<0<J_4$) or $J_1$ is positive and $J_4$ is negative ($J_1>0>J_4$).

The first case of $J_1<0<J_4$ means $n_0<n_1$, $n_3>n_4$. Relations of $n_1$, $n_2$ and $n_3$ are outstanding. A relation between $n_1$ and $n_3$ is out of a problem. There are four cases.

If $n_0<n_1<n_2<n_3>n_4$, a set of $W_1^2=+1$, $W_2^2=+1$ and $W_3^2=-1$ maximizes the denominator.

If $n_0<n_1<n_2>n_3>n_4$, a set of $W_1^2=+1$, $W_2^2=-1$ and $W_3^2=+1$ maximizes the denominator.

If $n_0<n_1>n_2<n_3>n_4$, a set of $W_1^2=-1$, $W_2^2=-1$ and $W_3^2=-1$ maximizes the denominator.

If $n_0<n_1>n_2>n_3>n_4$, a set of $W_1^2=-1$, $W_2^2=+1$ and $W_3^2=+1$ maximizes the denominator.

The second case of $J_1>0>J_4$ means $n_0>n_1$, $n_3<n_4$. Relations of $n_1$, $n_2$ and $n_3$ are outstanding. A relation between $n_1$ and $n_3$ is out of a problem. There are four cases.

If $n_0>n_1<n_2<n_3<n_4$, a set of $W_1^2=-1$, $W_2^2=+1$ and $W_3^2=+1$ maximizes the denominator.

If $n_0>n_1<n_2>n_3<n_4$, a set of $W_1^2=-1$, $W_2^2=-1$ and $W_3^2=-1$ maximizes the denominator.

If $n_0>n_1>n_2<n_3<n_4$, a set of $W_1^2=+1$, $W_2^2=-1$ and $W_3^2=+1$ maximizes the denominator.

If $n_0>n_1>n_2>n_3<n_4$, a set of $W_1^2=+1$, $W_2^2=+1$ and $W_3^2=-1$ maximizes the denominator.

[(f) Case of positive $J_1J_4$ ($J_1J_4>0$) in thrice interlayer multireflection ($W_1^2W_2^2W_3^2=+1$)]

When $J_4J_1$ is positive, either $J_1$ is negative and $J_4$ are negative ($J_1<0, J_4<0$) or $J_1$ is positive and $J_4$ is positive ($J_1>0, J_4>0$). The first case of $J_1<0$ and $J_4<0$ means $n_0<n_1$, $n_3<n_4$. Relations of $n_1$, $n_2$ and $n_3$ are outstanding. A relation between $n_1$ and $n_3$ is out of a problem. There are four cases.

If $n_0<n_1<n_2<n_3<n_4$, a set of $W_1^2=+1$, $W_2^2=+1$ and $W_3^2=+1$ maximizes the denominator.

If $n_0<n_1<n_2>n_3<n_4$, a set of $W_1^2=+1$, $W_2^2=-1$ and $W_3^2=-1$ maximizes the denominator.

If $n_0<n_1>n_2<n_3<n_4$, a set of $W_1^2=-1$, $W_2^2=-1$ and $W_3^2=+1$ maximizes the denominator.

If $n_0<n_1>n_2>n_3<n_4$, a set of $W_1^2=-1$, $W_2^2=+1$ and $W_3^2=-1$ maximizes the denominator.

The second case of $J_1>0$ and $J_4>0$ means $n_0>n_1$, $n_3>n_4$. Relations of $n_1$, $n_2$ and $n_3$ are outstanding. A relation between $n_1$ and $n_3$ is out of a problem. There are four cases.

If $n_0>n_1<n_2<n_3>n_4$, a set of $W_1^2=-1$, $W_2^2=+1$ and $W_3^2=-1$ maximizes the denominator.

If $n_0>n_1<n_2>n_3>n_4$, a set of $W_1^2=-1$, $W_2^2=-1$ and $W_3^2=+1$ maximizes the denominator.

If $n_0>n_1>n_2<n_3>n_4$, a set of $W_1^2=+1$, $W_2^2=-1$ and $W_3^2=-1$ maximizes the denominator.

If $n_0>n_1>n_2>n_3>n_4$, a set of $W_1^2=+1$, $W_2^2=+1$ and $W_3^2=+1$ maximizes the denominator.

The above consideration proves that any case of thrice interlayer multireflection has selections of parameters of maximizing the denominators without contradicting the intralayer and binary interlayer multireflections (a) to (d) of maximizing their denominators.

[(j) m interlayer multireflection]

In general, m layer interlayer multireflection produces the following new denominator term in addition to (m−1) layer interlayer multireflection.

$$(1+J_1J_{m+1}KKKKKK \ldots QQQQQ \ldots W_1^2W_2^2W_3^2W_4^2 \ldots W_m^2W_{m+1}^2). \quad (45)$$

KKKKKK … QQQQQ … is a positive number close to 1, which does not change signs. When $J_1$ is positive and $J_{m+1}$ is positive ($J_1$, $J_{m+1}$>0), a case of $n_0<n_1<n_2<n_3< \ldots <n_m$ is possible. In this case, all positive 1 wavefunction squares ($W_1^2=W_2^2=W_3^2=W_4^2= \ldots =W_{m+1}^2=+1$) maximize the denominator (45). If a relation of one pair of refractive indices is reversed, two wavefunctions should change their signs. Then the product is not changed. The set can maximize the denominator (45). On the contrary, when $J_1$ is negative and $J_{m+1}$ is positive ($J_1<0$, $J_{m+1}>0$), a case of $n_0>n_1<n_2<n_3< \ldots <n_m$ is possible. In this case, $W_1^2=-1$ and all other positive 1 wavefunction squares ($W_2^2=W_3^2=W_4^2= \ldots =W_{m+1}^2=+1$) maximize the denominator (45). If a relation of one pair of refractive indices is reversed, two wavefunctions should change their signs. Then the product is not changed. The set can maximize the denominator (45). In other cases of $J_1<0$, $J_{m+1}<0$ and $J_1>0$, $J_{m+1}<0$, the denominator can be maximized by a similar manner. The determination is similar to the initial intralayer multireflection rules (a) and (b).

The consideration teaches us that the single layer rule (a) and (b) are applicable to higher layer multireflection modes. Conveniently the rules mentioned in (c) to (j) can be reduced to the intralayer multireflection rules (a) and (b). This is a very useful property. Concrete expressions for denominator-maximized transmittances of four layers (FIG. 14 and FIG. 15), five layers and six layers (FIG. 7 and FIG. 13) are given. Absolute values of wavefunctions included in numerators are 1. The wavefunctions in numerators are vanished by taking absolute values. Full power of light reaching InP is given by a square of a transmittance multiplied by 3.2 (n of InP). Namely power=3.2×(transmittance)$^2$.

[Four layer reflection film (0th, 1st, 2nd, 3rd, 4th, 5th; 0th=air, 5th=InP); S-wave]

Eq.(38) gives a general (arbitrary $W_i$) and complete expression of four layer multireflection. The minimum transmittance is $$|\text{Four layer transmittance}|=K_1K_2K_3K_4K_5/\{(1+|J_2J_1|)\\
(1+|J_3J_2|)(1+|J_4J_3|)(1+|J_5J_4|)(1+|J_3Q_2J_1K_2|)(1+|\\
J_4Q_3J_2K_3|)(1+|J_5Q_4J_3K_4|)(1+|J_4Q_3Q_2J_1K_2K_3|)\\
(1+|J_5Q_4Q_3J_2K_3K_4|)(1+|J_5Q_4Q_3Q_2J_1K_2K_3K_4|)\}. \quad (46)$$

The above is the minimum four-layer transmittance which maximizes denominators. A similar calculation gives the minimum of five layer reflection film.

[Five layer reflection film (0th, 1st, 2nd, 3rd, 4th, 5th, 6th; 0th=air, 6th=InP); S-wave]

The minimum five layer transmittance is $$|\text{Five layer transmittance}|=K_1K_2K_3K_4K_5K_6/\{(1+|J_2J_1|)\\
(1+|J_3J_2|)(1+|J_4J_3|)(1+|J_5J_4|)(1+|J_6J_5|)(1+|\\
J_3Q_2J_1K_2|)(1+|J_4Q_3J_2K_3|)(1+|J_5Q_4J_3K_4|)(1+|\\
J_6Q_5J_4K_5|)(1+|J_4Q_3Q_2J_1K_2K_3|)(1+|\\
J_5Q_4Q_3J_2K_3K_4|)(1+|J_6Q_5Q_4J_3K_4K_5|)(1+|\\
J_5Q_4Q_3Q_2J_1K_2K_3K_4|)(1+|J_6Q_5Q_4Q_3J_2K_3K_4K_5|)\\
(1+|J_6Q_5Q_4Q_3Q_2J_1K_2K_3K_4K_5|)\}. \quad (47)$$

The above is the minimum five-layer transmittance which maximizes denominators. A similar calculation gives the minimum of six layer reflection film.

[Six layer reflection film (0th, 1st, 2nd, 3rd, 4th, 5th, 6th, 7th; 0th=air, 7th=InP): S-wave]

The minimum six layer transmittance is $$|\text{Six layer transmittance}|=K_1K_2K_3K_4K_5K_6K_7/\{(1+|\\
J_2J_1|)(1+|J_3J_2|)(1+|J_4J_3|)(1+|J_5J_4|)(1+|J_6J_5|)(1+|\\
J_7J_6|)(1+|J_3Q_2J_1K_2|)(1+|J_4Q_3J_2K_3|)(1+|\\
J_5Q_4J_3K_4|)(1+|J_6Q_5J_4K_5|)(1+|J_7Q_6J_5K_6|)(1+|\\
J_4Q_3Q_2J_1K_2K_3|)(1+|J_5Q_4Q_3J_2K_3K_4|)(1+|\\
J_6Q_5Q_4J_3K_4K_5|)(1+|J_7Q_6Q_5J_4K_5K_6|)(1+|\\
J_5Q_4Q_3Q_2J_1K_2K_3K_4|)(1+|J_6Q_5Q_4Q_3J_2K_3K_4K_5|)\\
(1+|J_7Q_6Q_5Q_4J_3K_4K_5K_6|)(1+|\\
J_6Q_5Q_4Q_3Q_2J_1K_2K_3K_4K_5|)(1+|\\
J_7Q_6Q_5Q_4Q_3J_2K_3K_4K_5K_6|)(1+|\\
J_7Q_6Q_5Q_4Q_3Q_2J_1K_2K_3K_4K_5K_6|)\}. \quad (48)$$

The whole power arriving at InP (substrate or window) is obtained by squaring the transmittance and multiplying the square by 3.2 (=n of InP). Namely power=3.2×(transmittance)$^2$.

The above are all the expressions for S-wave. S-wave has a reflection coefficient of $J=\sin(\theta_2-\theta_1)/\sin(\theta_1+\theta_2)$. A minus sign (−) is attached to a wavefunction when light goes from a lower refractive index $n_1$ (larger $\theta_1$) to a higher refractive index $n_2$ (smaller $\theta_2$). Entrance from lower $n_1$ to higher $n_2$ ($n_1<n_2$) changes the sign in S-wave. The sign change induced by $n_1<n_2$ is sometimes a 180 degree change of phase. This is similar to the vertical incidence case. Analogy of the vertical incidence is valid for S-wave. P-wave has different transmittance expressions. Transmissions of P-wave are now described. S-wave has refraction coefficients K and Q and reflection coefficients J. For discerning P-wave from S-wave, refraction coefficients are designated by L and R for P-wave. Reflection coefficients are designated by M for P-wave. Replacing K, J and Q to L, M and R gives expressions of minimum transmission rates for P-wave.

[Four layer reflection film (0th, 1st, 2nd, 3rd, 4th, 5th; 0th=air, 5th=InP); P-wave]

$$|\text{Four layer minimum transmittance}|=L_1L_2L_3L_4L_5/(1+|\\
M_2M_1|)(1+|M_3M_2|)(1+|M_4M_3|)(1+|M_5M_4|)(1+|\\
M_3R_2M_1L_2|)(1+|M_4R_3M_2L_3|)(1+|\\
M_5R_4M_3L_4|)\{1+|M_4R_3R_2M_1L_2L_3|)(1+|\\
M_5R_4R_3M_2L_3L_4|)(1+|M_5R_4R_3R_2M_1L_2L_3L_4|)\}.$$

[Five layer reflection film (0th, 1st, 2nd, 3rd, 4th, 5th, 6th; 0th=air, 6th=InP); P-wave]

$$|\text{Five layer minimum transmittance}|=L_1L_2L_3L_4L_5L_6/\{\\
(1+|M_2M_1|)(1+|M_3M_2|)(1+|M_4M_3|)(1+|M_5M_4|)\\
(1+|M_6M_5|)(1+|M_3R_2M_1L_2|)(1+|M_4R_3M_2L_3|)(1+|\\
M_5R_4M_3L_4|)(1+|M_6R_5M_4L_5|)(1+|\\
M_4R_3R_2M_1L_2L_3|)(1+|M_5R_4R_3M_2L_3L_4|)(1+|\\
M_6R_5R_4M_3L_4L_5|)(1+|M_5R_4R_3R_2M_1L_2L_3L_4|)(1+|\\
M_6R_5R_4R_3M_2L_3L_4L_5|)(1+|\\
M_6R_5R_4R_3R_2M_1L_2L_3L_4L_5|)\}.$$

[Six layer reflection film (0th, 1st, 2nd, 3rd, 4th, 5th, 6th, 7th; 0th=air, 7th=InP): P-wave]

$$|\text{Six layer minimum transmittance}|=L_1L_2L_3L_4L_5L_6L_7/\\
\{(1+|M_2M_1|)(1+|M_3M_2|)(1+|M_4M_3|)(1+|M_5M_4|)\\
(1+|M_6M_5|)(1+|M_7M_6|)(1+|M_3R_2M_1L_2|)(1+|\\
M_4R_3M_2L_3|)(1+|M_5R_4M_3L_4|)(1+|M_6R_5M_4L_5|)\\
(1+|M_7R_6M_5L_6|)(1+|M_4R_3R_2M_1L_2L_3|)(1+|\\
M_5R_4R_3M_2L_3L_4|)(1+|M_6R_5R_4M_3L_4L_5|)(1+|\\
M_7R_6R_5M_4L_5L_6|)(1+|M_5R_4R_3R_2M_1L_2L_3L_4|)(1+|\\
M_6R_5R_4R_3M_2L_3L_4L_5|)(1+|M_7R_6R_5R_4M_3L_4L_5L_6|)\\
(1+|M_6R_5R_4R_3R_2M_1L_2L_3L_4L_5|)(1+|\\
M_7R_6R_5R_4R_3M_2L_3L_4L_5L_6|)(1+|\\
M_7R_6R_5R_4R_3R_2M_1L_2L_3L_4L_5L_6|)\}.$$

P-wave has a reflective coefficient $M=\tan(\theta_1-\theta_2)/\tan(\theta_1+\theta_2)$. When P-wave goes from a higher refractive index $n_1$ to a lower refractive index $n_2$ ($n_1>n_2$), the wavefunction changes the sign, or the phase at 180 degrees unlike S-wave. The change of sign or phase of P-wave contradicts to S-wave or vertical incidence wave. The situation is entirely inverse.

P-wave has a refraction (transmitting) coefficient with a denominator $\cos(\theta_1-\theta_2)$, as denoted by Eqs.(23) and (27). P-wave refraction (transmitting) coefficients are larger than S-wave.

The signs of reflection coefficients M in P-wave are inverse to J of S-wave. P-wave intralayer transmission has a denominator of $(1+M_iW_i^2M_{i+1})$. When signs of $M_i$ and $M_{i+1}$ are different ($M_i<0<M_{i+1}$ or $M_i>0>M_{i+1}$), $W_1^2=-1$ can maximize the denominator.

Such facts are similar to S-wave. When refractive indices align in an increasing ($n_{i-1}<n_i<n_{i+1}$) or decreasing ($n_{i-1}>n_i>n_{i+1}$) order in three neighboring layers (equivalently the middle $n_i$ takes a medium value), the square $W_i^2$ of the wavefunctions $W_i$ in the middle layer should be +1 ($W_i^2=+1$) also in P-wave for maximizing denominators and minimizing transmittances. When a middle refractive index takes a top (maximum) ($n_{i-1}<n_i>n_{i+1}$) value or bottom (minimum) value ($n_{i-1}>n_i<n_{i+1}$) in three neighboring layers, the square $W_i^2$ of the wavefunctions $W_i$ in the middle layer should be $-1$ ($W_i^2=-1$) also in P-wave for maximizing denominators and minimizing transmittances. The rule is valid for all modes of multireflection in P-wave. P-wave has the reflection coefficients M having signs inverse to J of S-wave. But Z of (1+Z) of denominators include two reflection coefficients M and M whose signs are both inverse to S-wave. Thus P-wave should have the same relation between the wavefunction changes $W_i^2$ and the series of $n_{i-1}$, $n_i$ and $n_{i+1}$ as S-wave. The fact enables P-wave to employ the same thickness order of high reflection films as S-wave.

In both S-wave and P-wave, when a medium refractive index takes a top or bottom (minimum or maximum) value in three indices, the wavefunctions should be $W_i^2=-1$, which means a quarter wavelength thickness ((¼)λ, precisely λ cos θ/4n) for minimizing transmittances. In both S-wave and P-wave, when a medium refractive index takes a medium value in three indices, the wavefunctions should be $W_i^2=+1$, which means a 0 wavelength thickness or a half wavelength thickness (0λ or λ/2(=precisely λ cos θ/2n)) for minimizing transmittances. The expression of λ/2 includes 0λ hereafter for simplicity.

The determined thicknesses minimize transmittances T and transmitting power U. $U=3.2T^2$. The purpose of the present invention is not to minimize transmittances of dielectric reflection films but to obtain high reflection film of 0.1 to 0.2 transmitting power U for slanting light. Thus λ/2 or λ/4 thicknesses are not essential to the present invention. λ/2 or λ/4 is a condition of minimizing transmittances. λ/2 or λ/4 is not a direct condition of making 0.1-0.2 of transmitting power U and 0.8-0.9 of reflection power. If a minimized transmitting power U is smaller than 0.1, the thicknesses should deviate from λ/4 or λ/2. If a minimized transmittance is between 0.1 and 0.2, the thicknesses of just λ/4 and λ/2 and close to λ/4 and λ/2 are available. If a minimized transmitting power U is larger than 0.2, the set of dielectric layers should be excluded from the scope of the present invention.

Therefore if the thicknesses should deviate from λ/4 or λ/2 wavelength, the estimation of allowable deviations for λ/4 or λ/2 is necessary.

FIG. 33 geometrically demonstrates changes of denominators. Denominators have a typical form of $(1+L_iL_{i+1}W_i^2)$. $L_i$ or $L_{i+1}$ is a product of J, K, Q parameters. A circle O having a radius $L_iL_{i+1}$ is drawn. An outer point P is depicted at OP=1. In FIG. 33, suffixes i and i+1 of $L_iL_{i+1}$ are omitted. The denominator is denoted by a complex distance from an arbitrary point on the circle to point P. The thickness of the i-th layer determines the point on the circle and the value of the denominator. FP gives the maximum of the denominator.

Maximizing a denominator is equivalent to place $LLW^2$ at point F (PF). If LL<0 and $W_i^2=-1$, the denominator is (1+|LL|), which corresponds to FP in FIG. 33. If LL<0 and $W_i^2=+1$, the denominator is (1−|LL|), which corresponds to PB in FIG. 33. If LL<0 and $W_i^2=-i$, the denominator is (1+i|LL|), which corresponds to PD. If LL<0 and $W_i^2=+i$, the denominator is (1−i|LL|), which corresponds to PE. $W_i^2=+i$ means λ/8 thickness. $W_i^2=-1$ means λ/4 thickness. $W_i^2=+i$ means 3λ/8 thickness. $W_i^2=+1$ means λ/2 thickness. If LL<0, $W_i^2=-1$ (equivalent to λ/4; PF) maximizes the denominator. If LL>0 and $W_i^2=+1$, the denominator is (1+|LL|), which corresponds to FP in FIG. 33. If LL>0 and $W_i^2=-1$, the denominator is (1−|LL|), which corresponds to PB in FIG. 33. If LL>0 and $W_i^2=+i$, the denominator is (1+i|LL|), which corresponds to PD. If LL>0 and $W_i^2=-i$, the denominator is (1−i |LL|), which corresponds to PE. If LL>0, $W_i^2=+1$ (equivalent to λ/2; PF) maximizes the denominator (PF=1+ |LL|). In the negative LL case, PF corresponds to λ/4.

An increase or decrease of λ/8 moves the radius from OF to OD or OE. ±λ/8 changes from the denominator-maximizing λ/4 reduce the denominator from PF to PD and PE. The value of the denominator is nearly 1 for PD and PE. A decrease from the maximum to 1 of a denominator means a change from λ/4 to λ/4±λ/8. A change of a half of the maximizing thickness is equivalent to a change from the maximum (1+|LL|) to 1. A change, that includes the addition of a half of the maximizing thickness to the maximizing thickness or the elimination of a half of the maximizing thickness from the maximizing thickness, is equal to a change from the maximum (1+|LL|) to, The transmittance T is obtained by dividing a numerator G by a denominator H. T=G/H. The numerator G is a product of refraction coefficients $K_1$, $K_2$, $K_3$, . . . . $G=K_1K_2K_3K_4K_5K_6$ . . . . The denominator is a product of individual denominators which mean individual intralayer and interlayer multireflection terms. $H=(1+J_1W_1^2J_2)$ . . . $(1+J_iW_i^2J_{i+1})$ . . . $(1+J_1W_1^2K_2Q_2W_2^2J_3)$ . . . $(1+J_iW_i^2K_{i+1}Q_{i+1}W_{i+1}^2K_{i+2}Q_{i+2}W_{i+2}^2 \ldots J_m)$. The calculation of denominators is complex. T=G/H. H=G/T. Power U of transmitting light is given by $U=3.2\times T^2$. The present invention requires U=0.1-0.2 of transmitting light power. The range of T can be reduced to the a range of transmittance T. The lowest power U=0.1 means $0.1=3.2T^2$. $(0.1/3.2)^{1/2}=0.177$. Allowable lowest T is 0.177. $T_{min}=0.177$. The highest power U=0.2 means $0.2=3.2T^2$. $(0.2/3.2)^{1/2}=0.250$. Allowable highest T is 0.250. $T_{max}=0.250$. Allowable scope of tranmittance T is 0.177-0.250. Films having transmittance less than 0.177 or more than 0.250 are unfit for the present invention.

0.177-0.250 transmittances T, which correspond to 0.1-0.2 transmitting power U, are suitable for the present invention. Namely the reflection films having just λ/4 thickness or λ/2 thickness, which minimize denominators, are fit for the present invention. There are some margins for thicknesses deviating from the minimizing λ/4 or λ/2 up to U=0.2.

When T is smaller than 0.177 (U<0.1), the films having minimizing λ/4 or λ/2 thicknesses are out of the scope of the present invention. But a change of thicknesses from the minimizing λ/4 or λ/2 increases T and U up to an allowable range of T=0.177-0.250 and U=0.1-0.2. The films are rather favorable, since the films are endowed with wide margins of allowable thicknesses. A problem arises. How thick should thicknesses deviate from the minimizing λ/2 or λ/4 values for raising the power U within a predetermined range of 0.1-0.2? FIG. 33 shows that thicknesses taking values λ8/or 3λ/8 give nearly 1 to denominators. In the virtual case, the transmittance T becomes equal to the numerator G (T=G).

T=G=$K_1K_2K_3K_4K_5$ .... The numerators G are, in most cases, larger than 0.250, the allowable upper limit of T. If the denominators are nearly 1, the transmittance T cannot satisfy the requirements of the present invention. Products of individual denominators larger than 1 lower T under 0.177.

It is assumed that the required range of T=0.177-0.250 is sandwiched between the actual value T and 1-denominator value G. When T goes from the actual T to G, thicknesses change from $\lambda/4$ to $\lambda/8$, $3\lambda/8$ by $\pm\lambda/8$. The thickness change rate is 0.5. The ratio of a thickness change to a denominator change is 0.5/(G−T).

If proportional changes are assumed between transmittances and thicknesses, a transmittance change from the actual T to 0.177 should induce a thickness change of 0.5 (0.177−T)/(G−T).

Another transmittance change from the actual T to 0.250 should induce a thickness change of 0.5(0.250−T)/(G−T).

Therefore when T is less than 0.177, which is an excellent set, thicknesses of layers should be changed (increase and decrease) by a rate of 0.5(0.177−T)/(G−T) to 0.5(0.250−T)/(G−T).

When T is more than 0.177 and less than 0.250, minimizing $\lambda/4$ satisfies the requirement (0.177<T<0.250). A margin (0.250−T) allows deviation of thickness from the minimizing value ($\lambda/4$ or $\lambda/2$). An allowable deviation of the thickness is given by 0.5(0.250−T)/(G−T).

ADVANTAGES OF THE INVENTION

The present invention proposes a photodiode having a high reflection film consisting of Si/$Al_2O_3$ or $TiO_2$/$Al_2O_3$ reciprocal layers and an SiON layer deposited on an input surface for reflecting a 45 degree inclination LD light at 80% to 90% and absorbing 10% to 20% of the slanting light for monitoring the power of the forward LD light. The photodiode of the present invention is interposed at a 45 degree inclination in the light path of a laser diode for absorbing a minor portion and reflecting a major of the forward emitting light of the laser diode. The high reflection film enables the photodiode to monitor the LD forward light. Even when temperature fluctuation and yearly degradation vary the rate of the forward/backward light of the laser diode, the photodiode can detect precisely the power change of the forward light. The power of the laser diode can be controlled more precisely by the photodiode of the present invention.

The light path of the laser diode is bent midway at a right angle by the 45 degree inclining photodiode. A metal-can laser diode device which emits forward light via a window can be produced by mounting a laser diode chip and a 45 degree inclining monitoring photodiode chip at pertinent positions and in pertinent directions in the metal can package. A planar light circuit (PLC) type laser diode device which introduces forward light into an optical fiber of an optical waveguide can be made by laying an invention photodiode chip with an input surface inclining at 45 degrees at an end of an optical fiber/waveguide and positioning a laser diode vertical to the fiber/waveguide beside the photodiode for guiding the LD forward light via the photodiode to the fiber/waveguide.

The present invention has an advantage of excellency of cohesion between the film and the photodiode, since the layer which is in direct contact with an InP window/substrate or an InGaAs light receiving layer of the photodiode is an SiON layer produced by PCVD (plasma chemical vapor deposition) method. Good cohesion between SiON and InP can prevent electron/hole surface recombination and can suppress dark current. The dark current is about nanoamperes at several volts of reverse bias in the photodiode of the present invention.

In addition to good cohesion, the SiON film has another role of protecting the InP window/substrate from the bombardment of ion-assisting electron beam evaporation for making $Al_2O_3$/Si reciprocal multilayers.

Unless concrete values are given to the expression of the transmittances, numerators and denominators are not clearly calculated and concrete structures remain still obscure. The present invention forms an SiON film directly on an InP (window/substrate) or InGaAs (receiving layer of an InP type photodiode), and piles $Al_2O_3$/Si reciprocal dielectric layers or $Al_2O_3$/$TiO_2$ reciprocal dielectric layers on the SiON layer for obtaining 0.1-0.2 of transmittances for 45 degree inclining light to InP. The minimum number of layers is three. Four, five and six layers are available. More than seven layers are also probable. There is no restriction on the layer numbers. A variety of sets of $Al_2O_3$/Si and $Al_2O_3$/$TiO_2$ satisfy the requirements of the 0.1-0.2 transmittance imposed by the present invention. There are far more sets of $Al_2O_3$/Si and $Al_2O_3$/$TiO_2$ layers having transmittances more than 0.2, which are useless for forward light monitoring photodiodes.

Concrete layer structures, thicknesses of layers and transmitting power U are explained by showing a plurality of examples. The structures of all the examples are shown in figures. $Al_2O_3$ and SiON layers should sometimes have thicknesses of 0.01 $\lambda$−0.05$\lambda$(0$\lambda$) or (½) $\lambda$ (d=$\lambda$ cos θ/2n).

Caption of 0.01-0.05$\lambda$ is difficult in figures. (½) is affixed to $Al_2O_3$ or SiON layer which should have a 0$\lambda$ or (½) $\lambda$ thickness. (½)$Al_2O_3$ and (½) SiON in figures contain 0.01$\lambda$-0.05$\lambda$ and 0.5$\lambda$ of $Al_2O_3$ and SiON.

EXAMPLE 1

Four Layers ($Al_2O_3$/Si/$Al_2O_3$/SiON/InP-Sub/Win)S-Wave; FIG. 21

0th=air, 1st=$Al_2O_3$, 2nd=Si, 3rd=$Al_2O_3$, 4th=SiON, 5th=InP (substrate/window). $n_0<n_1<n_2>n_3<n_4<n_5$. For minimizing transmittance, the 1st $Al_2O_3$ layer should have a 0.01$\lambda$-0.05$\lambda$ or $\lambda/2$ thickness. The 2nd Si layer should have a $\lambda/4$ thickness ($\lambda$ cos θ/4n). The 3rd $Al_2O_3$ layer should have a $\lambda/4$ thickness. The 4th SiON layer should have a 0.01 $\lambda$-0.05 $\lambda$ or $\lambda/2$ thickness.

From top to bottom (for minimum transmittance),
  $Al_2O_3$ thickness=0.01-0.05 $\lambda$ or 0.270 $\lambda$
  Si thickness=0.070 $\lambda$
  $Al_2O_3$ thickness=0.135 $\lambda$
  SiON thickness=0.01-0.05 $\lambda$ or 0.256 $\lambda$ When $\lambda$=1550 nm,
  $Al_2O_3$ thickness=16 nm-78 nm or 418 nm
  Si thickness=108 nm
  $Al_2O_3$ thickness=209 nm
  SiON thickness=16 nm-78 nm or 396 nm When $\lambda$=1300 nm,
  $Al_2O_3$ thickness=13 nm-65 nm or 351 nm
  Si thickness=91 nm
  $Al_2O_3$ thickness=175 nm
  SiON thickness=13 nm-65 nm or 332 nm

| | | | | |
|---|---|---|---|---|
| S-wave | $K_1 = 0.634$, | $J_1 = -0.366$ | | |
| | $K_2 = 0.613$, | $J_2 = -0.387$, | $Q_2 = 1.387$, | $K_2Q_2 = 0.850$ |
| | $K_3 = 1.387$, | $J_3 = +0.387$, | $Q_3 = 0.613$, | $K_3Q_3 = 0.850$ |
| | $K_4 = 0.958$, | $J_4 = -0.042$, | $Q_4 = 1.042$, | $K_4Q_4 = 0.998$ |
| | $K_5 = 0.691$, | $J_5 = -0.309$ | | |

$K_1K_2K_3K_4K_5 = 0.357$
$J_1J_2 = 0.1416, J_2J_3 = -0.1497, J_3J_4 = 0.0162, J_4J_5 = 0.0130, J_1K_2Q_2J_3 = -0.1204, J_2K_3Q_3J_4 = 0.0138, J_3K_4Q_4J_5 = -0.1193, J_1K_2Q_2K_3Q_3J_4 = 0.0111, J_2K_3Q_3K_4Q_4J_5 = 0.1014, J_1K_2Q_2K_3Q_3K_4Q_4J_5 = 0.0816$

Eq.(46) gives,

Minimum Transmittance=0.357/1.1416×1.1497×
1.0162×1.0130×1.1204×1.0138×1.1193×1.0111×
1.1014×1.0816=0.357/2.069=0.173

Squaring 0.173 and multiplying by 3.2 produces U=3.2× $0.173^2$=0.096, which is an input power in InP. 0.096 is smaller than the range of 0.1-0.2 of the present invention. This does not mean that the above set is inappropriate. On the contrary, small minimum transmittance means facile fabrication. Slight deviation of thicknesses from the above values raises transmittance value into the 0.1-0.2 range. Thicknesses of the $Al_2O_3/Si/Al_2O_3/SiON$ set have a wide margin up to 0.2.

G=0.357, H=2.069 and T=0.173. Deviation allowances 0.5 (0.177−T)/(G−T)=0.011 and 0.5(0.250−T)/(G−T)=0.209. Allowable ranges of thicknesses are 0.792-0.989 times and 1.011-1.209 times of λ/4 layers or λ/2 layers. Thicknesses for the minimum, allowable ranges of component layers are,

| | Minimizing values | 0.791-0.989 | 1.011-1.209 |
|---|---|---|---|
| $Al_2O_3$ | 0.270 λ | 0.214 λ-0.267 λ | 0.273 λ-0.326 λ |
| Si | 0.070 λ | 0.050 λ-0.069 λ | 0.071 λ-0.085 λ |
| $Al_2O_3$ | 0.135 λ | 0.107 λ-0.134 λ | 0.136 λ-0.163 λ |
| SiON | 0.256 λ | 0.202 λ-0.253 λ | 0.259 λ-0.310 λ |

EXAMPLE 2

Four Layers ($Al_2O_3/TiO_2/Al_2O_3$/SiON/InP-Sub/Win)S-Wave; FIG. 22

0th=air, 1st=$Al_2O_3$, 2nd=$TiO_2$, 3rd=$Al_2O_3$, 4th=SiON, 5th=InP(substrate/window).

$n_0<n_1<n_2>n_3<n_4<n_5$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th SiON layer should have a 0.01 λ-0.05 λ or λ/2 thickness.

From top to bottom (for minimum transmittance),
  $Al_2O_3$ thickness=0.01-0.05 λ or 0.270 λ
  $TiO_2$ thickness=0.103 λ
  $Al_2O_3$ thickness=0.135 λ
  SiON thickness=0.01-0.05 λ or 0.256 λ

When λ=1550 nm (Table 2),
  $Al_2O_3$ thickness=16 nm-78 nm or 418 nm
  $TiO_2$ thickness=159 nm
  $Al_2O_3$ thickness=209 nm
  SiON thickness=16 nm-78 nm or 396 nm When λ=1300 nm,
  $Al_2O_3$ thickness=13 nm-65 nm or 351 nm
  $TiO_2$ thickness=133 nm
  $Al_2O_3$ thickness=175 nm
  SiON thickness=13 nm-65 nm or 332 nm

| | | | | |
|---|---|---|---|---|
| S-wave | $K_1 = 0.634$, | $J_1 = -0.366$ | | |
| | $K_2 = 0.815$, | $J_2 = -0.185$, | $Q_2 = 1.185$, | $K_2Q_2 = 0.966$ |
| | $K_3 = 1.185$, | $J_3 = +0.185$, | $Q_3 = 0.815$, | $K_3Q_3 = 0.966$ |
| | $K_4 = 0.958$, | $J_4 = -0.042$, | $Q_4 = 1.042$, | $K_4Q_4 = 0.998$ |
| | $K_5 = 0.691$, | $J_5 = -0.309$ | | |

$K_1K_2K_3K_4K_5 = 0.405$
$J_1J_2 = 0.0677, J_2J_3 = -0.0342, J_3J_4 = -0.0078, J_4J_5 = 0.0129, J_1K_2Q_2J_3 = -0.0653, J_2K_3Q_3J_4 = 0.0075, J_3K_4Q_4J_5 = -0.0570, J_1K_2Q_2K_3Q_3J_4 = 0.0144, J_2K_3Q_3K_4Q_4J_5 = 0.0551, J_1K_2Q_2K_3Q_3K_4Q_4J_5 = 0.1052$

Eq.(46) gives,

Minimum Transmittance=0.405/1.0677×1.0342×
1.0078×1.0129×1.065×1.0075×1.0570×1.0144×
1.0551×1.1052=0.405/1.512=0.268

3.2×0.268×0.268=0.230

Squaring 0.268 and multiplying by 3.2 produces U=3.2× $0.268^2$=0.230, which is an input power in InP. 0.230 is out of the range of 0.1-0.2 determined by the present invention. Example 2 ($Al_2O_3/TiO_2/Al_2O_3$/SiON) is incompetent. Example 2 is inappropriate for and out of the present invention.

EXAMPLE 3

Five Layers ($Al_2O_3/TiO_2/Al_2O_3/TiO_2$/SiON/InP-Sub/Win) S-Wave; FIG. 23

0th=air, 1st =$Al_2O_3$, 2nd=$TiO_2$, 3rd=$Al_2O_3$, 4th=$TiO_2$, 5th=SiON, 6th=InP(substrate/window).

$n_0<n_1<n_2>n_3<n_4>n_5<n_6$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th $TiO_2$ layer should have a λ/4 thickness. The 5th SiON layer should have a λ/4 thickness.

From top to bottom (for minimum transmittance),
  $Al_2O_3$ thickness=0.01-0.05 λ or 0.270 λ
  $TiO_2$ thickness=0.103 λ
  $Al_2O_3$ thickness=0.135 λ
  $TiO_2$ thickness=0.103 λ
  SiON thickness=0.128 λ

When λ=1550 nm (Table 2),
  $Al_2O_3$ thickness=16 nm-78 nm or 418 nm
  $TiO_2$ thickness=159 nm
  $Al_2O_3$ thickness=209 nm
  $TiO_2$ thickness=159 nm
  SiON thickness=198 nm When λ=1300 nm (Table 2),
  $Al_2O_3$ thickness=13 nm-65 nm or 351 nm
  $TiO_2$ thickness=133 nm
  $Al_2O_3$ thickness=175 nm
  $TiO_2$ thickness=133 nm
  SiON thickness=166 nm

| | | | | |
|---|---|---|---|---|
| S-wave | $K_1 = 0.634$ | $J_1 = -0.366$ | | |
| | $K_2 = 0.815$, | $J_2 = -0.185$, | $Q_2 = 1.185$, | $K_2Q_2 = 0.966$ |
| | $K_3 = 1.185$, | $J_3 = +0.185$, | $Q_3 = 0.815$, | $K_3Q_3 = 0.966$ |
| | $K_4 = 0.815$, | $J_4 = -0.185$, | $Q_4 = 1.185$, | $K_4Q_4 = 0.966$ |
| | $K_5 = 1.144$, | $J_5 = +0.144$, | $Q_5 = 0.856$, | $K_5Q_5 = 0.979$ |
| | $K_6 = 0.691$, | $J_6 = -0.309$ | | |

$K_1K_2K_3K_4K_5K_6 = 0.394$
$J_1J_2 = 0.0677$, $J_2J_3 = -0.0342$, $J_3J_4 = -0.0342$, $J_4J_5 = -0.0266$, $J_5J_6 = -0.0444$, $J_1K_2Q_2J_3 = -0.0654$, $J_2K_3Q_3J_4 = 0.0331$, $J_3K_4Q_4J_5 = +0.0257$, $J_4K_5Q_5J_6 = +0.0559$, $J_1K_2Q_2K_3Q_3J_4 = 0.0631$, $J_2K_3Q_3K_4Q_4J_5 = -0.0248$, $J_3K_4Q_4K_5Q_5J_6 = -0.0541$, $J_1K_2Q_2K_3Q_3K_4Q_4J_5 = -0.0475$, $J_2K_3Q_3K_4Q_4K_5Q_5J_6 = 0.0521$, $J_1K_2Q_2K_3Q_3K_4Q_4K_5Q_5J_6 = 0.0997$

Eq.(46) gives,

Minimum Transmittance=0.394/1.0677×1.0342×
1.0342×1.0266×1.0444×1.0654×1.0331×1.0257×
1.0559×1.0631×1.0248×1.0541×1.0475×1.0521×
1.0997=0.394/2.031=0.194

3.2×0.194×0.194=0.120

The power of light arriving at InP is 0.120. 0.120 is included within the 0.1-0.2 range. The above set $Al_2O_3/TiO_2/Al_2O_3/TiO_2/SiON/InP$ is suitable. Example 3 belongs to the teaching of the present invention. Thicknesses still have a margin up to 0.2.

EXAMPLE 4

Six Layers ($Al_2O_3/Si/Al_2O_3/Si/Al_2O_3/SiON/InP$-Sub/Win) S-Wave; FIG. 24

0th=air, 1st=$Al_2O_3$, 2nd=Si, 3rd=$Al_2O_3$, 4th=Si, 5th=$Al_2O_3$, 6th=SiON, 7th=InP(substrate/window).

$n_0<n_1<n_2>n_3<n_4>n_5<n_6<n_7$. For minimizing transmittance, the 1st $Al_2O_3$ layer should have a 0.01 λ-0.05 λ or λ/2 thickness (λ cos θ/2n). The 2nd Si layer should have a λ/4 thickness (λ cos θ/4n). The 3rd $Al_2O_3$ layer should have a λ/4 thickness. The 4th Si layer should have a λ/4 thickness (λ cos θ/4n). The 5th $Al_2O_3$ layer should have a λ/4 thickness. The 6th SiON layer should have a λ/2 thickness.

From top to bottom (for minimum transmittance),
$Al_2O_3$ thickness=0.01-0.05 λ or 0.270 λ
Si thickness=0.070 λ
$Al_2O_3$ thickness=0.135 λ
Si thickness=0.070 λ
$Al_2O_3$ thickness=0.135 λ
SiON thickness=0.256 λ

When λ=1550 nm (Table 2),
$Al_2O_3$ thickness=16 nm-78 nm or 418 nm
Si thickness=108 nm
$Al_2O_3$ thickness=209 nm
Si thickness=108 nm
$Al_2O_3$ thickness=209 nm
SiON thickness=396 nm When λ=1300 nm (Table 2),
$Al_2O_3$ thickness=13 nm-65 nm or 351 nm
Si thickness=91 nm
$Al_2O_3$ thickness=175 nm
Si thickness=91 nm
$Al_2O_3$ thickness=175 nm
SiON thickness=332 nm

| | | | | |
|---|---|---|---|---|
| S-wave | $K_1 = 0.634$, | $J_1 = -0.366$ | | |
| | $K_2 = 0.613$, | $J_2 = -0.387$, | $Q_2 = 1.387$, | $K_2Q_2 = 0.850$ |
| | $K_3 = 1.387$, | $J_3 = +0.387$, | $Q_3 = 0.613$, | $K_3Q_3 = 0.850$ |
| | $K_4 = 0.613$, | $J_4 = -0.387$, | $Q_4 = 1.387$, | $K_4Q_4 = 0.850$ |
| | $K_5 = 1.387$, | $J_5 = +0.387$, | $Q_5 = 0.613$, | $K_5Q_5 = 0.850$ |
| | $K_6 = 0.958$, | $J_6 = -0.042$, | $Q_6 = 1.042$, | $K_6Q_6 = 0.998$ |
| | $K_7 = 0.691$, | $J_7 = -0.309$ | | |

$K_1K_2K_3K_4K_5K_6K_7 = 0.303$

Eq.(38) gives six layer transmission for arbitrary thicknesses. Eq.(46) gives the minimum of transmittance.

Minimum Transmittance=0.303/1.142×1.150×1.150×
1.150×1.016×1.013×1.120×1.127×1.127×1.014×
1.119×1.102×1.108×1.012×1.101×1.087×1.010×
1.086×1.008×1.073×1.059=G/H=0.303/
5.361=0.057

$U$=3.2×0.057×0.057=0.010

The power U of light arriving at InP is 0.010. 0.010 is not included within the 0.1-0.2 range. Although the minimum transmittance is smaller than the determined range 0.1-0.2. Some deviations of thicknesses raise the transmittance up within 0.1-0.2, which is advocated by the present invention. The above set $Al_2O_3/Si/Al_2O_3/Si/Al_2O_3/SiON/InP$ is suitable. Example 4 belongs to the present invention. Thicknesses should deviate from the minimizing values. G=0.303, H=5.361 and T=0.057. Allowable ranges are 0.608-0.756 times and 1.244-1.392 times as thick as the minimizing values.

| | minimizing thickness | 0.608-0.756 | 1.244-1.392 |
|---|---|---|---|
| $Al_2O_3$ | 0.270 λ | 0.164-0.204 λ | 0.336-0.376 λ |
| Si | 0.070 λ | 0.043-0.053 λ | 0.087-0.097 λ |
| $Al_2O_3$ | 0.135 λ | 0.082-0.102 λ | 0.168-0.188 λ |
| Si | 0.070 λ | 0.043-0.053 λ | 0.087-0.097 λ |
| $Al_2O_3$ | 0.135 λ | 0.082-0.102 λ | 0.168-0.188 λ |
| SiON | 0.256 λ | 0.156-0.194 λ | 0.318-0.356 λ |

EXAMPLE 5

Six Layers ($Al_2O_3/TiO_2/Al_2O_3/TiO_2/Al_2O_3/SiON/$InP-Sub/Win) S-Wave; FIG. 25

0th=air, 1st=$Al_2O_3$, 2nd=$TiO_2$, 3rd=$Al_2O_3$, 4th=$TiO_2$, 5th=$Al_2O_3$, 6th=SiON, 7th=InP(substrate/window).

$n_0<n_1<n_2>n_3<n_4>n_5<n_6<n_7$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th $TiO_2$ layer should have a λ/4 thickness (λ cos θ/4n). The 5th $Al_2O_3$ layer should have a λ/4 thickness. The 6th SiON layer should have a λ/2 thickness.

From top to bottom (for minimum transmittance),
$Al_2O_3$ thickness=0.01-0.05 λ or 0.270 λ
$TiO_2$ thickness=0.103 λ
$Al_2O_3$ thickness=0.135 λ
$TiO_2$ thickness=0.103 λ
$Al_2O_3$ thickness=0.135 λ
SiON thickness=0.256 λ

When λ=1550 nm (Table 2),
  $Al_2O_3$ thickness=16 nm-78 nm or 418 nm
  $TiO_2$ thickness=159 nm
  $Al_2O_3$ thickness=209 nm
  $TiO_2$ thickness=159 nm
  $Al_2O_3$ thickness=209 nm
  SiON thickness=396 nm When λ=1300 nm (Table 2),
  $Al_2O_3$ thickness=13 nm-65 nm or 351 nm
  $TiO_2$ thickness=133 nm
  $Al_2O_3$ thickness=175 nm
  $TiO_2$ thickness=133 nm
  $Al_2O_3$ thickness=175 nm
  SiON thickness=332 nm

| S-wave | $K_1$ = 0.634, | $J_1$ = −0.366 | | |
|---|---|---|---|---|
| | $K_2$ = 0.815, | $J_2$ = −0.185, | $Q_2$ = 1.185, | $K_2Q_2$ = 0.966 |
| | $K_3$ = 1.185, | $J_3$ = +0.185, | $Q_3$ = 0.815, | $K_3Q_3$ = 0.966 |
| | $K_4$ = 0.815, | $J_4$ = −0.185, | $Q_4$ = 1.185, | $K_4Q_4$ = 0.966 |
| | $K_5$ = 1.185, | $J_5$ = +0.185, | $Q_5$ = 0.815, | $K_5Q_5$ = 0.966 |
| | $K_6$ = 0.958, | $J_6$ = −0.042, | $Q_6$ = 1.042, | $K_6Q_6$ = 0.998 |
| | $K_7$ = 0.691, | $J_7$ = −0.309 | | |

$K_1K_2K_3K_4K_5K_6K_7 = 0.391$

Eq.(38) gives six layer transmission for arbitrary thicknesses. Eq.(46) gives the minimum of transmittance.

Minimum Transmittance=0.391/1.068×1.034×1.034×
1.034×1.008×1.013×1.065×1.033×1.033×1.007×
1.057×1.063×1.032×1.007×1.055×1.061×1.007×
1.053×1.013×1.051×1.098=$G/H$=0.391/
2.235=0.175

$U$=3.2×0.175×0.175=0.098

The power U of light arriving at InP is 0.010. 0.010 is not included within the 0.1-0.2 range. Although the minimum tranmittance is smaller than the determined range 0.1-0.2. Some deviations of thicknesses raise the transmittance up within 0.1-0.2, which is advocated by the present invention. The above set $Al_2O_3/TiO_2/Al_2O_3/TiO_2/Al_2O_3$/SiON/InP is suitable. Example 5 belongs to the present invention. Thicknesses should deviate from the minimizing values. G=0.391, H=2.235 and T=0.175. Allowable ranges are 0.799-0.952 times and 1.005-1.174 times as thick as the minimizing values.

| | minimizing thickness | 0.826-0.995 | 1.005-1.174 λ |
|---|---|---|---|
| $Al_2O_3$ | 0.270 λ | 0.223-0.269 λ | 0.271-0.317 λ |
| $TiO_2$ | 0.103 λ | 0.085-0.103 λ | 0.104-0.121 λ |
| $Al_2O_3$ | 0.135 λ | 0.112-0.134 λ | 0.136-0.158 λ |
| $TiO_2$ | 0.103 λ | 0.085-0.102 λ | 0.104-0.121 λ |
| $Al_2O_3$ | 0.135 λ | 0.112-0.134 λ | 0.136-0.158 λ |
| SiON | 0.256 λ | 0.211-0.255 λ | 0.257-0.301 λ |

EXAMPLE 6

Four Layer Case (S-Wave: $TiO_2/Al_2O_3/TiO_2$/SiON/
InP Undersubstrate: FIG. 26)

The series of films have been $Al_2O_3/TiO_2$ hitherto. A reverse series of films $TiO_2/Al_2O_3$ is tried. Thicknesses of minimizing the four-layer-transparency are ¼ wavelength for all $TiO_2$, $Al_2O_3$ and SiON films.

From top to bottom (for minimum transmittance),
  $TiO_2$ thickness=0.103 λ
  $Al_2O_3$ thickness=0.135 λ
  $TiO_2$ thickness=0.103 λ
  SiON thickness=0.128 λ

When λ=1550 nm (Table 2),
  $TiO_2$ thickness=159 nm
  $Al_2O_3$ thickness=209 nm
  $TiO_2$ thickness=159 nm
  SiON thickness=198 nm When λ=1300 nm (Table 2),
  $TiO_2$ thickness=133 nm
  $Al_2O_3$ thickness=175 nm
  $TiO_2$ thickness=133 nm
  SiON thickness=166 nm

| S-wave | $K_1$ = 0.484, | $J_1$ = −0.516 | | |
|---|---|---|---|---|
| | $K_2$ = 1.185, | $J_2$ = +0.185, | $Q_2$ = 0.815, | $K_2Q_2$ = 0.966 |
| | $K_3$ = 0.815, | $J_3$ = −0.185, | $Q_3$ = 1.185, | $K_3Q_3$ = 0.966 |
| | $K_4$ = 1.144, | $J_4$ = +0.144, | $Q_4$ = 0.856, | $K_4Q_4$ = 0.979 |
| | $K_5$ = 0.691, | $J_5$ = −0.309 | | |

$K_1K_2K_3K_4K_5 = 0.370$
$J_1J_2 = -0.0955, J_2J_3 = -0.0342, J_3J_4 = -0.0266, J_4J_5 = -0.0445, J_1K_2Q_2J_3 = +0.0922, J_2K_3Q_3J_4 = 0.0257, J_3K_3Q_3J_5 = 0.0552, J_1K_2Q_2K_3Q_3J_4 = -0.0693, J_2K_3Q_3K_4Q_4J_5 = -0.0541, J_1K_2Q_2K_3Q_3K_4Q_4J_5 = +0.1457$

Eq.(38) gives four layer transmission for arbitrary thicknesses. Eq.(46) gives the minimum of transmittance.

Minimum transmittance=0.370/1.0955×1.0342×
1.0266×1.0445×1.0922×1.0257×1.0552×1.0693×
1.0541×1.1457=$G/H$=0.370/1.855=0.199

$U$=3.2×0.199²=0.127

The power of light which attains the InP substrate is 0.127. The value is in the range of 0.1-0.2 required by the present invention. A small change of film thicknesses increases the passing light power. This set of $TiO_2/Al_2O_3/TiO_2$/SiON/InP is a good film suitable for the present invention.

All the above relates to S-waves. S-waves have advantages of small refractive indices, large reflection coefficients, and easy fabrication of larger reflection films. Semiconductor lasers emit linearly polarized beams in many cases. Sometimes an S-wave enters an object photodiode. Other times a P-wave goes into a photodiode. A twisting angle between a laser diode and a photodiode determines a ratio of an S-wave and a P-wave in incident light to the photodiode. The present invention requires consideration upon P-waves. The prior reference ② Japanese Patent Laying Open No. 8-116127 does not discern S-waves and P-waves. However there is a large difference of passing power between P-wave and S-wave. P-waves are inferior to S-waves in making high reflection films. P-wave has large refractive coefficients K and small reflection coefficients. P-wave changes phase by 180 degrees when light goes from a higher refractive index medium to a lower refractive index medium unlike S-wave. Examples of P-wave will be described.

EXAMPLE 7

Four Layers ($Al_2O_3$/Si/$Al_2O_3$/SiON/InP-Sub/Win)
P-Wave; FIG. 27

0th=air, 1st=$Al_2O_3$, 2nd=Si, 3rd=$Al_2O_3$, 4th=SiON, 5th=InP (substrate/window).

$n_0<n_1<n_2>n_3<n_4<n_5$. For minimizing transmittance, the 1st $Al_2O_3$ layer should have a 0.01 λ-0.05 λ or λ/2 thickness (λ cos θ/2n). The 2nd Si layer should have a λ/4 thickness (λ cos θ/4n). The 3rd $Al_2O_3$ layer should have a λ/4 thickness. The 4th SiON layer should have a λ/2 thickness.

| | | | | |
|---|---|---|---|---|
| $Al_2O_3$ | 0.01-0.05 λ or 0.270 λ | | | |
| Si | 0.070 λ | | | |
| $Al_2O_3$ | 0.135 λ | | | |
| SiON | 0.256 λ | | | |
| P-wave | $L_1 = 0.675$, | $M_1 = +0.134$ | | |
| | $L_2 = 0.630$, | $M_2 = +0.319$, | $R_2 = 1.425$, | $L_2R_2 = 0.898$ |
| | $L_3 = 1.425$, | $M_3 = -0.319$, | $R_3 = 0.630$, | $L_3R_3 = 0.898$ |
| | $L_4 = 0.958$, | $M_4 = +0.028$, | $R_4 = 1.043$, | $L_4R_4 = 0.999$ |
| | $L_5 = 0.703$, | $M_5 = +0.254$ | | |

$L_1L_2L_3L_4L_5 = 0.408$
$M_1M_2 = +0.0427$, $M_2M_3 = -0.1017$, $M_3M_4 = -0.0089$, $M_4M_5 = -0.0071$,
$M_1L_2R_2M_3 = -0.0383$, $M_2L_3R_3M_4 = 0.0079$, $M_3L_3R_3M_5 = -0.0809$,
$M_1L_2R_2L_3R_3M_4 = +0.0030$, $M_2L_3R_3L_4R_4M_5 = +0.0726$,
$M_1L_2R_2L_3R_3L_4R_4M_5 = +0.0274$

Minimum transmittance=0.408/1.0427×1.1017×
1.0089×1.0071×1.0383×1.0079×1.0809×1.0030×
1.0726×1.0274=$G/H$=0.408/1.459=0.279

$U=3.2\times 0.279^2 = 0.250$ 0.250 exceeds 0.2. Thus the set $Al_2O_3$/Si/$Al_2O_3$/SiON is unfit for P-wave. The film of $Al_2O_3$/Si/$Al_2O_3$/SiON is inappropriate to the present invention.

EXAMPLE 8

Four Layers ($Al_2O_3$/$TiO_2$/$Al_2O_3$/SiON/InP-Sub/Win) P-Wave; FIG. 28

0th=air, 1st=$Al_2O_3$, 2nd=$TiO_2$, 3rd=$Al_2O_3$, 4th=SiON, 5th=InP(substrate/window).

$n_0<n_1<n_2>n_3<n_4<n_5$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th SiON layer should have a λ/2 thickness.

| | | | | |
|---|---|---|---|---|
| $Al_2O_3$ | 0.01-0.05 λ or 0.270 λ | | | |
| $TiO_2$ | 0.103 λ | | | |
| $Al_2O_3$ | 0.135 λ | | | |
| SiON | 0.256 λ | | | |
| P-wave | $L_1 = 0.675$, | $M_1 = +0.134$ | | |
| | $L_2 = 0.821$, | $M_2 = +0.137$ | $R_2 = 1.195$, | $L_2R_2 = 0.981$ |
| | $L_3 = 1.195$, | $M_3 = -0.137$, | $R_3 = 0.821$, | $L_3R_3 = 0.981$ |
| | $L_4 = 0.958$, | $M_4 = +0.028$, | $R_4 = 1.043$, | $L_4R_4 = 0.999$ |
| | $L_5 = 0.703$, | $M_5 = +0.254$ | | |

$L_1L_2L_3L_4L_5 = 0.446$

Minimum transmittance=0.446/1.018×1.019×1.004×
1.007×1.018×1.004×1.035×1.004×1.034×
1.033=$G/H$=0.446/1.189=0.375

$U=3.2\times 0.375^2 = 0.450$ 0.450 exceeds 0.2. Thus the set $Al_2O_3$/$TiO_2$/$Al_2O_3$/SiON is unfit for P-wave. The film of $Al_2O_3$/Si/$Al_2O_3$/SiON is inappropriate to the present invention.

EXAMPLE 9

Five Layers ($Al_2O_3$/$TiO_2$/$Al_2O_3$/$TiO_2$/SiON/InP-Sub/Win) P-Wave; FIG. 29

0th=air, 1st=$Al_2O_3$, 2nd=$TiO_2$, 3rd=$Al_2O_3$, 4th=$TiO_2$, 5th=SiON, 6th=InP(substrate/window).

$n_0<n_1<n_2>n_3<n_4>n_5<n_6$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th $TiO_2$ layer should have a λ/4 thickness. The 5th SiON layer should have a λ/4 thickness.

| | | | | |
|---|---|---|---|---|
| $Al_2O_3$ | 0.01-0.05 λ or 0.270 λ | | | |
| $TiO_2$ | 0.103 λ | | | |
| $Al_2O_3$ | 0.135 λ | | | |
| SiON | 0.128 λ | | | |
| P-wave | $L_1 = 0.675$, | $M_1 = +0.134$ | | |
| | $L_2 = 0.821$, | $M_2 = +0.137$, | $R_2 = 1.195$, | $L_2R_2 = 0.981$ |
| | $L_3 = 1.195$, | $M_3 = -0.137$, | $R_3 = 0.821$, | $L_3R_3 = 0.981$ |
| | $L_4 = 0.821$, | $M_4 = +0.137$, | $R_4 = 1.195$, | $L_4R_4 = 0.981$ |
| | $L_5 = 1.149$, | $M_5 = -0.110$, | $R_5 = 0.860$, | $L_5R_5 = 0.988$ |
| | $L_6 = 0.703$, | $M_6 = +0.254$, | | |

$L_1L_2L_3L_4L_5L_6 = 0.439$

Minimum transmittance=0.439/1.018×1.019×1.019×
1.015×1.028×1.018×1.018×1.015×1.034×1.018×
1.015×1.034×1.014×1.033×1.032=$G/H$=0.439/
1.385=0.317

$U=3.2\times 0.317^2 = 0.322$ 0.322 exceeds 0.2. Thus the set $Al_2O_3$/$TiO_2$/$Al_2O_3$/$TiO_2$/SiON is unfit for P-wave. The film of $Al_2O_3$/Si/$Al_2O_3$/$TiO_2$/SiON for P-wave is inappropriate to the present invention.

EXAMPLE 10

Six Layers ($Al_2O_3$/Si/$Al_2O_3$/Si/$Al_2O_3$/SiON/InP-Sub/Win) P-Wave; FIG. 30

0th=air, 1st=$Al_2O_3$, 2nd=Si, 3rd=$Al_2O_3$, 4th=Si, 5th=$Al_2O_3$, 6th=SiON, 7th=InP(substrate/window).

$n_0<n_1<n_2>n_3<n_4>n_5<n_6<n_7$. For minimizing transmittance, the 1st $Al_2O_3$ layer should have a 0.01 λ-0.05 λ or λ/2 thickness (λ cos θ/2n). The 2nd Si layer should have a λ/4 thickness. The 3rd $Al_2O_3$ layer should have a λ/4 thickness. The 4th Si layer should have a λ/4 thickness. The 5th $Al_2O_3$ layer should have a λ/4 thickness. The 6th SiON layer should have a λ/2 thickness.

| | |
|---|---|
| $Al_2O_3$ | 0.01-0.05 λ or 0.270 λ |
| Si | 0.070 λ |
| $Al_2O_3$ | 0.135 λ |
| Si | 0.070 λ |
| $Al_2O_3$ | 0.135 λ |
| SiON | 0.256 λ |

-continued

| | | | | |
|---|---|---|---|---|
| P-wave | $L_1 = 0.675$, | $M_1 = +0.134$ | | |
| | $L_2 = 0.630$, | $M_2 = +0.319$, | $R_2 = 1.425$, | $L_2R_2 = 0.898$ |
| | $L_3 = 1.425$, | $M_3 = -0.319$, | $R_3 = 0.630$, | $L_3R_3 = 0.898$ |
| | $L_4 = 0.630$, | $M_4 = +0.319$, | $R_4 = 1.425$, | $L_4R_4 = 0.898$ |
| | $L_5 = 1.425$, | $M_5 = -0.319$, | $R_5 = 0.630$, | $L_5R_5 = 0.898$ |
| | $L_6 = 0.958$, | $M_6 = +0.028$, | $R_6 = 1.043$, | $L_6R_6 = 0.999$ |
| | $L_7 = 0.703$, | $M_7 = +0.254$ | | |

$L_1L_2L_3L_4L_5L_6L_7 = 0.366$

Minimum transmittance=0.366/1.043×1.102×1.102×
1.102×1.009×1.007×1.038×1.091×1.091×1.008×
1.081×1.034×1.082×1.007×1.073×1.031×1.006×
1.065×1.002×1.059×1.022=$G/H$=0.366/
2.772=0.132

$U$=3.2×0.132²=0.056

0.056 is smaller than 0.1. Small changes of thicknesses raises the transmittance up within 0.1-0.2 determined by the present invention.

G=0.366, H=2.765, T=0.132. Allowable ranges of deviations from the minimizing thicknesses are 0.748-0.904 times and 1.096-1.252 times as thick as the minimizing thicknesses.

| | minimizing thickness | 0.826-0.995 | 1.005-1.174 λ |
|---|---|---|---|
| $Al_2O_3$ | 0.270 λ | 0.202-0.244 λ | 0.296-0.338 λ |
| Si | 0.070 λ | 0.052-0.063 λ | 0.077-0.088 λ |
| $Al_2O_3$ | 0.135 λ | 0.101-0.122 λ | 0.148-0.169 λ |
| Si | 0.0070 | 0.052-0.063 λ | 0.077-0.088 λ |
| $Al_2O_3$ | 0.135 λ | 0.101-0.122 λ | 0.148-0.169 λ |
| SiON | 0.256 λ | 0.191-0.231 λ | 0.281-0.321 λ |

Thus the set $Al_2O_3/Si/Al_2O_3/Si/Al_2O_3/SiON$ is fit for P-wave. The film of $Al_2O_3/Si/Al_2O_3/Si/Al_2O_3/SiON$ is appropriate to the present invention.

EXAMPLE 11

Six Layers ($Al_2O_3/TiO_2/Al_2O_3/TiO_2/Al_2O_3/SiON/$InP-Sub/Win) P-Wave; FIG. 31

0th=air, 1st=$Al_2O_3$, 2nd=$TiO_2$, 3rd=$Al_2O_3$, 4th=$TiO_2$, 5th=$Al_2O_3$, 6th=SiON, 7th=InP(substrate/window).

$n_0<n_1<n_2<n_3<n_4>n_5<n_6<n_7$. For minimizing transmittance, the 1st $Al_2O_3$ layer should have a 0.01 λ-0.05 λ or λ/2 thickness (λ cos θ/2n). The 2nd $TiO_2$ layer should have a λ/4 thickness (λ cos θ/4n). The 3rd $Al_2O_3$ layer should have a λ/4 thickness. The 4th $TiO_2$ layer should have a λ/4 thickness (λ cos θ/4n). The 5th $Al_2O_3$ layer should have a λ/4 thickness. The 6th SiON layer should have a λ/2 thickness.

| | |
|---|---|
| $Al_2O_3$ | 0.01-0.05 λ or 0.270 λ |
| $TiO_2$ | 0.103 λ |
| $Al_2O_3$ | 0.135 λ |
| $TiO_2$ | 0.103 λ |
| $Al_2O_3$ | 0.135 λ |
| SiON | 0.256 λ |

| | | | | |
|---|---|---|---|---|
| P-wave | $L_1 = 0.675$, | $M_1 = +0.134$ | | |
| | $L_2 = 0.821$, | $M_2 = +0.137$, | $R_2 = 1.195$, | $L_2R_2 = 0.981$ |
| | $L_3 = 1.195$, | $M_3 = -0.137$, | $R_3 = 0.821$, | $L_3R_3 = 0.981$ |
| | $L_4 = 0.821$, | $M_4 = +0.137$, | $R_4 = 1.195$, | $L_4R_4 = 0.981$ |
| | $L_5 = 1.195$, | $M_5 = -0.137$, | $R_5 = 0.821$, | $L_5R_5 = 0.981$ |
| | $L_6 = 0.958$, | $M_6 = +0.028$, | $R_6 = 1.043$, | $L_6R_6 = 0.999$ |
| | $L_7 = 0.703$, | $M_7 = +0.254$ | | |

$L_1L_2L_3L_4L_5L_6L_7 = 0.438$

Minimum transmittance=0.438/1.018×1.019×1.019×
1.019×1.004×1.007×1.018×1.018×1.018×1.004×
1.035×1.018×1.018×1.004×1.034×1.017×1.004×
1.033×1.003×1.033×1.032=$G/H$=0.438/
1.450=0.302

$U$=3.2×0.302²=0.291

0.291 exceeds 0.2. Thus the set $Al_2O_3/TiO_2/Al_2O_3/TiO_2/Al_2O_3/SiON$ is unfit for P-wave. The film of $Al_2O_3/TiO2/Al_2O_3/TiO_2/Al_2O_3/SiON$ is inappropriate to the present invention.

EXAMPLE 12

Four Layer Case (P-Wave: $TiO_2/Al_2O_3/TiO_2/SiON/$InP Undersubstrate: FIG. 32)

Thickness of minimizing the four-layer-transparency is ¼ wavelength for all $TiO_2$, $Al_2O_3$ and SiON films. This relation is similar to S-wave.

From top to bottom (for minimum transmittance),
$TiO_2$ thickness=0.103 λ
$Al_2O_3$ thickness=0.135 λ
$TiO_2$ thickness=0.103 λ
SiON thickness=0.128 λ

| | | | | |
|---|---|---|---|---|
| P-wave | $L_1 = 0.545$, | $M_1 = +0.266$ | | |
| | $L_2 = 1.195$, | $M_2 = -0.137$, | $R_2 = 0.821$, | $L_2R_2 = 0.981$ |
| | $L_3 = 0.821$, | $M_3 = +0.137$, | $R_3 = 1.195$, | $L_3R_3 = 0.981$ |
| | $L_4 = 1.149$, | $M_4 = -0.110$, | $R_4 = 0.860$, | $L_4R_4 = 0.988$ |
| | $L_5 = 0.703$, | $M_5 = +0.254$ | | |

$L_1L_2L_3L_4L_5 = 0.432$
$M_1M_2 = -0.036$, $M_2M_3 = -0.019$, $M_3M_4 = -0.015$, $M_4M_5 = -0.028$,
$M_1L_2R_3M_4 = +0.036$, $M_2L_3R_3M_4 = 0.015$, $M_3L_3R_3M_5 = 0.034$,
$M_1L_2R_2L_3R_3M_4 = -0.028$, $M_2L_3R_3L_4R_4M_5 = -0.034$, $M_1L_2R_2L_3R_3L_4R_4M_5 = +0.064$

Minimum transmittance=0.432/1.036×1.019×1.015×
1.028×1.036×1.015×1.034×1.028×1.034×
1.064=$G/H$=0.432/1.355=0.319

$U$=3.2×0.319²=0.326

The power of light which attains the InP substrate is 0.326. The value exceeds the range of 0.1-0.2 required by the present invention. Example 12 ($TiO_2/Al_2O_3/TiO_2/SiON/$InP film) of P-wave is inappropriate.

Table 3 demonstrates example numbers, layered structures, numerators G, denominators H, transmittances T, power U, fit(○) or unfit(×), (G−T), 0.5(0.177−T)/(G−T), 0.5 (0.250−T)/(G−T).

BRIEF DESCRIPTION OF THE DRAWINGS

FIG. 1 is a sectional view of an epitaxial wafer having an n+-InP substrate, an n-InP buffer layer, an n⁻-InGaAs light receiving layer and an n-InP window layer epitaxially piled in series on the n⁺-InP substrate by a chip unit.

FIG. 2 is a sectional view of an epitaxial wafer diffused via an opening of an SiN mask with Zn till the InGaAs light receiving layer for making a p-region expanding via the InP window layer to the InGaAs light receiving layer.

FIG. 3 is a section of a wafer-processing device unit having a SiON film covering the p-region and SiN mask.

BRIEF DESCRIPTION OF PREFERRED EMBODIMENTS

Embodiment 1

$Al_2O_3/Si/Al_2O_3/Si/Al_2O_3/SiON/InP$; FIGS. 1-6

Figure 4:
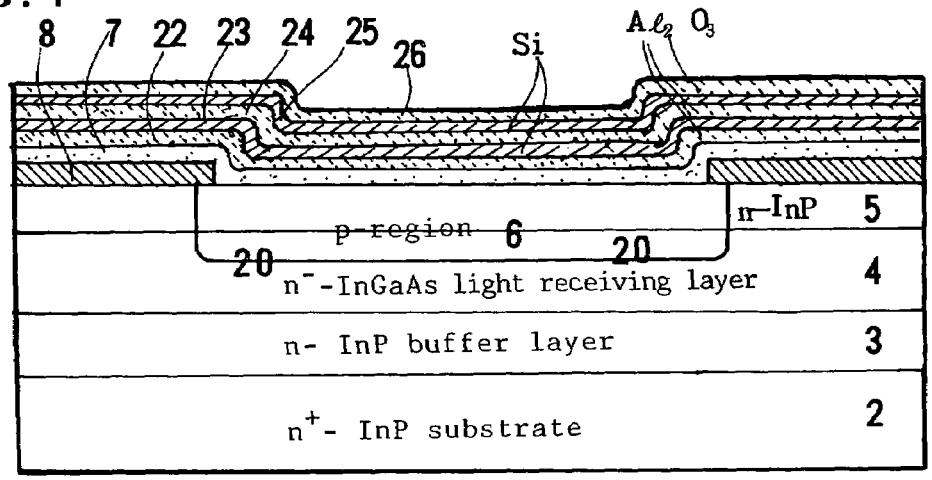
FIG. 4 is a section of a wafer-processing device unit further having a pile of $Al_2O_3/Si/Al_2O_3/Si/Al_2O_3$ films on the SiON film.

A photodiode of Embodiment 1 of the present invention has a superficial high reflection film composed of $Al_2O_3/Si$ reciprocal layers having a 80-90% reflection coefficient for an LD slanting beam. The high reflective film reflects a major portion of 45 degree inclining incidence forward LD light, absorbs a minor portion and enables the photodiode to monitor the LD forward light power and to control the laser power precisely.

FIG. 1 exhibits a schematic section of an InP epitaxial wafer of a single unit. The same units repeat lengthwise and crosswise on the epitaxial wafer. An n-InP buffer layer 3, an $n^-$-InGaAs light receiving layer 4, and an n-InP window layer 5 are epitaxially grown on an $n^+$-InP substrate 2. The window layer 5 is not indispensable. Sometimes an InGaAs layer is a top layer without window layer. In reality, the InP substrate is thick (200 μm to 400 μm) and the epitaxial layers are thin (1 μm to 3 μm). Epitaxial layers are exaggerated for clearly showing the structure of the epitaxial layers.

The epitaxial layers are covered with an SiN film 8. An opening is perforated at the center of a unit by photolithography and etching. Zinc is diffused via the opening into the InP window layer 5 and the InGaAs light receiving layer 4 in vapor phase or in solid phase for producing a p-region 6. As shown in FIG. 2, a pn-junction 20 is produced till an adequate medium depth of the light receiving region 4. When an InP window layer accompanies, a part of the window layer and a nearly half depth part of the light receiving layer become the p-region 6. A pn-junction 20 is made in the InGaAs layer 4.

A SiON film 7 is produced on the SiN film 8 and the p-region 6 by a PCVD method. The SiON film, which excels in cohesion with InP or InGaAs layers, has an important function of producing no surface levels and suppressing a dark current. FIG. 3 demonstrates the SiON film covering the p-region 6 and the SiN film 8. SiON films have been used to be antireflection films of covering an incidence aperture of InP photodiodes for suppressing reflection. Contradicting the common sense, the present invention adopts SiON films as a part of a high reflection coating. However, the inventor has noticed that SiON has excellent properties of cohering to InP and suppressing dark currents. Then SiON films are employed as an undercoating layer for high-reflection films.

An $Al_2O_3$ layer 22, a Si layer 23, an $Al_2O_3$ layer 24, a Si layer 25 and an $Al_2O_3$ layer are deposited upon the SiON film 7 by an ion-assisting electron beam evaporation method. The pile of the layers is called a high reflection film, since the layer pile reflects a major part of incidence light and absorbs a small portion for detecting the power of the light. FIG. 4 shows a photodiode chip coated with the high reflection film. The high-reflection film has a 80-90% reflection rate for light with a 1550 nm wavelength. The high reflection film is composed of individual layers of reciprocal $Al_2O_3/Si$ layers and a SiON layer that have the following refractive indices and thicknesses from bottom to top.

| | refractive index | thickness |
|---|---|---|
| InP | 3.2 | |
| SiON | 1.8 | 177.8 nm |
| Si | 3.51 | 96.9 nm |
| $Al_2O_3$ | 1.68 | 194.8 nm |
| Si | 3.51 | 85.7 nm |
| $Al_2O_3$ | 1.68 | 142.2 nm |
| air | 1 | |

The reflection film has been made upon the InP and InGaAs layers. A p-electrode should be formed upon the p-region 6. A resist is painted upon the film-fabricated InP wafer and is dried. The resist is exposed via a patterned mask by a light source. Holes are perforated in the resist by developing.

Holes attaining to the p-region 6 are perforated in the $Al_2O_3/Si/SiON$ layers by buffered hydrofluoric acid (BHF) immersing via the resist holes. A p-electrode material is deposited upon the resist by an evaporation, sputtering or CVD method. Extra portions of the p-electrode materials are eliminated by a lift-off method. P-electrodes 9 which reach the p-InP window layer are formed at the holes.

Figure 5:
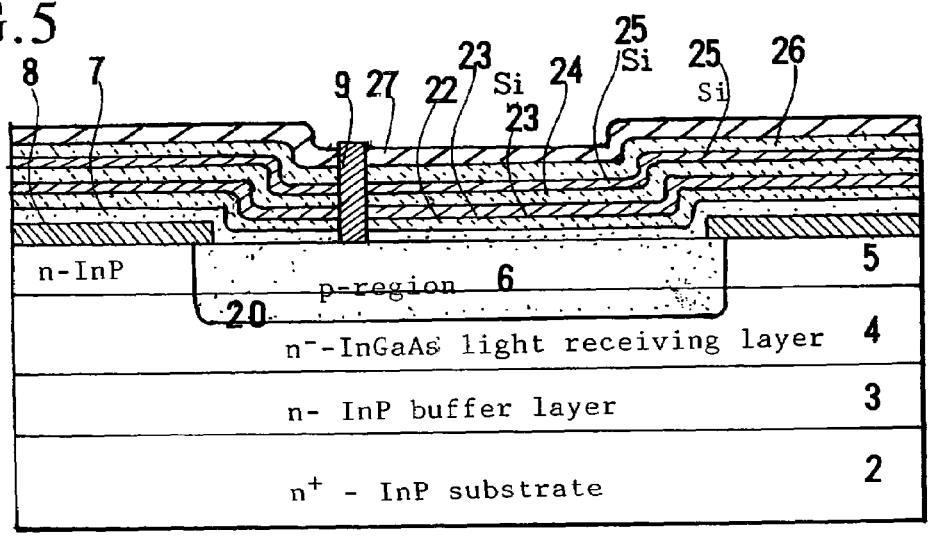
FIG. 5 is a section of a wafer-processing device unit further having a p-electrode which is formed upon a p-InP region exposed by painting the piled films with a resist, eliminating a part of the resist by photolithography, etching the layers via the opening and depositing a p-electrode metal on the partially exposed p-InP region.

FIG. 5 shows a photodiode having the p-electrode 9. Light goes via a top surface into the photodiode. The ($Al_2O_3/Si$) high reflection film on the top surface reflects a major part and absorbs a minor part of light emitted from a laser diode. Since the top surface is an incidence aperture, the p-electrode is a small dot electrode not so as to disturb light entrance. Otherwise, an annular p-electrode is also available.

Figure 6:
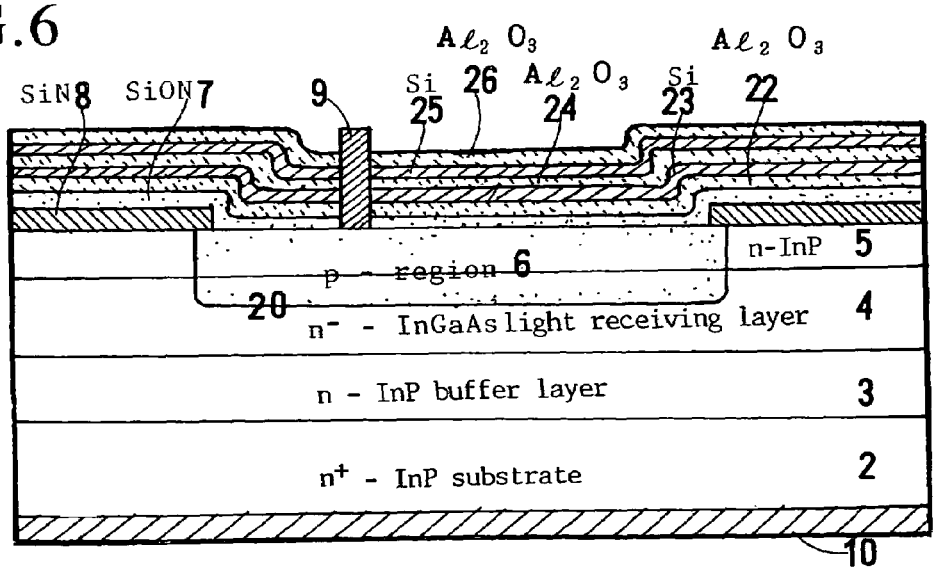
FIG. 6 is a section of a wafer-processing device unit in the state of eliminating the upper resist and forming an n-electrode on a bottom of the n-InP substrate.

An n-electrode 10 is formed upon the bottom of the n-InP substrate 2 for making an ohmic contact with the n-InP substrate. FIG. 6 shows a photodiode having the bottom n-electrode.

The photodiode shall be placed on a beam line extending from a laser diode with a 45 degree inclination angle. A reverse bias is applied between the p-electrode (anode) and the n-electrode (cathode).

Forward light emitting from the laser diode (LD) slantingly hits the aperture of the photodiode. 80%-90% of the LD light is reflected by the superficial high reflection film and changes the light path by 90 degrees. 20%-10% of the LD light goes into the photodiode and attains the light receiving layer. The light is absorbed in the light receiving region 6 and makes pairs of electrons and holes in the light receiving layer. Holes produced in an n-type depletion layer of the light receiving region are driven toward the pn-junction 20. When the holes overrun the pn-junction, a photocurrent flows.

The absorbed light is a part of the forward light emitted from the laser diode. Since the photodiode detects a part of the forward light, the total power of the LD forward light is known. When the forward light power decreases, the driving current is reinforced for maintaining the output of the laser diode to be constant.

In the embodiment, the sum of thicknesses of five $Al_2O_3$/Si reciprocating layers is 519.6 nm. An addition of a SiON thickness gives the total high reflection film thickness of 697.4 nm.

Figures 7, 8:
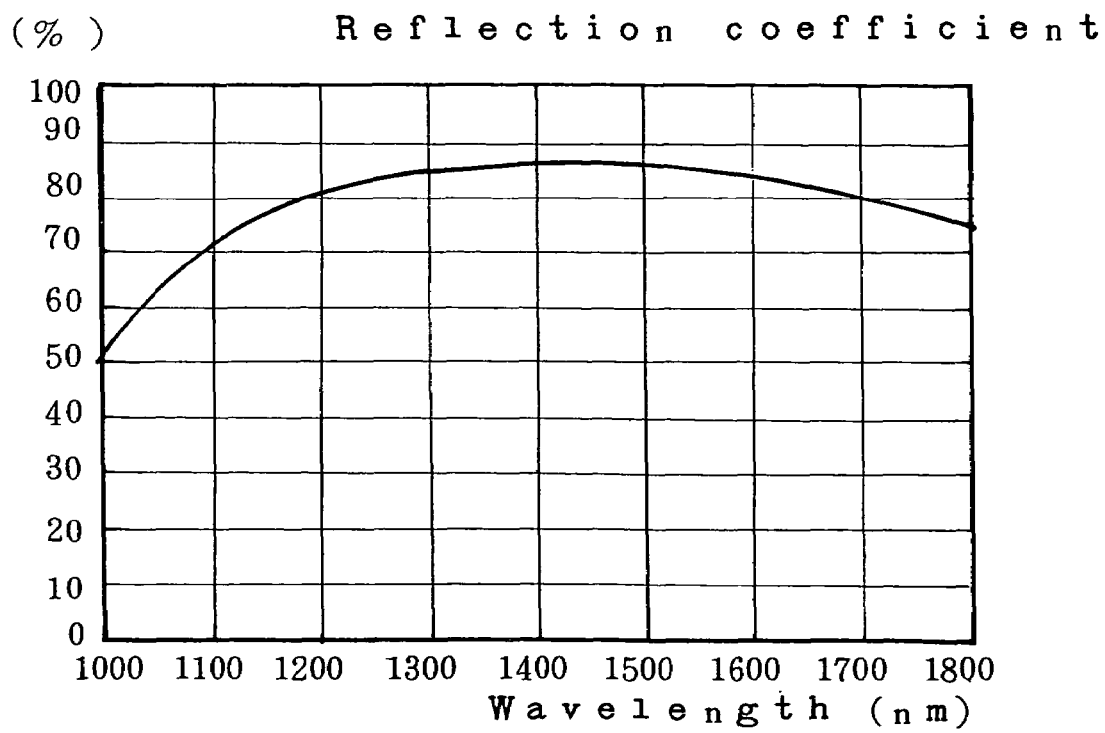
FIG. 7 shows a layered structure of a reflection film denoting refractive indices, incident angles, S-wave refraction efficiencies, P-wave refraction efficiencies of each component in an $Al_2O_3/Si/Al_2O_3/Si/Al_2O_3/SiON$ high reflection film formed on an incidence surface of an InP photodiode, which is an embodiment of the invention.
FIG. 8 is a graph showing wavelength-dependence of reflection rates for light of an incident angle of 45 degrees into a high reflective film of the present invention. The abscissa is wavelengths (nm). The ordinate is reflection rates (%) to 45 degree incident light.
Figure 9:
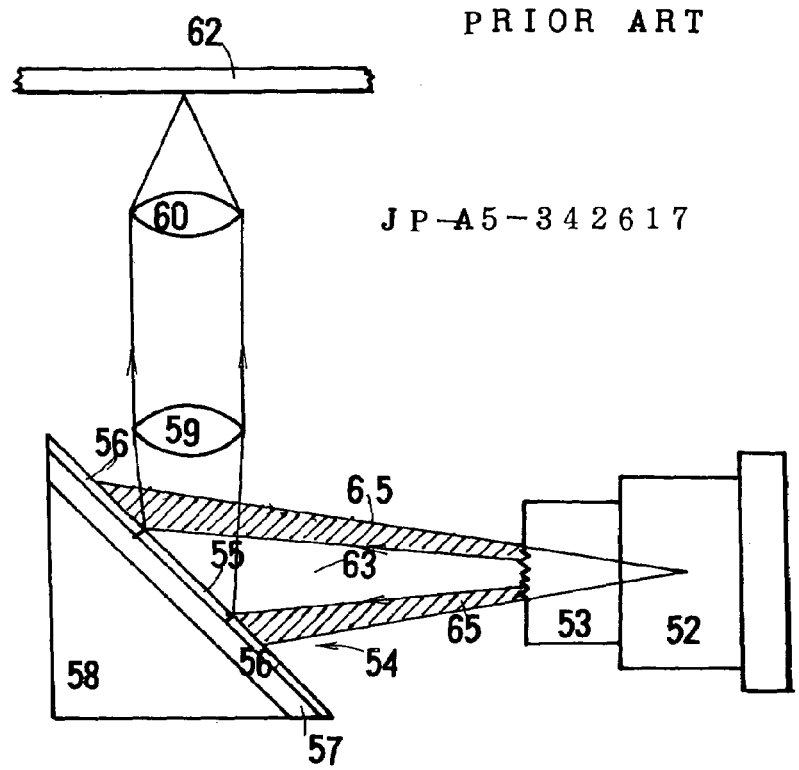
FIG. 9 is a side view of an apparatus for measuring laser power by separating the first order diffraction beam by a grating proposed by Japanese Patent Laying Open No. 5-342617 and absorbing all the diffracted power.
Figure 10:
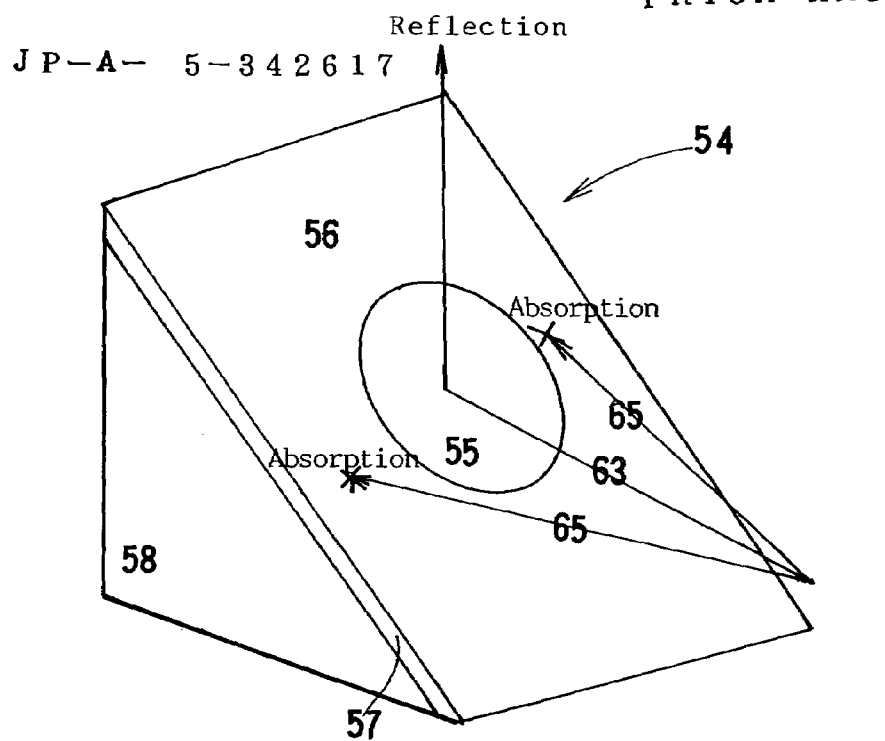
FIG. 10 is an enlarged perspective view of the 90 degree reflection mirror appearing in FIG. 9.

The reflection rate of the above high reflection film is contingent upon the wavelength of incidence light. FIG. 8 demonstrates the reflection rate dependence upon the wavelength. The film has a reflection rate of 50% for the light with a 1000 nm wavelength. The reflection rate increases with the wavelength. The reflection rate attains 81% for a 1200 nm wavelength. A 1400 nm wavelength raises a reflection rate up to 86%. A 1500 nm wavelength also gives 86% to the reflection rate. A 1550 nm wavelength realizes a reflection rate of 85%. The film reveals a 83% reflection rate for 1600 nm wavelength light. Wavelengths of 1200 nm to 1700 nm maintain reflection rates within the prescribed range of 80% to 90%, which satisfies the requirement of the present invention.

When the thicknesses have errors of ±10%, the embodiment film reveals a 80%-90% reflection rate for 45 degrees slanting light of 1300 nm-1600 nm wavelengths.

|  | Refractive index | Thickness |
| --- | --- | --- |
| InP | 3.2 |  |
| SiON | 1.8 | 160 nm-196 nm |
| Si | 3.51 | 87 nm-107 nm |
| $Al_2O_3$ | 1.68 | 175 nm-214 nm |
| Si | 3.51 | 77 nm-94 nm |
| $Al_2O_3$ | 1.68 | 128 nm-156 nm |

Figures 11, 12:
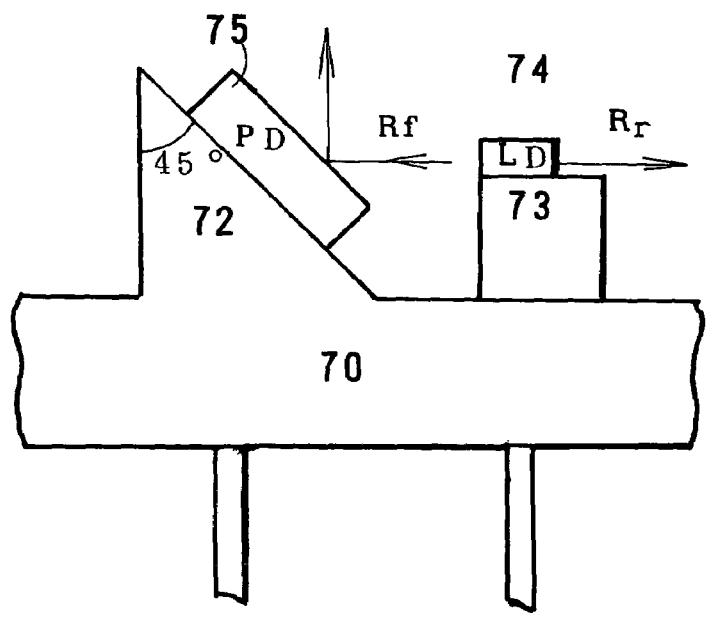
FIG. 11 is a schematic side view of an apparatus of monitoring forward laser power by a 45 degree slanting photodiode proposed by Japanese Patent Laying Open No. 8-116127.
FIG. 12 is a layered structure of a 90% reflection mirror proposed by Japanese Patent Laying Open No. 8-116127.
Figure 13:
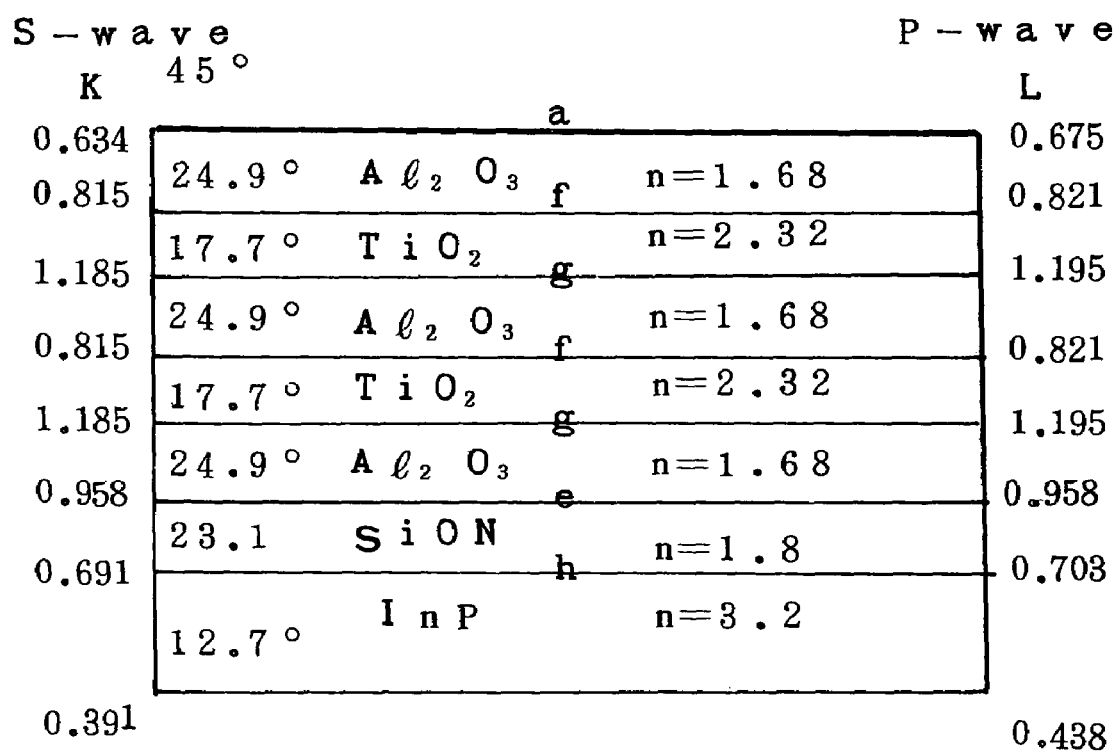
FIG. 13 shows a layered structure of a reflection film denoting refractive indices, incident angles, S-wave refraction efficiencies, P-wave refraction efficiencies of each component in an $Al_2O_3/TiO_2/Al_2O_3/TiO_2/Al_2O_3/SiON$ high reflection film formed on an incidence surface of an InP photodiode.
Figure 14:
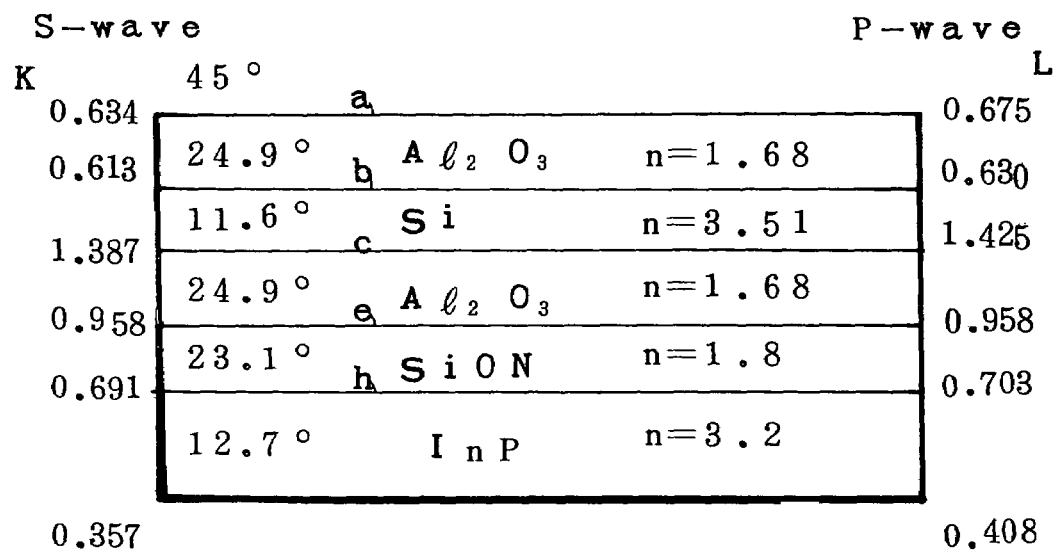
FIG. 14 shows a layered structure of a reflection film denoting refractive indices, incident angles, S-wave refraction efficiencies, P-wave refraction efficiencies of each component in an $Al_2O_3/Si/Al_2O_3/SiON$ high reflection film formed on an incidence surface of an InP photodiode.
Figure 15:
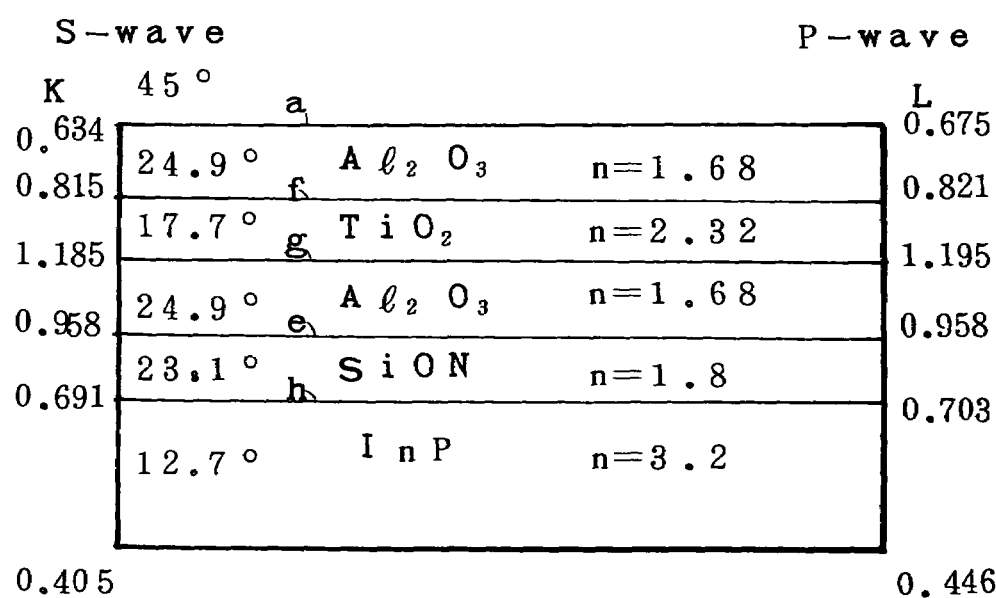
FIG. 15 shows a layered structure of a reflection film denoting refractive indices, incident angles, S-wave refraction efficiencies, P-wave refraction efficiencies of each component in an $Al_2O_3/TiO_2/Al_2O_3/SiON$ high reflection film formed on an incidence surface of an InP photodiode.
Figure 16:
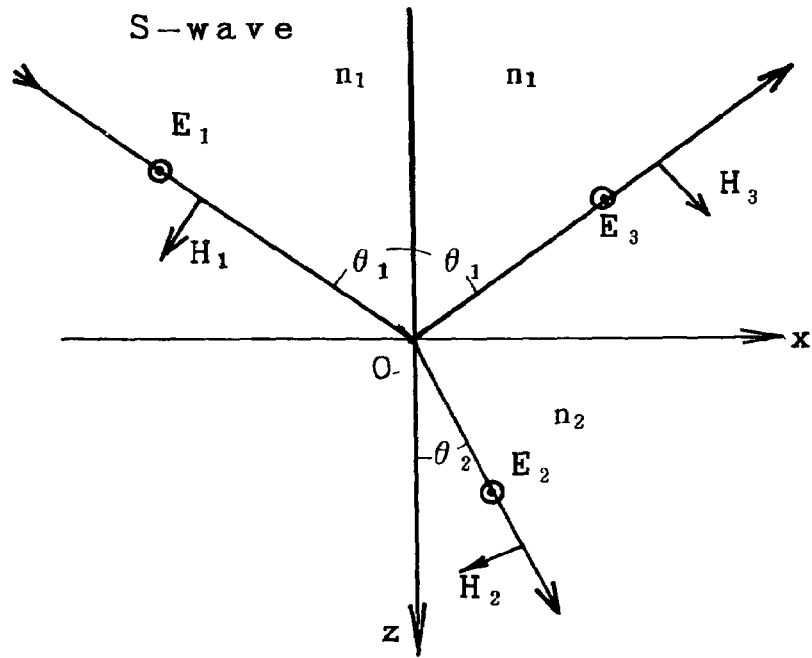
FIG. 16 is an explanatory figure of denoting electric fields, magnetic fields, directions of an incidence beam, a reflected beam and a refracted beam at point O on an interface for an S-wave having an electric field vertical to a reference zx-plane.
Figure 17:
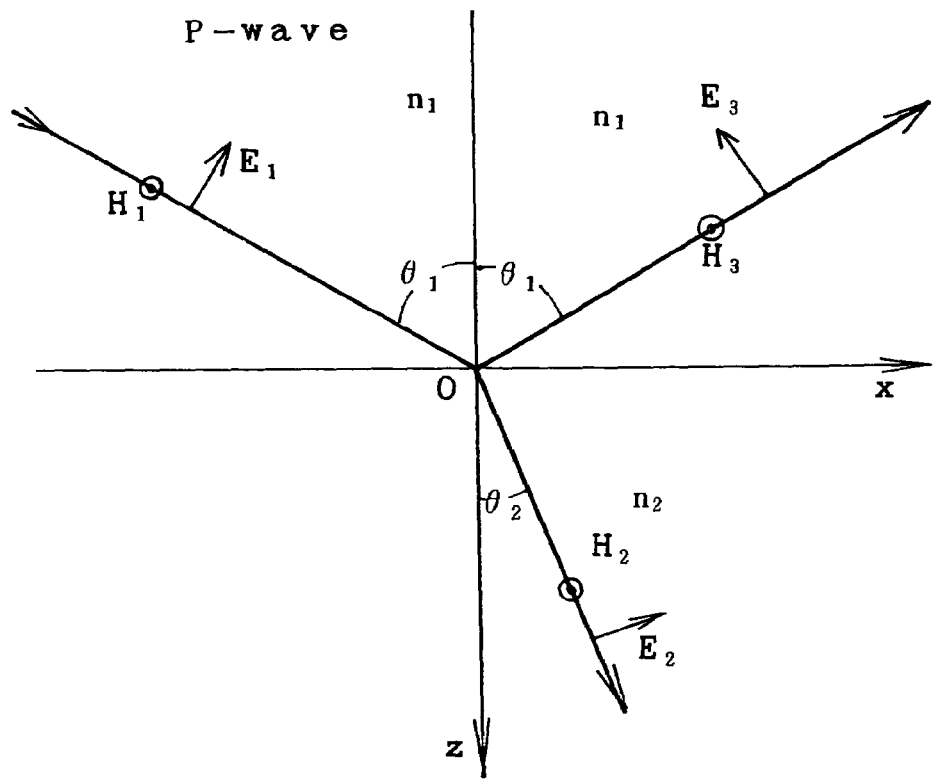
FIG. 17 is an explanatory figure of denoting electric fields, magnetic fields, directions of an incidence beam, a reflected beam and a refracted beam at point O on an interface for a P-wave having an electric field parallel to a reference zx-plane.
Figure 18:
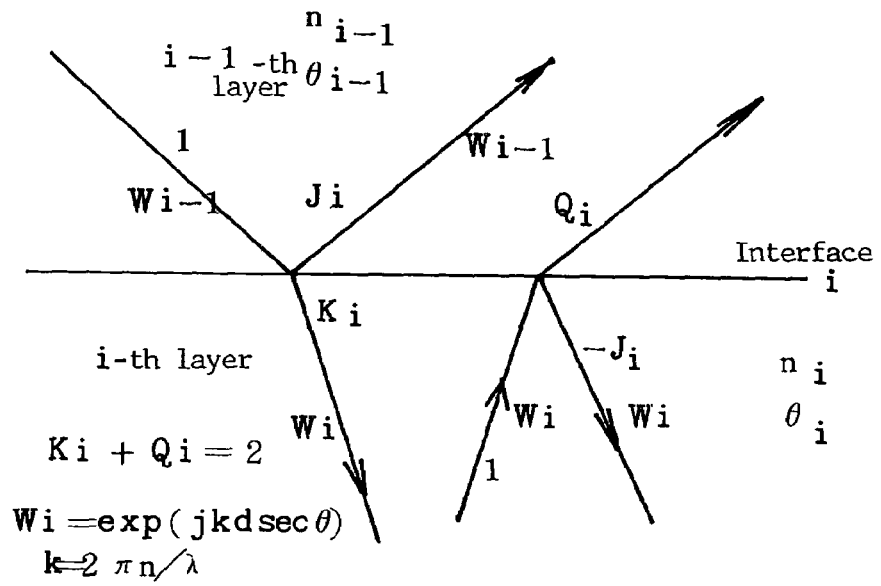
FIG. 18 is an explanatory figure of denoting definitions of reflection efficiencies $J_i$ and $-J_i$ and refraction efficiencies $K_i$ and $Q_i$ for a beam going with an incident angle $\theta_i$ from the $(i-1)$-th layer of a refractive index $n_{i-1}$ via the i-th interface to the i-th layer of a refractive index $n_i$ and another beam going with an incident angle $\theta_i$ from the i-th layer via the i-th interface to the $(i-1)$-th layer.
Figure 19:
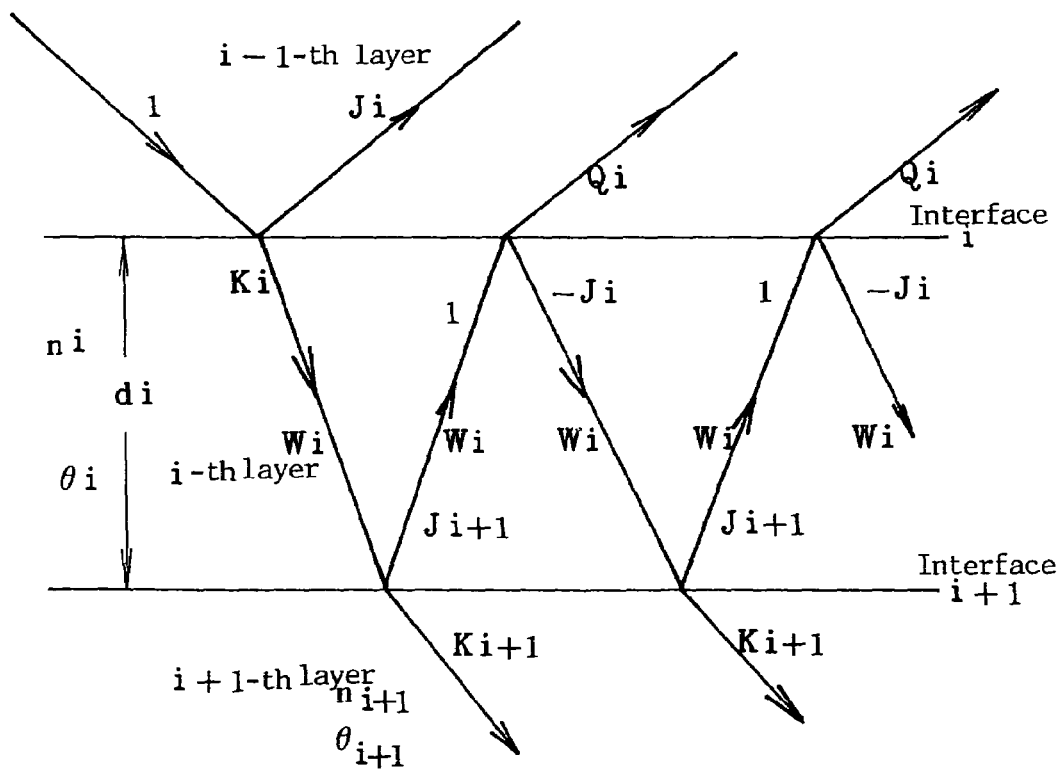
FIG. 19 is an explanatory figure for showing reflection/refraction beams and denoting how to calculate wavefunctions $W_i$, refractive efficiencies $K_i$, $K_{i+1}$, reflection efficiencies $J_i$, $J_{i+1}$ when an incident beam having power 1 obliquely goes from the $(i-1)$-th layer via i-th interface to the i-th layer being repeatedly refracted and reflected at the i-th and $(i+1)$-th interfaces.
Figure 20:
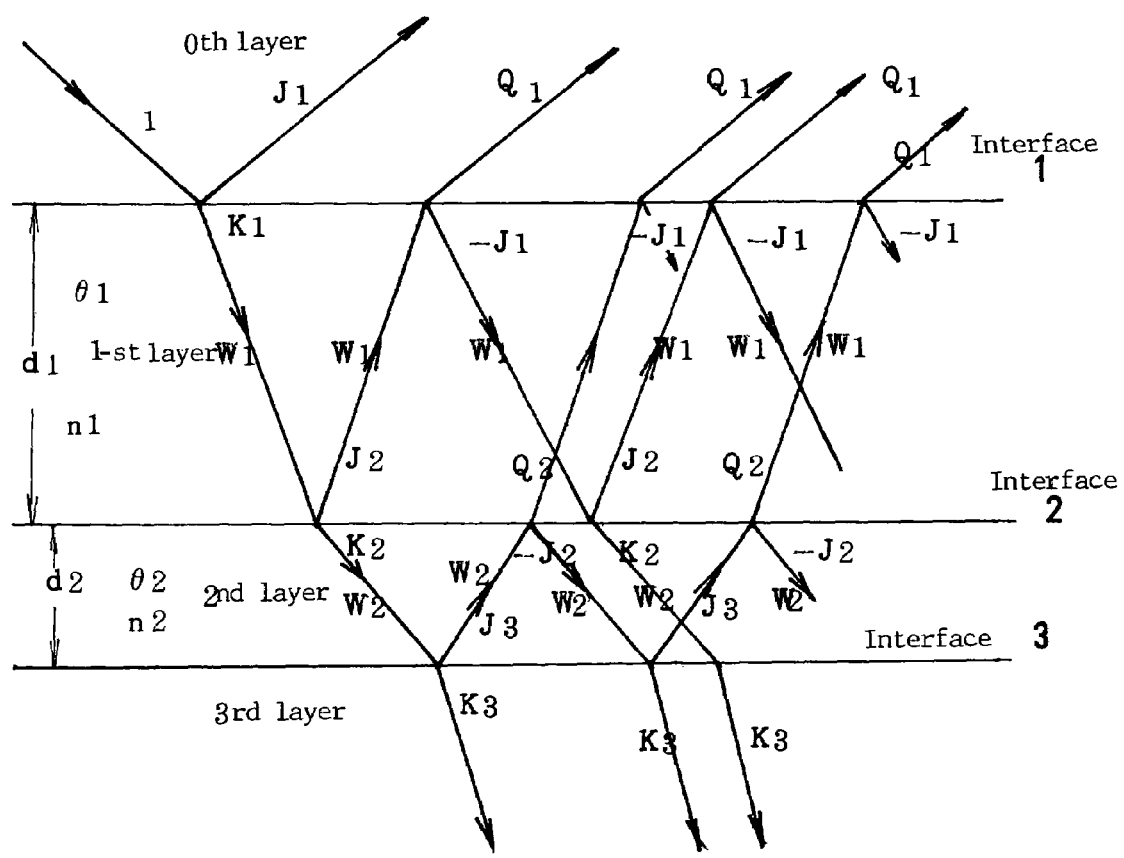
FIG. 20 is an explanatory figure for showing multi-reflection at a first interface, multi-reflection at the second interface and multi-reflection of beams reciprocating between the first and second interfaces when an incident beam having power 1 slantingly goes from 0-the layer via the first interface into the first layer of a double structure film having the first and second layer.
Figure 21:
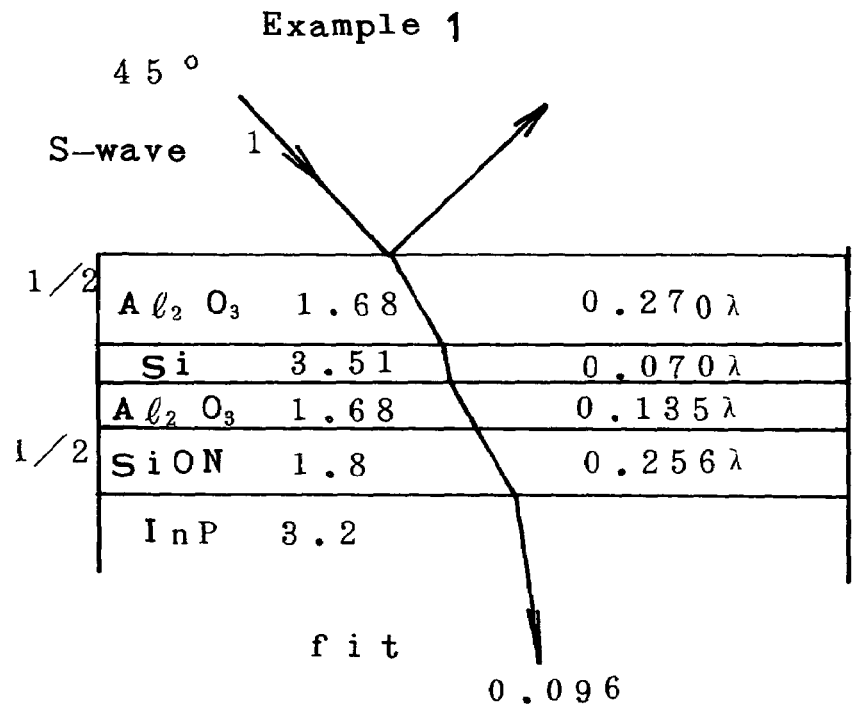
FIG. 21 is a schematic sectional view of an $Al_2O_3/Si/Al_2O_3/SiON/InP$ four-layered film deposited upon an InP layer of Example 1 for showing the film thicknesses for minimizing the passing light power to the InP film when an S-wave incident light of power 1 slantingly goes at 45 degrees into the four-layered film.
Figure 22:
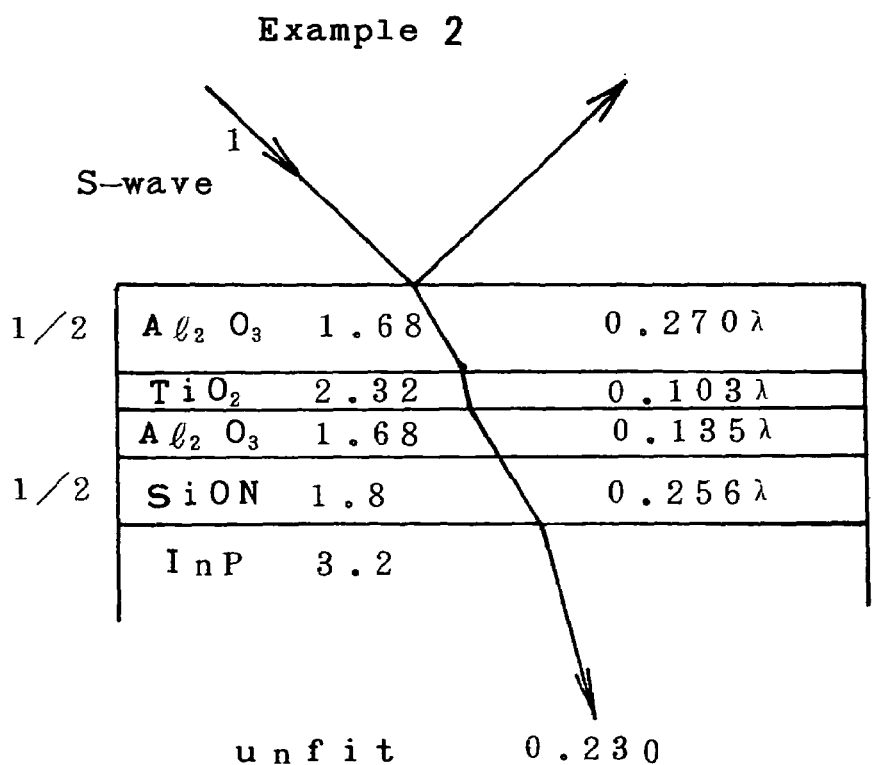
FIG. 22 is a schematic sectional view of an $Al_2O_3/TiO_2/Al_2O_3/SiON/InP$ four-layered film deposited upon an InP layer of Example 2 for showing the film thicknesses for minimizing the passing light power to the InP film when an S-wave incident light of power 1 slantingly goes at 45 degrees into the four-layered film.
Figure 23:
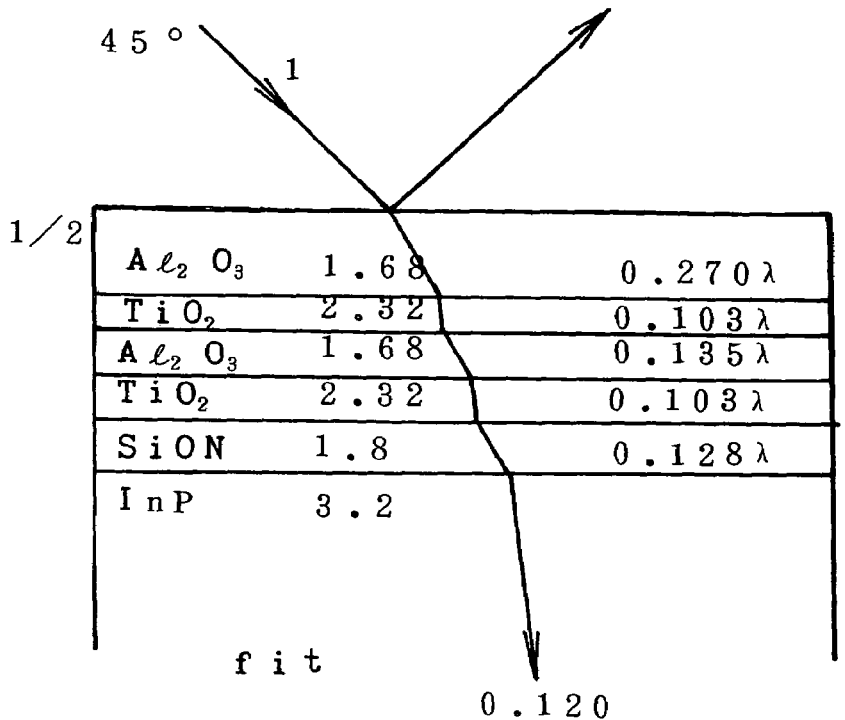
FIG. 23 is a schematic sectional view of an $Al_2O_3/TiO_2/Al_2O_3/TiO_2/SiON/InP$ five-layered film deposited upon an InP layer of Example 3 for showing the film thicknesses for minimizing the passing light power to the InP film when an S-wave incident light of power 1 slantingly goes at 45 degrees into the five-layered film.
Figure 24:
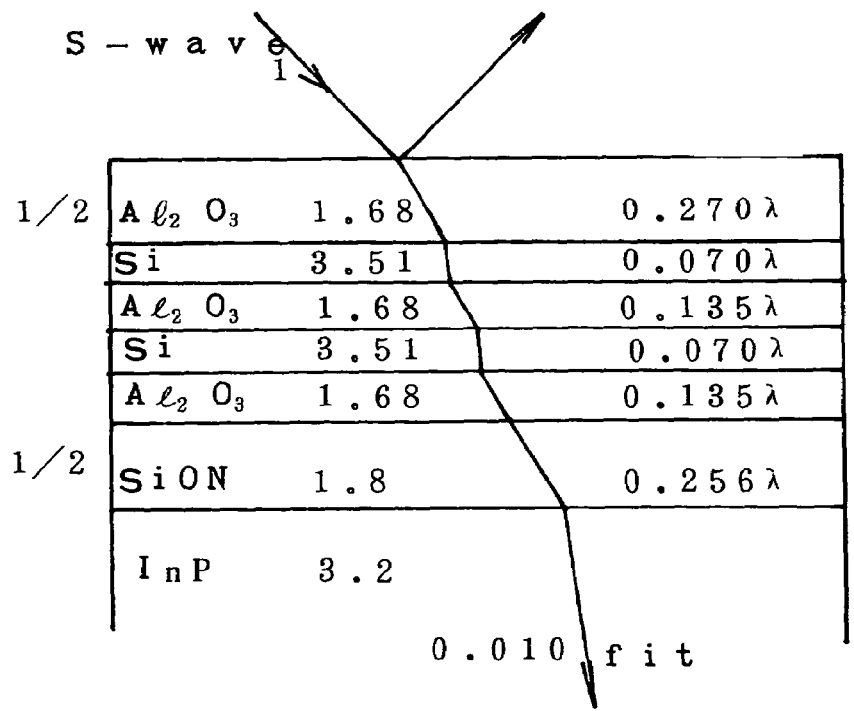
FIG. 24 is a schematic sectional view of an $Al_2O_3/Si/Al_2O_3/Si/Al_2O_3/SiON/InP$ six-layered film deposited upon an InP layer of Example 4 for showing the film thicknesses for minimizing the passing light power to the InP film when an S-wave incident light of power 1 slantingly goes at 45 degrees into the six-layered film.
Figure 25:
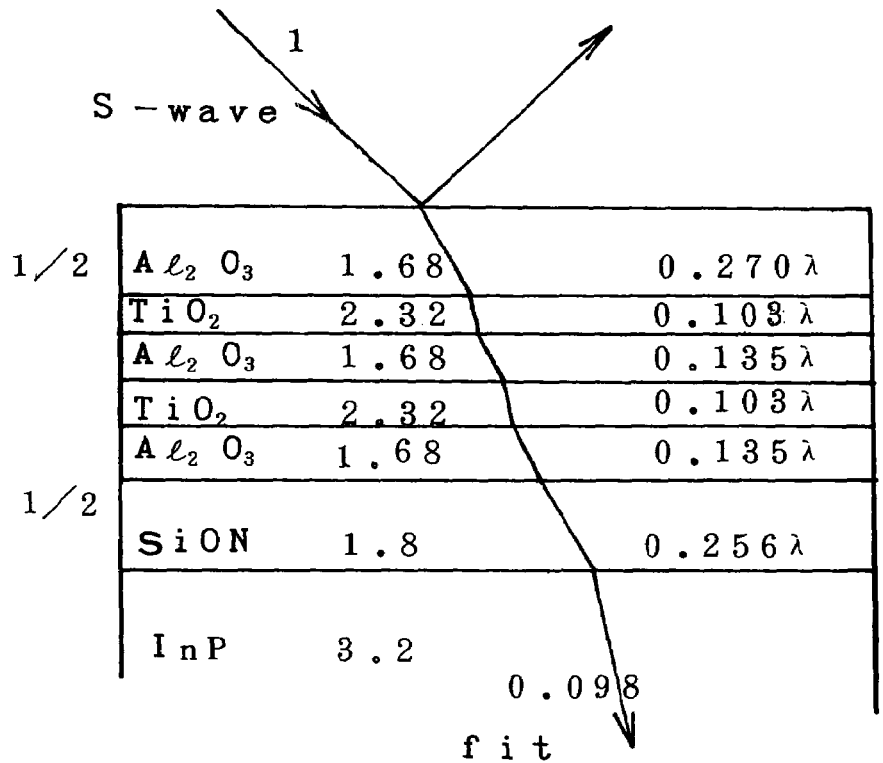
FIG. 25 is a schematic sectional view of an $Al_2O_3/TiO_2/Al_2O_3/TiO_2/Al_2O_3/SiON/InP$ six-layered film deposited upon an InP layer of Example 5 for showing the film thicknesses for minimizing the passing light power to the InP film when an S-wave incident light of power 1 slantingly goes at 45 degrees into the six-layered film.
Figure 26:
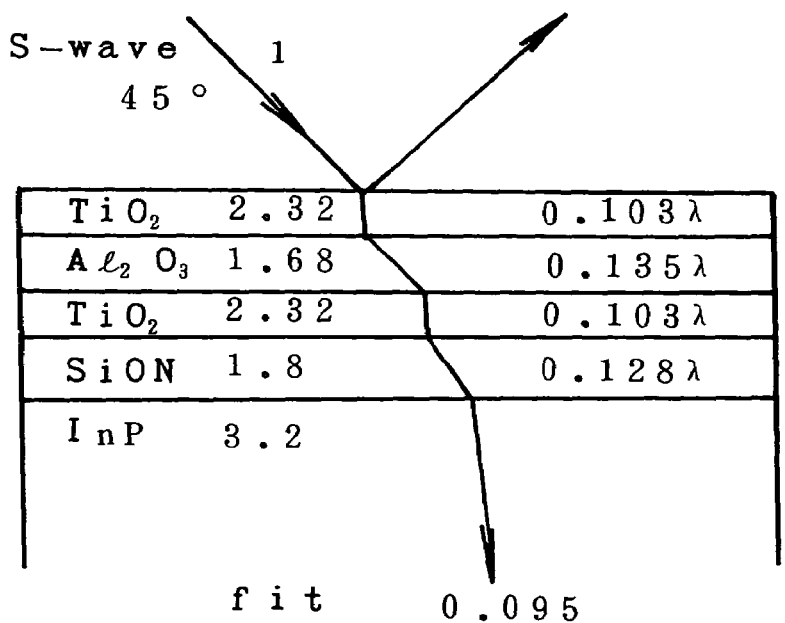
FIG. 26 is a schematic sectional view of a $TiO_2/Al_2O_3/TiO_2/SiON/InP$ four-layered film deposited upon an InP layer of Example 6 for showing the film thicknesses for minimizing the passing light power to the InP film when an S-wave incident light of power 1 slantingly goes at 45 degrees into the four-layered film.
Figure 27:
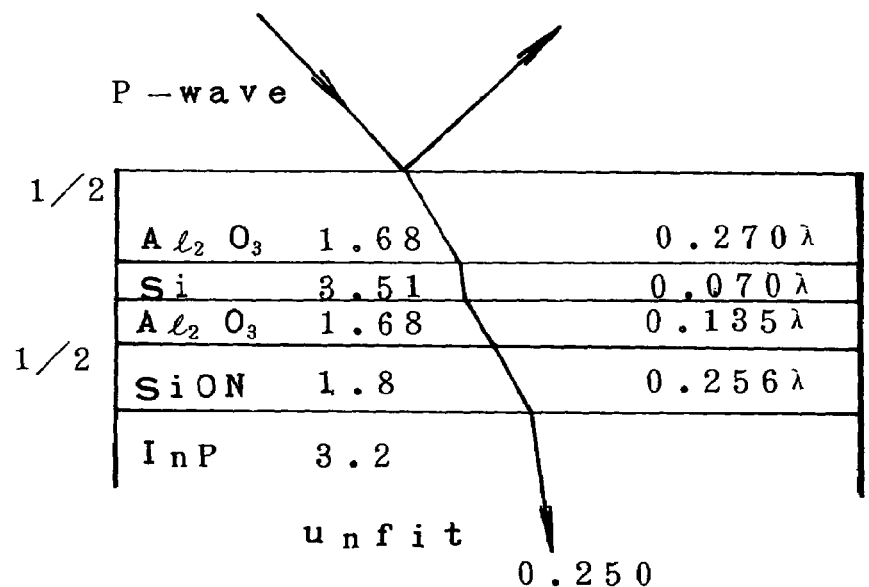
FIG. 27 is a schematic sectional view of an $Al_2O_3/Si/Al_2O_3/SiON/InP$ four-layered film deposited upon an InP layer of Example 7 for showing the film thicknesses for minimizing the passing light power to the InP film when a P-wave incident light of power 1 slantingly goes at 45 degrees into the four-layered film.
Figure 28:
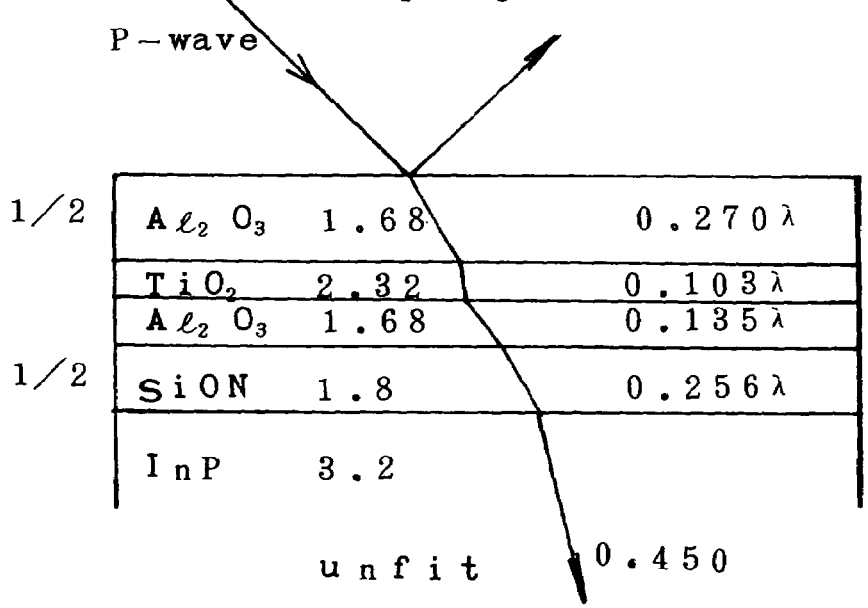
FIG. 28 is a schematic sectional view of an $Al_2O_3/TiO_2/Al_2O_3/SiON/InP$ four-layered film deposited upon an InP layer of Example 8 for showing the film thicknesses for minimizing the passing light power to the InP film when a P-wave incident light of power 1 slantingly goes at 45 degrees into the four-layered film.
Figure 29:
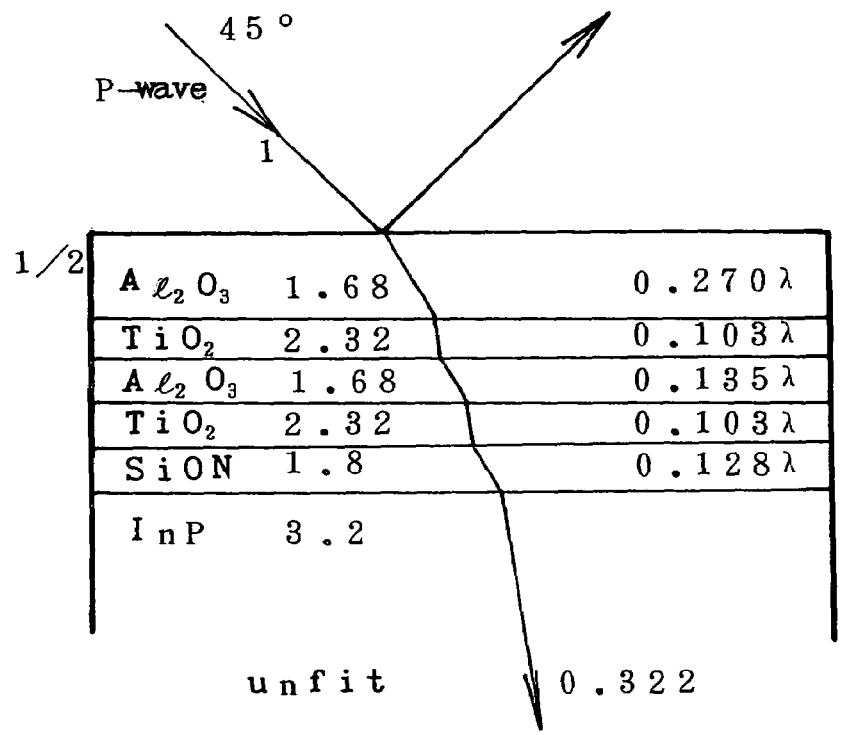
FIG. 29 is a schematic sectional view of an $Al_2O_3/TiO_2/Al_2O_3/TiO2_2/SiON/InP$ five-layered film deposited upon an InP layer of Example 9 for showing the film thicknesses for minimizing the passing light power to the InP film when a P-wave incident light of power 1 slantingly goes at 45 degrees into the five-layered film.
Figure 30:
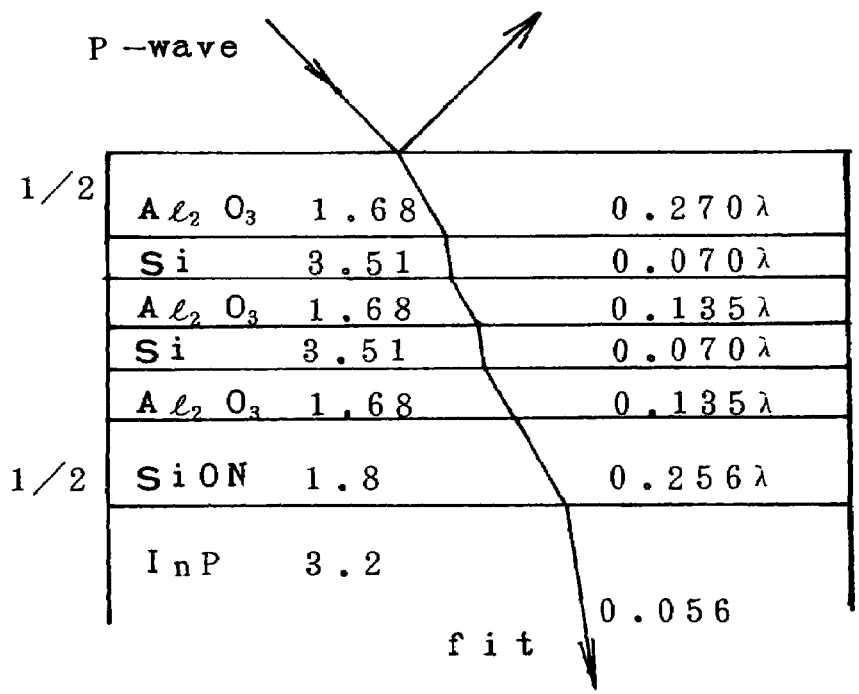
FIG. 30 is a schematic sectional view of an $Al_2O_3/Si/Al_2O_3/Si/Al_2O_3/SiON/InP$ six-layered film deposited upon an InP layer of Example 10 for showing the film thicknesses for minimizing the passing light power to the InP film when a P-wave incident light of power 1 slantingly goes at 45 degrees into the six-layered film.
Figure 31:
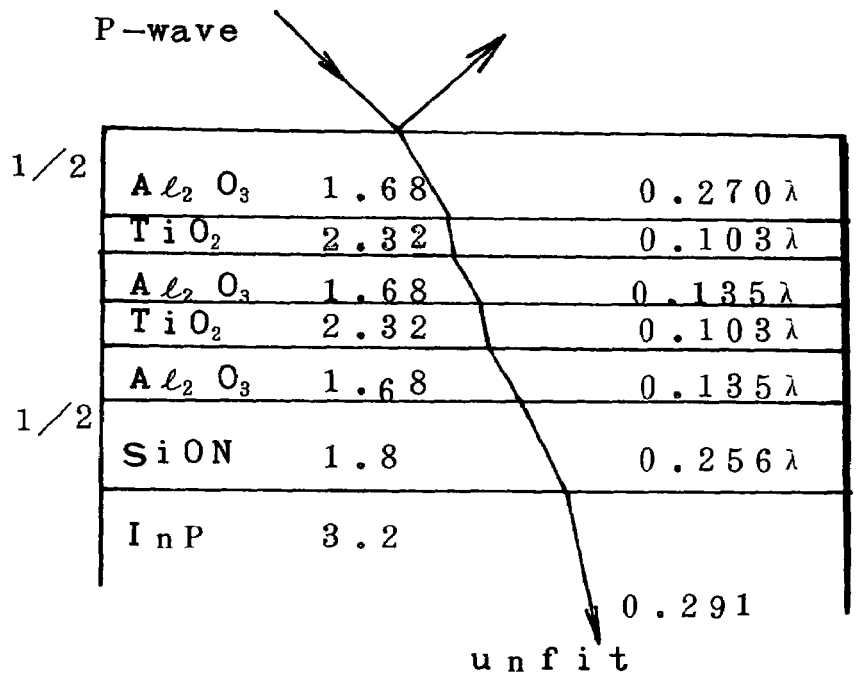
FIG. 31 is a schematic sectional view of an $Al_2O_3/TiO_2/Al_2O_3/TiO_2/Al_2O_3/SiON/InP$ six-layered film deposited upon an InP layer of Example 11 for showing the film thicknesses for minimizing the passing light power to the InP film when a P-wave incident light of power 1 slantingly goes at 45 degrees into the six-layered film.
Figure 32:
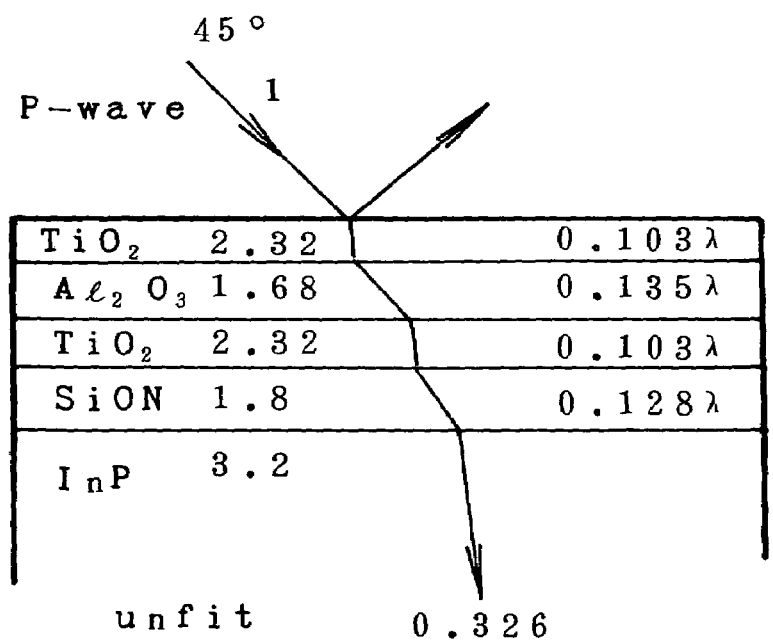
FIG. 32 is a schematic sectional view of a $TiO_2/Al_2O_3/TiO_2/SiON/InP$ four-layered film deposited upon an InP layer of Example 12 for showing the film thicknesses for minimizing the passing light power to the InP film when a P-wave incident light of power 1 slantingly goes at 45 degrees into the four-layered film.
Figure 33:
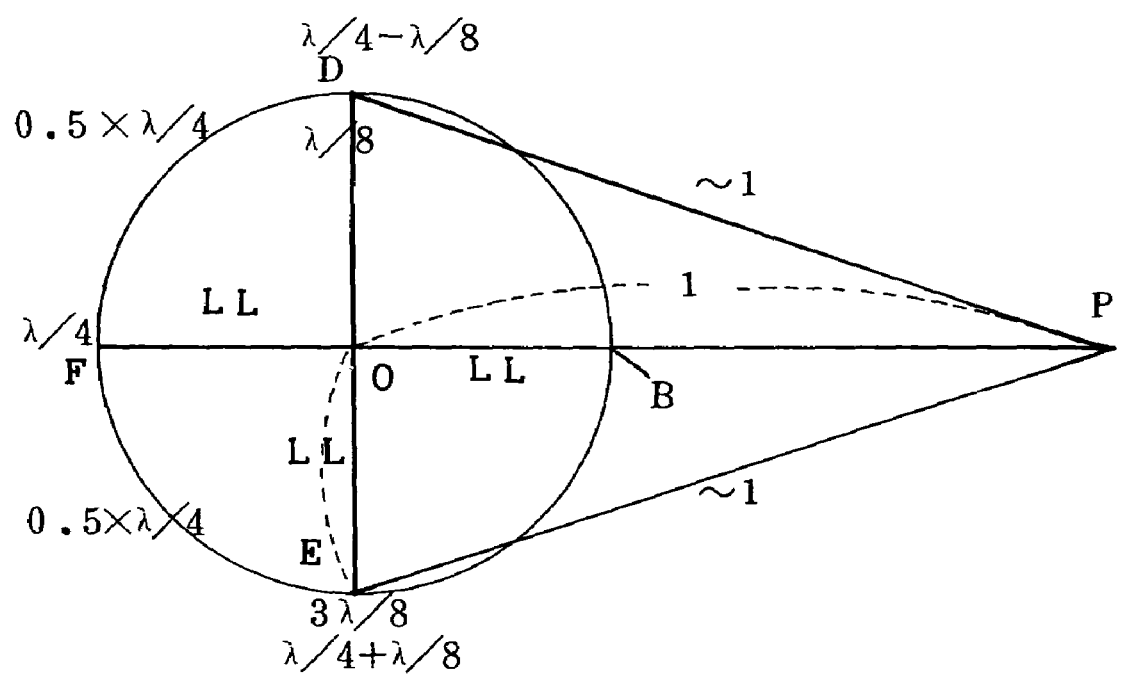
FIG. 33 is an explanatory figure for showing the fact that the multi-reflection equations, which have a product of denominators $(1+W_i^2 L_i L_{i+1})$, take the largest values and the passing power is minimized when the thickness of the i-th layer is a quarter wavelength $\lambda/4$, which gives $W_i^2 = -1$, in a negative $L_i L_{i+1}$ case. OP denotes the preceding 1 in the denominator $(1+W_i^2 L_i L_{i+1})$. The radius of the circle is $|L_i L_{i+1}|$ (| . . . | is an absolute value; abbr. LL). A quarter wavelength $(\lambda/4)$ thickness of the i-th layer maximizes the denominator (PF). $\lambda/4 \pm \lambda/8$ give nearly 1 to the denominator (PD and PE).

The five layer structure of the aforementioned ②Japanese Patent Laying Open No. 8-116127 is now considered. FIG. 12 demonstrates the structure proposed by ②. The refractive index of $SiO_2$ is 1.42 ($\theta$=29.9°). The refractive index of Si is 3.51 ($\theta$=11.6°). The prior art film is composed of five layers and six interfaces. Interfaces 1 to 5 are defined by pairs of contacting media.

| Interface 1 | air/$SiO_2$ |
| --- | --- |
| Interface 2 | $SiO_2$/Si |

-continued

| Interface 3 | Si/$SiO_2$ |
| --- | --- |
| Interface 4 | $SiO_2$/Si |
| Interface 5 | Si/$SiO_2$ |
| Interface 6 | $SiO_2$/InP |

Parameters K, J, Q, L, M and R between $\theta_1$ and $\theta_2$ media are defined by (S-Wave)

$K=2 \sin\theta_2 \cos\theta_1/\sin(\theta_1+\theta_2)$, $J=\sin(\theta_2-\theta_1)/\sin(\theta_1+\theta_2)$, $Q=2 \sin\theta_1 \cos\theta_2/\sin(\theta_1+\theta_2)$, (P-Wave)

$L=2 \sin\theta_2 \cos\theta_1/\sin(\theta_1+\theta_2)\cos(\theta_1-\theta_2)$, $M=\tan(\theta_1-\theta_2)/\tan(\theta_1+\theta_2)$, $R=2 \sin\theta_1 \cos\theta_2/\sin(\theta_1+\theta_2)\cos(\theta_1-\theta_2)$.

Refraction coefficients k, reflection coefficients J and reverse refraction coefficients at interfaces 1-6 are,

| $K_1$ = 0.730, | $J_1$ = −0.268 | | |
| --- | --- | --- | --- |
| $K_2$ = 0.526, | $J_2$ = −0.474, | $Q_2$ = 1.474, | $K_2Q_2$ = 0.775 |
| $K_3$ = 1.474, | $J_3$ = +0.474, | $Q_3$ = 0.526, | $K_3Q_3$ = 0.775 |
| $K_4$ = 0.526, | $J_4$ = −0.474, | $Q_4$ = 1.474, | $K_4Q_4$ = 0.775 |
| $K_5$ = 1.474, | $J_5$ = −0.474, | $Q_5$ = 0.526, | $K_5Q_5$ = 0.775 |
| $K_6$ = 0.563, | $J_6$ = −0.437 | | |

$G = K_1 K_2 K_3 K_4 K_5 K_6 = 0.247$ 5-layer transmittance=$K_1 W_1 K_2 W_2 K_3 W_3 K_4 W_4 K_5 W_6 K_6$/
$\{(1+J_2W_1^2J_1)(1+J_3W_2^2J_2)(1+J_4W_3^2J_3)(1+J_5W_4^2J_4)(1+J_6W_5^2J_5)(1+J_3W_2^2Q_2K_2W_1^2J_1)(1+J_4W_3^2Q_3K_3W_2^2J_2)(1+J_5W_4^2Q_4K_4W_3^2J_3)(1+J_6W_5^2Q_5K_5W_4^2J_4)$
$(1+J_4W_3^2Q_3W_2^2Q_2W_1^2J_1K_2K_3)$
$(1+J_5W_4^2Q_4W_3^2Q_3W_2^2J_2K_3K_4)(1+J_6W_5^2Q_5W_4^2Q_4W_3^2J_3K_4K_5)$
$(1+J_5W_4^2Q_4W_3^2Q_3W_2^2Q_2W_1^2J_1K_2K_3K_4)(1+J_6W_5^2Q_5W_4^2Q_4W_3^2Q_3W_2^2J_2K_3K_4K_5)(1+J_6W_5^2Q_5W_4^2Q_4W_3^2Q_3W_2^2Q_2W_1^2J_1K_2K_3K_4K_5)\}$ (50)

Eq.(50) enables us to calculate the five layer transmittance of the prior art photodiode. The 1st layer $SiO_2$ has not a $\lambda/2$ but a $\lambda/4$ thickness. $\lambda/4$ takes $W_1^2$=−1. Terms including $W_1^2$ in denominators should take $\{1-(\ldots)\}$ instead of $\{1+(\ldots)\}$.

Transmittance (prior art)=0.247/(1−0.127)(1+0.225)
(1+0.225)(1+0.225) (1+0.207)(1−0.098)
(1+0.174)(1+0.174)(1+0.161)(1−0.076)(1+0.135)
(1+0.125) (1−0.059)(1+0.097)(1−0.042)=0.247/
3.262=G/H=0.0757

G=0.247, H=3.262, T=0.0757.

$U=3.2\times T^2=0.018$

The transmittance of the prior art is 0.018. The reflection rate is 0.982. ②Japanese Patent Laying Open No. 8-116127 said that the ($SiO_2$/Si) five layer film of ② shown in FIG. 12 would have a 90% reflection rate. But it is wrong. The reflection rate is 98%. The power of he light attaining InP is only 1.8%. It is too weak to detect the forward light power exactly. There is no prior art which has a 80-90% reflection rate for a slanting incidence beam. The present invention proposes a 80%-90% high reflection film for slanting beams for the first time.

TABLE 1

|   | | S-Wave | | P-Wave | | |
|---|---|---|---|---|---|---|
|   | | K | J | L | M | R |
| a | Air 45°/Al$_2$O$_3$ 24.9° | 0.634 | −0.366 | 0.675 | 0.134 | |
| b | Al$_2$O$_3$ 24.9°/Si 11.6° | 0.613 | −0.387 | 0.631 | 0.319 | 1.425 |
| c | Si 11.6°/Al$_2$O$_3$ 24.9° | 1.387 | 0.387 | 1.425 | −0.319 | 0.63 |
| d | Si 11.6°/SiON 23.1° | 1.35 | 0.35 | 1.378 | −0.294 | 0.663 |
| e | Al$_2$O$_3$ 24.9°/SiON 23.1° | 0.958 | −0.042 | 0.958 | 0.028 | 1.043 |
| f | Al$_2$O$_3$ 24.9°/TiO$_2$ 17.7° | 0.815 | −0.185 | 0.821 | 0.137 | 1.195 |
| g | TiO$_2$ 17.7°/Al$_2$O$_3$ 24.9° | 1.185 | 0.185 | 1.195 | −0.137 | 0.821 |
| h | SiON 23.1°/InP 12.7° | 0.691 | −0.309 | 0.703 | 0.254 | |
| i | TiO$_2$ 17.7°/SiON 23.1° | 1.144 | 0.144 | 1.149 | −0.11 | 0.86 |
| j | Air 45°/Si 11.6° | 0.341 | −0.659 | 0.408 | 0.435 | |
| k | Air 45°/TiO$_2$ 17.7° | 0.484 | −0.516 | 0.545 | 0.266 | |

TABLE 2

| | Θ | n | λ cosΘ/4 n | λ cosΘ/2 n |
|---|---|---|---|---|
| Air | 45° | 1 | 0.177 λ<br>274<br>230 | 0.353 λ<br>548<br>460 |
| Al$_2$O$_3$ | 24.9° | 1.68 | 0.135 λ<br>209<br>175 | 0.270 λ<br>418<br>351 |
| Si | 11.6° | 3.51 | 0.070 λ<br>108<br>91 | 0.140 λ<br>216<br>181 |
| TiO$_2$ | 17.7° | 2.32 | 0.103 λ<br>159<br>133 | 0.205 λ<br>318<br>267 |
| SiON | 23.1° | 1.8 | 0.128 λ<br>198<br>166 | 0.256 λ<br>396<br>332 |
| InP | 12.7° | 3.2 | 0.076 λ<br>118<br>99 | 0.152 λ<br>236<br>198 |
| Wavelength | | | | |
| 1550 nm<br>1300 nm | | | | |

TABLE 3

| | | | G | H | T | U | | G − T | $\frac{0.5(0.177 - T)}{G - T}$ | $\frac{0.5(0.25 - T)}{G - T}$ |
|---|---|---|---|---|---|---|---|---|---|---|
| S-Wave | 1 | Al$_2$O$_3$/Si/Al$_2$O$_3$/SiON | 0.357 | 2.069 | 0.173 | 0.096 | ○ | 0.184 | 0.011 | 0.209 |
| | 2 | Al$_2$O$_3$/TiO$_2$/Al$_2$O$_3$/SiON | 0.405 | 1.513 | 0.268 | 0.230 | X | | | |
| | 3 | Al$_2$O$_3$/TiO$_2$/Al$_2$O$_3$/TiO$_2$/SiON | 0.394 | 2.030 | 0.194 | 0.120 | ○ | 0.200 | | 0.140 |
| | 4 | Al$_2$O$_3$/Si/Al$_2$O$_3$/Si/Al$_2$O$_3$/SiON | 0.303 | 5.361 | 0.057 | 0.010 | ○ | 0.246 | 0.244 | 0.392 |
| | 5 | Al$_2$O$_3$/TiO$_2$/Al$_2$O$_3$/TiO$_2$/Al$_2$O$_3$/SiON | 0.391 | 2.238 | 0.175 | 0.098 | ○ | 0.216 | 0.048 | 0.201 |
| | 6 | TiO$_2$/Al$_2$O$_3$/TiO$_2$/SiON | 0.370 | 2.146 | 0.172 | 0.095 | ○ | 0.198 | | 0.197 |
| P-Wave | 7 | Al$_2$O$_3$/Si/Al$_2$O$_3$/SiON | 0.408 | 1.460 | 0.279 | 0.250 | X | | | |
| | 8 | Al$_2$O$_3$/TiO$_2$/Al$_2$O$_3$/SiON | 0.446 | 1.190 | 0.375 | 0.450 | X | | | |
| | 9 | Al$_2$O$_3$/TiO$_2$/Al$_2$O$_3$/TiO$_2$/SiON | 0.439 | 1.385 | 0.324 | 0.320 | X | | | |
| | 10 | Al$_2$O$_3$/Si/Al$_2$O$_3$/Si/Al$_2$O$_3$/SiON | 0.366 | 2.765 | 0.132 | 0.056 | ○ | 0.234 | 0.096 | 0.252 |
| | 11 | Al$_2$O$_3$/TiO$_2$/Al$_2$O$_3$/TiO$_2$/Al$_2$O$_3$/SiON | 0.438 | 1.449 | 0.302 | 0.290 | X | | | |
| | 12 | TiO$_2$/Al$_2$O$_3$/TiO$_2$/SiON | 0.432 | 1.355 | 0.319 | 0.113 | | | | |

What is claimed is:

1. A photodiode for monitoring forward light of a wavelength λ emitted from a laser diode, comprising an InP substrate, an n-InP layer grown on the InP substrate, an InGaAs or an InGaAsP light receiving layer grown on the n-InP layer, an InP window layer grown on the light receiving layer, a p-region made in the InP window layer and the light receiving layer, and a high reflection film being composed of Al$_2$O$_3$/Si reciprocal layers and a SiON layer and being formed on the InP window layer or the InP substrate for reflecting 80%-90% of a 45 degree inclination incidence beam and allowing 20%-10% of the inclination beam to arrive at the InP layer or substrate.

2. The photodiode as claimed in claim 1, wherein the high reflection film is a four layered film having a structure of Al$_2$O$_3$/Si/Al$_2$O$_3$/SiON/InP in series, the first Al$_2$O$_3$ layer has a thickness of 0.01λ-0.05 λ, 0.214 λ-0.267 λ or 0.273 λ-0.326 λ, the second Si layer has a thickness of 0.055 λ-0.069 λ or 0.071 λ-0.085 λ, the third Al$_2$O$_3$ layer has a thickness of 0.107 λ-0.134 λ or 0.136 λ-0.163 λ, the fourth SiON layer has a thickness of 0.202 λ-0.253 λ or 0.259 λ-0.310 λ and the high reflection film reflects 80-90% of a 45 degree inclination incidence S-wave beam and allows 20%-10% of the inclination beam to arrive at the InP layer or substrate.

3. The photodiode as claimed in claim 1, wherein the high reflection film is a six layered film having a structure of Al$_2$O$_3$/Si/Al$_2$O$_3$/Si/Al$_2$O$_3$/SiON/InP in series, the first Al$_2$O$_3$ layer has a thickness of 0.01λ-0.05 λ, 0.164 λ-0.204 λ or 0.336 λ-0.376λ, the second Si layer has a thickness of 0.043 λ-0.053 λ or 0.087 λ-0.097 λ, the third Al$_2$O$_3$ layer has a thickness of 0.082 λ-0.102 λ or 0.168 λ-0.188 λ, the fourth Si layer has a thickness of 0.043 λ-0.053 λ or 0.087 λ-0.097 λ, the fifth Al$_2$O$_3$ layer has a thickness of 0.082 λ-0.102 λ or 0.168 λ-0.188 λ, the sixth SiON layer has a thickness of 0.156 λ-0.194 λ or 0.318 λ-0.356λ and the high reflection film reflects 80-90% of a 45 degree inclination incidence S-wave beam and allows 20%-10% of the inclination beam to arrive at the InP layer or substrate.

4. The photodiode as claimed in claim 1, wherein the high reflection film is a six layered film having a structure of Al$_2$O$_3$/Si/Al$_2$O$_3$/Si/Al$_2$O$_3$/SiON/InP in series, the first Al$_2$O$_3$ layer has a thickness of 0.01λ-0.05 λ, 0.202 λ-0.244 λ or 0.296 λ-0.338 λ, the second Si layer has a thickness of 0.052 λ-0.063 λ or 0.077 λ-0.088 λ, the third Al$_2$O$_3$ layer has a thickness of 0.101 λ-0.122 λ or 0.148 λ-0.169 λ, the fourth Si layer has a thickness of 0.052 λ-0.063 λ or 0.077 λ-0.088 λ, the fifth Al$_2$O$_3$ layer has a thickness of 0.101 λ-0.122 λ or 0.148 λ-0.169 λ, the sixth SiON layer has a thickness of 0.191 λ-0.231 λ or 0.281 λ-0.321 λ and the high reflection film reflects 80-90% of a 45 degree inclination incidence P-wave beam and allows 20%-10% of the inclination beam arrive at the InP layer or substrate.

5. A photodiode for monitoring forward light of a wavelength λ emitted from a laser diode, comprising an InP substrate, an n-InP layer grown on the InP substrate, an InGaAs or an InGaAsP light receiving layer grown on the n-InP layer, an InP window layer grown on the light receiving layer, a p-region made in the InP window layer and the light receiving layer, and a high reflection film being composed of $Al_2O_3$/$TiO_2$ reciprocal layers and a SiON layer and being formed on the InP window layer or the InP substrate for reflecting 80%-90% of a 45 degree inclination incidence beam and allowing 20%-10% of the inclination beam to arrive at the InP layer or substrate.

6. The photodiode as claimed in claim 5, wherein the high reflection film is a five layered film having a structure of $Al_2O_3$/$TiO_2$/$Al_2O_3$/$TiO_2$/SiON/InP in series, the first $Al_2O_3$ layer has a thickness of 0.01 λ-0.05 λ or 0.232 λ-0.308 λ, the second $TiO_2$ layer has a thickness of 0.089 λ-0.117 λ, the third $Al_2O_3$ layer has a thickness of 0.116 λ-0.154 λ, the fourth $TiO_2$ layer has a thickness of 0.089 λ-0.117 λ, the fifth SiON layer has a thickness of 0.110 λ-0.146 λ and the high reflection film reflects 80-90% of a 45 degree inclination incidence S-wave beam and allows 20%-10% of the inclination beam to arrive at the InP layer or substrate.

7. The photodiode as claimed in claim 5, wherein the high reflection film is a six layered film having a structure of $Al_2O_3$/$TiO_2$/$Al_2O_3$/$TiO_2$/$Al_2O_3$/SiON/InP in series, the first $Al_2O_3$ layer has a thickness of 0.01 λ-0.05 λ, 0.223 λ-0.269 λ or 0.271 λ-0.317 λ, the second $TiO_2$ layer has a thickness of 0.085 λ-0.102 λ or 0.104 λ-0.121 λ, the third $Al_2O_3$ layer has a thickness of 0.112 λ-0.134 λ or 0.136 λ-0.158 λ, the fourth $TiO_2$ layer has a thickness of 0.085 λ-0.102 λ or 0.104 λ-0.121 λ, the fifth $Al_2O_3$ layer has a thickness of 0.112 λ-0.134 λ or 0.136 λ-0.158 λ, the sixth SiON layer has a thickness of 0.211 λ-0.255 λ or 0.257 λ-0.301 λ and the high reflection film reflects 80-90% of a 45 degree inclination incidence S-wave beam and allows 20%-10% of the inclination beam to arrive at the InP layer or substrate.

8. The photodiode as claimed in claim 5, wherein the high reflection film is a four layered film having a structure of $TiO_2$/$Al_2O_3$/$TiO_2$/SiON/InP in series, the first $TiO_2$ layer has a thickness of 0.083 λ-0.123 λ, the second $Al_2O_3$ layer has a thickness of 0.108 λ-0.162 λ, the third $TiO_2$ layer has a thickness of 0.083 λ-0.123 λ, the fourth SiON layer has a thickness of 0.103 λ-0.153 λ and the high reflection film reflects 80-90% of a 45 degree inclination incidence S-wave beam and allows 20%-10% of the inclination beam to arrive at the InP layer or substrate.

* * * * *